US009952781B2

(12) United States Patent
Orme et al.

(10) Patent No.: US 9,952,781 B2
(45) Date of Patent: Apr. 24, 2018

(54) ADAPTIVE STORAGE RELIABILITY MANAGEMENT

(71) Applicant: SanDisk Technologies LLC, Plano, TX (US)

(72) Inventors: Evan Orme, Lindon, UT (US); James G. Peterson, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 453 days.

(21) Appl. No.: 14/531,891

(22) Filed: Nov. 3, 2014

(65) Prior Publication Data

US 2016/0110249 A1   Apr. 21, 2016

Related U.S. Application Data

(60) Provisional application No. 62/067,851, filed on Oct. 23, 2014, provisional application No. 62/066,257, filed on Oct. 20, 2014.

(51) Int. Cl.
*G06F 3/06* (2006.01)
*G06F 12/02* (2006.01)
(Continued)

(52) U.S. Cl.
CPC .......... *G06F 3/0619* (2013.01); *G06F 3/0653* (2013.01); *G06F 3/0679* (2013.01); *G06F 11/1016* (2013.01); *G06F 11/1044* (2013.01); *G06F 11/1048* (2013.01); *G06F 11/1072* (2013.01); *G06F 12/0238* (2013.01); *G11C 16/16* (2013.01); *G06F 2212/1032* (2013.01); (Continued)

(58) Field of Classification Search
CPC .... G06F 3/0619; G06F 3/0653; G06F 3/0679; G06F 11/1016; G06F 11/1044; G06F 11/1072
See application file for complete search history.

(56) References Cited

U.S. PATENT DOCUMENTS 8,874,835 B1 * 10/2014 Davis .................... G06F 3/0679
                                                       711/103
2003/0225961 A1 * 12/2003 Chow ................... G06F 3/0616
                                                       711/103
(Continued)

OTHER PUBLICATIONS

Y. Cai et al., "Flash correct-and-refresh: Retention-aware error management for increased flash memory lifetime," Computer Design (ICCD), 2012 IEEE 30th International Conference on, Montreal, QC, 2012, pp. 94-101.*

*Primary Examiner* — Ramon A. Mercado
(74) *Attorney, Agent, or Firm* — Vierra Magen Marcus LLP

(57) ABSTRACT

A storage controller identifies a storage location within a storage division that corresponds to a high error rate. In response, the storage controller may refresh data stored on the storage division by relocating data from the storage division and/or initializing (e.g., erasing) the storage division. In some embodiments, the storage division is selectively refreshed by relocating data from the storage location (s) having high error rates, while deferring a full relocation of other data from the storage division. The storage division may be selectively refreshed based on reliability characteristics of the storage division, such as the remaining data retention time calculated for the storage division.

19 Claims, 13 Drawing Sheets

(51) Int. Cl.
*G06F 11/10* (2006.01)
*G11C 16/16* (2006.01)
G11C 29/52 (2006.01)
G11C 29/04 (2006.01)

(52) U.S. Cl.
CPC .. *G06F 2212/152* (2013.01); *G06F 2212/202* (2013.01); *G06F 2212/214* (2013.01); *G06F 2212/7205* (2013.01); *G11C 29/52* (2013.01); *G11C 2029/0409* (2013.01)

(56) References Cited

U.S. PATENT DOCUMENTS

| | | | | |
|---|---|---|---|---|
| 2008/0316822 | A1* | 12/2008 | Ahn | G06F 11/1068 365/185.09 |
| 2009/0125671 | A1* | 5/2009 | Flynn | G06F 9/52 711/103 |
| 2011/0235434 | A1* | 9/2011 | Byom | G11C 16/10 365/185.25 |
| 2012/0304039 | A1* | 11/2012 | Peterson | G06F 11/10 714/773 |
| 2013/0166824 | A1* | 6/2013 | Shim | G06F 12/0246 711/103 |
| 2014/0059405 | A1* | 2/2014 | Syu | G11C 16/349 714/773 |
| 2014/0310573 | A1* | 10/2014 | Mao | G06F 11/1068 714/773 |
| 2016/0139981 | A1* | 5/2016 | Chennamsetty | G06F 11/1008 714/773 |

* cited by examiner

ADAPTIVE STORAGE RELIABILITY MANAGEMENT

TECHNICAL FIELD

This disclosure relates to systems, methods, apparatus, and interfaces for managing a solid-state storage medium and, in particular, to managing reliability and error conditions pertaining to the solid-state storage medium.

BACKGROUND

A storage controller may be configured to relocate data from a storage division in response to the error rate and/or reliability characteristics of particular storage units therein. Data within other storage units of the storage division, however, may not require immediate relocation. Performing a full relocation operation on the storage division may, therefore, result in unnecessary write amplification, media wear, and/or reduced performance.

A storage controller may be configured to halt storage operations on a storage division in response to detecting an uncorrectable error therein (e.g., an EIO condition). Halting storage operations may, however, result in additional data loss due to, inter alia, reliability degradation of other data stored within the storage division.

SUMMARY

As disclosed herein, a storage controller may be configured to selectively relocate data from a storage division. The storage controller may selectively relocate data from storage units that exhibit high error rates and/or reduced reliability, and may retain data stored in other storage units within the storage division. The storage controller may be further configured to defer a full data relocation operation on the storage division in order to, inter alia, mitigate data stagnation errors, as disclosed in further detail herein.

As disclosed herein, a storage controller may be configured to identify an EIO condition pertaining to a storage unit within a storage division. The storage controller may record the EIO condition on a persistent storage medium (e.g., on another storage division). The storage controller may be further configured to relocate data from the storage division in which the EIO condition occurred. The storage division (and/or portions thereof) may be taken out of service after data is relocated from the storage division. The storage controller may clear the EIO condition in certain situations, which may include, but are not limited to: determining that data the associated with the EIO condition is no longer valid, determining that the data associated with the EIO condition is available from another source, writing replacement data, and/or the like.

BRIEF DESCRIPTION OF THE DRAWINGS

This disclosure includes and references the accompanying drawings. In the drawings, similar symbols typically identify similar components, unless context dictates otherwise. The illustrative embodiments described in the detailed description, drawings, and claims are not meant to be limiting. Other embodiments may be utilized, and other changes may be made to these exemplary embodiments, without departing from the scope of the disclosure.

DETAILED DESCRIPTION

Figure 1A:
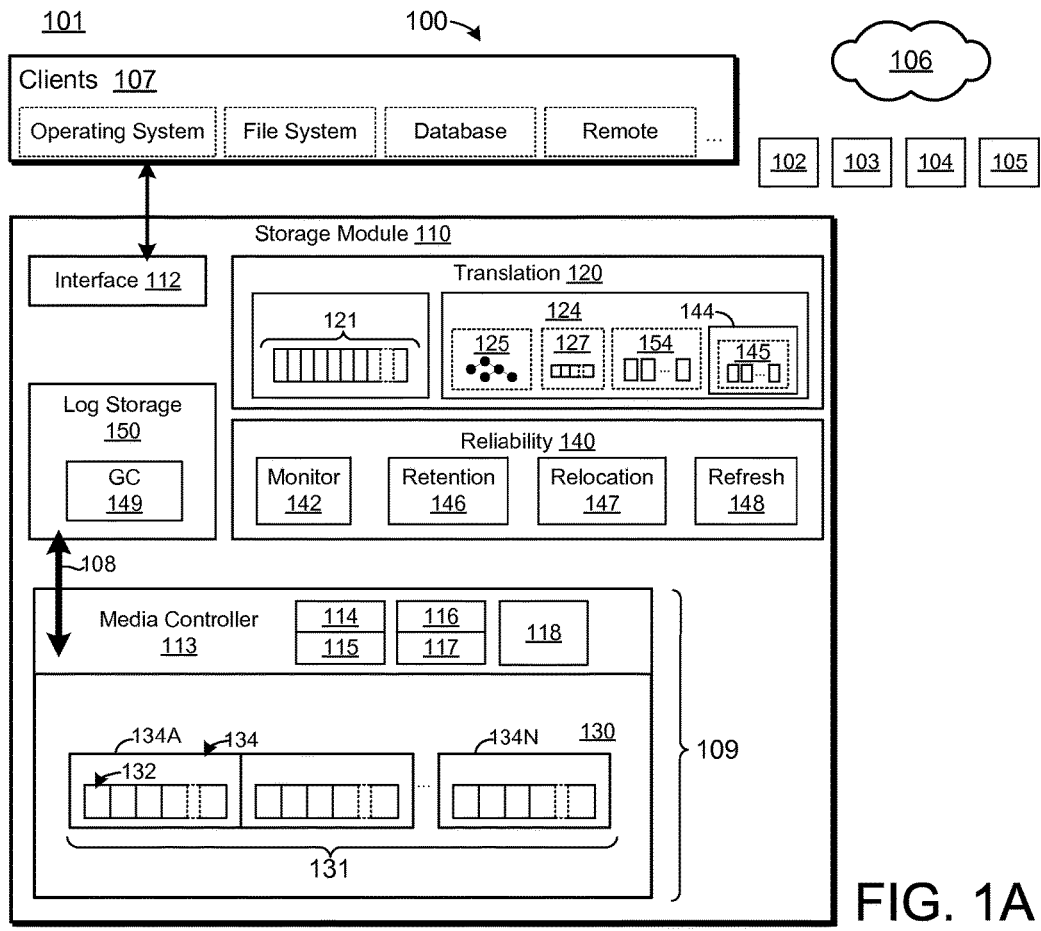
FIG. 1A is a schematic block diagram of one embodiment of a storage system.

A storage controller may be configured to manage a solid-state storage medium, comprising a plurality of storage units. As used herein, a storage unit refers to one or more physical storage units and/or storage locations of a solid-state storage medium. A storage unit may refer to any unit of storage including, but not limited to: a page; a group, collection, or set of pages (e.g., a logical page); a sector; a block; and/or the like. The storage controller may be configured to manage storage divisions of the solid-state storage medium. As used herein, a "storage division" refers to a particular portion or section of a solid-state storage medium, which may include a group, collection, and/or set of storage units. Accordingly, a storage division may refer to one or more of an erase division; an erase block; a group, collection and/or set of erase blocks (e.g., a logical erase block); and/or the like. In some embodiments the storage controller is configured to manage groups of storage unit(s) (e.g., logical storage units) and/or storage division(s) (e.g., logical storage divisions). As used herein, a "logical storage unit" refers to a group of two or more storage units, such as a group of physical pages. The storage controller may be configured to perform storage operations on the two or more physical storage units in parallel. In some embodiments, the storage controller may be configured to store data objects on logical storage units, such that the data objects span the two or more storage units comprising the logical storage units. Similarly, the storage controller may be configured to manage groups of storage divisions (e.g., logical storage divisions), such that reinitializing a logical storage division comprises reinitializing the storage divisions comprising the logical storage division.

The storage medium may comprise storage units that are initialized each time data is written thereto. The storage medium may be asymmetric, such that operations to initialize a storage unit take significantly longer than other operations (e.g., longer than read and/or write operations). This asymmetry may be addressed, in part, by reinitializing storage units in groups (by storage divisions). Reinitializing a storage division may comprise reinitializing the storage units comprising the storage division.

In some embodiments, the storage module manages a logical address space corresponding to the storage medium. As used herein, a "logical address space" refers to front-end namespace through which clients access storage resources managed by the storage module. The logical address space may comprise a group, a set, a collection, a range, and/or an extent of logical identifiers. As used herein, a "logical identifier" (LID) refers to an identifier configured to reference an I/O and/or storage resource; LIDs may include, but are not limited to, identifiers, names (e.g., file names, distinguished names, and/or the like), data identifiers, references, links, front-end identifiers, front-end addresses, logical addresses, logical block addresses, storage unit addresses, VSU identifiers, LUN identifiers, vLUN identifiers, unique identifiers, globally unique identifiers (GUIDs), and/or the like. The storage controller may be configured to store data out-of-place on the storage medium, such that there is no fixed relationship between the logical address space and particular storage units (e.g., particular storage addresses).

In some embodiments, the storage controller writes data to a log on the storage medium. As used herein, a "storage log" and/or "log structured format" refer to an ordered arrangement of log entries. A "log entry" or "storage log entry" may include, but is not limited to: a data segment, a packet, a metadata entry (e.g., TRIM note, logical manipulation entry, mapping entry, corruption entry, and/or the like as disclosed in further detail herein), and/or the like. As disclosed in further detail herein, data segments may be appended as "data entries" to the storage log, which may include and/or be associated with persistent, crash safe metadata configured to, inter alia, associate data in the storage log with one or more LIDs of the logical address space (e.g., indicate a context of the stored data). As used herein, a "metadata entry" in the storage log may comprise any suitable information pertaining to the storage log, including, but not limited to, translation metadata (e.g., logical-to-physical translation metadata); the logical interface of data in the storage log (e.g., LIDs associated with the data); modifications to logical-to-physical translations; information pertaining to the owner of the data, access controls, data type, relative position or offset of the data within another data structure (e.g., an object); information pertaining to storage operation(s) associated with the data (e.g., atomic storage operations, transactions, and/or the like); log sequence information; data storage parameters (e.g., compression algorithm, encryption, etc.); and/or the like.

The log storage operations implemented by the storage controller may result in invalid data remaining on the storage medium. As used herein, "invalid data" refers to data that does not need to be retained on the storage medium. Invalid data may include, but is not limited to: data that was been erased, deleted, unmapped, unallocated, TRIMed, and/or the like; data that has been rendered obsolete (e.g., data that has been updated or replaced by a modified version of the data that was previously stored, or that has been overwritten and/or modified out-of-place); data of a failed and/or incomplete transaction (e.g., failed multi-block atomic write); and/or the like. As used herein, "valid data" refers to data that is retained on the storage medium. Valid data may include data that is associated with LIDs of the logical address space. The storage controller may be configured to reclaim storage resources used to store invalid data in a garbage collection (GC) operation. As used herein, a GC, reclamation, or recovery operation refers to an operation to initialize storage units for use and/or remove invalid data from the storage medium. A GC operation on a storage division may comprise a) identifying valid data stored on the storage division (if any), b) relocating the identified data, and/or c) reinitializing the storage division. Initializing a storage division may comprise erasing the storage division, formatting the storage division, resetting the storage division, clearing the storage division, and/or the like. In some embodiments, initializing a storage division further comprises making the storage division available to store data by, inter alia, updating storage metadata to indicate that the storage division is available for storage, placing the storage division in a write queue, and/or the like.

The solid-state storage medium may have a limited lifetime and may be subject to wear and/or failure conditions. These conditions may result in data errors as data is written to and/or read from storage units of the solid-state storage medium. Such errors may arise due to a number of factors, which may include, but are not limited to: wear, overprogramming, read disturb, write disturb, erase disturb, programming errors, charge gain, charge loss, charge leakage, de-trapping, and so on. The probability of data errors may be quantified by use of a "reliability metric." As used herein, a reliability metric refers to a metric that quantifies the probability, likelihood, assurance, guarantee, and/or the like that data stored on a storage unit of the solid-state storage medium can be successfully read therefrom. A reliability metric of a storage unit may correspond to one or more of: characteristics of storage operations performed on the storage unit (e.g., error rate of read operations on the storage unit), inferences based on the characteristics of storage operations performed on other storage units (e.g., storage units within the same storage division, storage units within other storage division(s), and/or the like), reliability modeling, reliability projections, and/or the like. In some embodiments, the reliability metric of a storage unit may correspond to a bit error rate (BER) and/or raw bit error rate (RBER) for read operations performed on the storage unit. BER and/or RBER metrics may be derived, at least in part, from the number of errors encountered during one or more storage operations as compared to the total amount of data transferred to and/or from the solid-state storage medium. For example, an RBER of a read operation may correspond to the number of bit errors encountered in a read operation divided by the total number of bits transferred in the read operation. Reliability metrics may incorporate any suitable factor(s), including, but not limited to: error rate (e.g., as disclosed above), probability of failure (e.g., based on a current and/or projected wear-level), operating conditions, profiling information, manufacturer specifications, testing and experience, and/or the like.

As disclosed herein, in some embodiments the storage controller is configured to manage logical storage units and/or logical storage divisions. The reliability characteristics of such storage operations may, therefore, incorporate the reliability characteristics and/or models of different sections of the solid-state storage medium (e.g., two or more storage units, two or more different erase divisions, and/or the like). The storage controller may be configured to model the reliability and/or error rate of logical storage units and/or divisions based on reliability and/or error rate models of the respective storage units and/or storage divisions.

The error rate for storage operations pertaining to data stored on a particular storage unit and/or storage division may increase as a function of time. In some embodiments, the longer data is stored on a particular storage unit and/or storage division, the less reliable read operations pertaining to the data become. Data reliability may decrease over time due to, inter alia, wear conditions, over-programming, read disturb, write disturb, erase disturb, programming errors, charge gain, charge loss, charge leakage, de-trapping, and/or the like. Data allowed to stagnate on a particular storage division may degrade to the point of being unreadable. As disclosed herein, "data stagnation" refers to decreased reliability and/or increased error rate that occurs as data is maintained on a particular storage unit and/or storage division. Accordingly, increased error rates due to data remaining on a particular storage unit and/or storage division may be referred to as "data stagnation errors" or "stagnation errors."

The storage controller may be configured to detect and/or correct read errors by use of one or more "error mitigation mechanisms." As used herein, "error mitigation mechanisms," and/or "local error mitigation mechanisms" refer to mechanisms for detecting and/or correcting error conditions on the storage medium by use of data that is managed by and/or available to the storage controller. The error mitigation mechanisms implemented by the storage controller may include, but are not limited to: a) Error-Correcting Code (ECC), b) media tuning, c) parity, d) data redundancy (e.g., storing data redundantly and/or in a RAID configuration on the storage medium), and/or the like. Errors that cannot be corrected by use of the ECC encoding of the data (e.g., ECC decode failures) may be corrected by use of parity data (e.g., parity reconstruction), accessing redundant data, and/or the like. The storage controller may be configured to encode data for storage on the storage medium by use of an error-correcting code (e.g., as ECC codewords, ECC symbols, and/or the like). The storage controller may utilize the ECC information to detect and/or correct data errors. The ECC information associated with a particular data segment may be capable of correcting a threshold number of errors within the data segment (e.g., an error-correction threshold, EC_MAX). Alternatively, or in addition, the storage controller may store data redundantly (in a mirrored configuration) and/or with parity data. The storage controller may detect and/or correct errors by use of the redundant data. In some embodiments, the storage controller stores data with ECC information, redundant data, parity data, and/or the like. Errors that cannot be corrected by use of the error mitigation mechanisms of the storage controller may be deemed to result in a "read failure" or "fatal read error" (EIO).

The error rate for operations performed on a particular storage unit may increase as a function of the "age" of the data stored on the particular storage unit. As used herein, the time elapsed since data was programmed to a storage unit may be referred to as the "age" of the data and/or storage unit, "elapsed data retention time," "data stagnation time," "stagnation time," and/or the like. Accordingly, the "data age" of a particular storage unit may refer to the length of time the data has remained on the particular storage unit. In some embodiments, the elapsed data retention time of a storage division refers to the time that has elapsed since the storage division was closed (e.g., since the last storage unit within the storage division was programmed). Alternatively, the elapsed retention time or stagnation time of a particular storage unit may be the time elapsed since the storage division was initialized and/or since data was first programmed to the storage division after initialization (e.g., time elapsed since the storage division was erased, reformatted, recovered, cleared, and/or the like). The age of a storage unit and/or storage division may be denoted ($\Delta T$), which quantifies one or more of a) the time elapsed since data was programmed onto the storage unit and/or storage division (e.g., age of the stored data) and/or b) the time elapsed since the storage unit and/or storage division was initialized.

In some embodiments, the error rate and/or reliability of a storage unit may be modeled as a function of time (e.g., as a function of the data retention time of the storage unit). As used herein, a "reliability model" and/or "error rate model" refers to a model for projecting, forecasting, and/or estimating changes in the reliability metric and/or error rate of portions of a storage medium (e.g., changes in the BER and/or RBER as a function of elapsed data retention time $\Delta T$). As disclosed herein, a reliability model may incorporate any number of factors, which may include, but are not limited to: operating conditions, operating temperature, wear level(s) (e.g., erase cycle count, program or write cycle count, read cycle count, and so on), manufacturer specifications, operating voltage, testing and experience, and so on. In some embodiments, projecting the error rate and/or reliability of a storage unit metric comprises scaling a current error rate and/or reliability of a storage unit using a time-based scaling factor. Alternatively, or in addition, error rate and/or reliability may be modeled using a modeling function, such as a linear decay function, an exponential decay function, a quadratic, a plurality of modeling functions (e.g., piecewise modeling), and/or the like.

The storage controller may be configured to provide a data retention guarantee, which may specify that data stored on the solid-state storage medium is reasonably guaranteed to be retained on and/or readable from the solid-state storage medium for the duration of a predetermined time (e.g., a data guarantee period), even in the absence of power. In support of this guarantee, the storage controller may project the reliability metric of cells of the solid-state storage medium (e.g., using a reliability model) and may retire portions of the storage medium that are projected to be unreliable at the end of the data retention period (e.g., retire storage units that are projected to be insufficiently reliable to reasonably provide for accessing the retained data at the end of the data retention period). In some embodiments, projecting the reliability of a storage unit comprises multiplying a current error rate (e.g., RBER) by a time-based scaling factor. Portions of the solid-state storage medium that are projected to have a reliability metric that does not satisfy a reliability threshold may be retired. The reliability threshold may be based, at least in part, on an error correction strength of the storage controller, which may correspond to the number of data errors the storage controller is capable of detecting and/or correcting. In one embodiment, data may be encoded by use of an ECC capable of correcting a predetermined number of errors, and the reliability threshold may be set such that the number of probable errors can be corrected by the ECC encoding. Therefore, in some embodiments, the reliability threshold may be based, at least in part, upon the strength of an ECC data encoding and/or redundant storage configuration.

As disclosed above, the reliability of a storage unit may degrade due to data stagnation, such that the error rate of a storage unit increases the longer data remains stored thereon. The storage controller may estimate the error rate for a storage unit as a function of data age by use of a reliability model, as disclosed herein. In one embodiment, for example, the projected error rate (E_PR) for data stored on a particular storage unit i after elapsed data retention time $\Delta T$ may be expressed as $E\_PR=M_i(\Delta T)$, where $M_i$ is an error rate projection model corresponding to the storage unit, and $\Delta T$ is the time that has elapsed since the data was programmed onto the storage unit (e.g., the retention time of the storage unit or age of the data stored on the storage unit). The error projection model $M_i$ may model the increases in error rate as a function of data retention time ($\Delta T$). Alternatively, or in addition, the projected reliability of storage unit (R_PR) may be expressed in terms of a reliability model $R_i$, which may model the projected reliability of the storage unit as a function of data retention time ($\Delta T$), $R\_PR=M_i(\Delta T)$.

The storage controller may be configured to periodically relocate stored data within the storage medium in order to, inter alia, prevent data stagnation (and/or recover storage resources, as disclosed herein). As used herein, a relocation and/or refresh operation refers to an operation to relocate data within the storage medium by, inter alia, reprogramming the data to another storage division of the storage medium. A data relocation and/or refresh operation may comprise one or more of: relocating stored data on the storage medium, rewriting stored data, reprogramming stored data, appending the stored data to the head of a log, and/or the like. Accordingly, a relocation and/or refresh operation may comprise resetting the elapsed data retention time of stored data (e.g., the age of the relocated data is reset to zero). In some embodiments, a refresh operation further comprises initializing the storage division from which the data was relocated, as disclosed herein.

In some embodiments, the storage controller refreshes data at a particular refresh rate and/or according to a particular refresh period. The refresh rate and/or refresh period may be based on a reliability model of the non-volatile storage media (and/or the respective storage divisions and/or portions of the storage divisions), as disclosed herein. The time between refresh operations on a storage unit and/or storage division may be referred to as a refresh period or refresh time interval ($\Delta T\_Ref$). In some embodiments, the storage controller is configured to refresh storage divisions such that the time between refresh operations ($\Delta T\_Ref$) does not exceed a time threshold, which may correspond to the projected reliability and/or reliability model of the respective storage units and/or storage divisions, as disclosed herein. The time between refresh operations ($\Delta T\_Ref$) may determine the time the storage controller allows data to remain stagnant on a storage division and, as such, may be referred to as a "data retention time," "data retention threshold," or "retention threshold." The retention threshold may be adapted to ensure that data stored on the storage medium remains sufficiently reliable (e.g., is not rendered unreadable due to, inter alia, data stagnation and/or satisfies a data retention guarantee).

In some embodiments, the storage controller adapts the rate and/or period of refresh operations to prevent the projected error rate (E_PR) of storage divisions from exceeding an error threshold (E_TH). The error threshold (E_TH) may be less than the error correction threshold of the storage controller (e.g., less than EC_MAX). The maximum allowable time between refresh operations ($\Delta T\_MAX$) may be the elapsed time $\Delta T$ where the projected error rate reaches the error threshold (E_TH), such that $M_i(\Delta T\_MAX)=E\_TH$. The refresh rate and/or refresh time interval ($\Delta T\_Ref$) may be selected, such that $M_i(\Delta T\_Ref) \leq E\_TH$. Therefore, the storage controller may set the time between refresh operations ($\Delta T\_Ref$) to be less than or equal to $\Delta T\_MAX$. Alternatively, or in addition, the storage controller may be configured to adapt the rate and/or period of refresh operations to prevent the projected reliability (R_PR) of storage divisions from falling below a reliability threshold (R_TH). The $\Delta T\_MAX$ value may be the elapsed time at which the projected reliability reaches the reliability threshold R_TH. The time between refresh operations ($\Delta T\_Ref$) may be configured such that the projected reliability is greater than or equal to the reliability threshold (R_TH), $M_i(\Delta T\_Ref) \geq R\_TH$.

The storage controller may be configured to identify storage units that should be retired and/or taken out of service (OOS). As used herein, retiring a portion of the storage medium refers to removing the portion from use in storing data. The storage controller may monitor reliability of the storage medium by one or more of: a) monitoring error rates of operations performed on the storage medium in response to client requests, b) scanning portions of the storage medium (e.g., performing test read operations in a reliability scan), c) performing refresh and/or grooming operations, d) detecting uncorrectable errors (EIO), and so on. Portions of the storage medium that do not satisfy a "retirement threshold" may be taken out of service (e.g., retired). The retirement threshold may be based, at least in part, on an error correction strength, a data redundancy configuration, a data refresh rate, reliability projection(s), and/or the like.

In some embodiments, the storage controller manages error conditions by a) identifying storage units that exhibit high error rates, and b) refreshing and/or recovering the corresponding storage division(s), regardless of whether the storage division is scheduled for a refresh and/or GC operation (e.g., before the refresh time for the storage division has elapsed). As disclosed above, refreshing a storage division may comprise relocating data from the storage division (e.g., rewriting the data to other storage division(s) of the storage medium). Recovering the storage division may further comprise initializing the storage division, as disclosed herein. Refreshing storage divisions associated with high error rates may prevent data stored thereon from being rendered unreadable due to, inter alia, data stagnation. However, refresh operation(s) may result in write amplification as data is relocated from the storage division. In some embodiments, the storage controller is configured to implement partial refresh operations on storage divisions. As used herein, a "partial" refresh operation refers to relocation, refresh, and/or GC operation on a portion of a storage division. Accordingly, a partial refresh operation may comprise refreshing data on a first set of storage units within a storage division while maintaining data stored on a second set of storage units within the storage division. A partial refresh operation on a storage division may comprise: a) relocating data stored on a first set of storage units within a storage division and b) retaining data stored on a second set of storage units within the storage division. Retaining data may include deferring and/or postponing a full relocation, refresh, and/or GC operation on the storage division until a later time.

In some embodiments, the storage controller is configured to implement selective relocation, refresh, and/or GC operations on storage divisions. As used herein, a "selective" refresh operation refers to an operation to refresh data stored on selected storage units of a storage division. A selective relocation operation may include selecting storage units from which data is to be relocated based on a selection criterion, such as error rate, reliability, data characteristics (e.g., cache metrics, invalidity, etc.), and/or the like. A selective relocation operation may include a) identifying data to relocate from a storage division (based on a selection criterion), b) relocating the identified data, and c) retaining other data on the storage division. A selective relocation operation may include deferring and/or postponing a full relocation, refresh, and/or GC operation on the storage division. Data may be selected for relocation from the storage division based on any suitable characteristic of the data and/or corresponding storage units. As disclosed in further detail herein, data may be selected for relocation from a storage division in response to determining that an error rate of the storage unit comprising the data exceeds a threshold (and/or is projected to exceed the threshold within a particular timeframe). A full relocation or refresh operation creates a copy of all valid data in a storage division before that storage division is erased. In contrast to a full relocation or refresh operation, one or more of a selective relocation operation and a partial relocation operation creates a copy of an amount of valid data that is less than all valid data in a storage division.

The reliability and/or error rates of storage units within a storage division may vary. A first storage unit within a storage division may exhibit acceptable reliability and/or error rates whereas a second, different storage unit may exhibit significantly higher error rates and/or reduced reliability. Moreover, the error rate and/or reliability of the storage units may degrade at different rates. Differences in reliability characteristics within a storage division may be due to: properties of the storage medium (e.g., layout, manufacturing characteristics, defects, and/or the like), characteristics of storage operations performed on the storage division (e.g., read and/or program operations performed on other storage unit(s) and/or division(s), resulting in read, program, and/or erase disturb), non-deterministic error conditions, interference, aberrations, randomness, and/or the like. Accordingly, a particular storage unit may exhibit poor reliability characteristics while other storage units within the same storage division exhibit acceptable reliability characteristics. In such situations, it would be inefficient to perform a full data relocation, refresh and/or GC operation on the storage division, since doing so would result in relocating data from storage units that currently have acceptable error and/or reliability characteristics (and/or are projected to have acceptable error and/or reliability characteristics).

The storage controller may refresh a storage division in response to identifying a high-error storage unit and/or a storage division comprising one or more high-error storage units. As used herein, a "high-error storage unit" refers to a storage unit having (and/or projected to have) an error rate greater or equal to a particular threshold (e.g., a high-error threshold E_High). The high-error threshold E_High may be lower than the retirement and/or error correction thresholds disclosed herein (e.g., E_High≤E_TH, E_High≤EC_MAX). The storage controller may identify high-error storage units in response to one or more of: a) monitoring error rates of storage operations in response to client requests, b) scanning portions of the storage medium (e.g., performing test storage operations), c) performing refresh and/or GC operations on portions of the storage medium, d) detecting uncorrectable errors (EIO) on portions of the storage medium, and/or the like, as disclosed herein.

In some embodiments, the storage controller refreshes the storage division based on a "time-to-refresh" of the storage division associated with the identified high-error storage unit. As used herein, "time-to-refresh," "remaining retention time," or "remaining data retention time" refers to the time until the storage division is to be refreshed and/or recovered (e.g., in a GC operation). The time-to-refresh of a storage division may be based on the time between refresh operations performed on the storage division (ΔT_Ref) and the time elapsed since data was programmed to the storage division (ΔT). Therefore, the remaining time-to-refresh or remaining data retention time (ΔT_Remain) may be ΔT_Remain=ΔT_Ref−ΔT. As disclosed above, the time between refresh operations on the storage division may correspond to the refresh rate and/or period of the storage division, a maximum time between refresh operations on the storage division (ΔT_MAX), and/or the like. Alternatively, or in addition, the storage controller may dynamically determine the remaining data retention time (ΔT_Remain) based on current reliability characteristics of the storage division (e.g., current error rates), reliability characteristics of portions of the storage division, and/or the like. The current reliability characteristics may be determined by, inter alia, reading data from other storage units of the storage division to determine a current error rate of the storage division and/or calculating a reliability and/or error rate projection, as disclosed herein. The remaining time until refresh (ΔT_Remain) may be calculated such that the projected error rate of the storage division is less than or equal to an error threshold (E_TH) (e.g., Mi (ΔT_Remain)≤E_TH).

The storage controller may be further configured to manage EIO conditions on the storage medium. As disclosed above, an EIO refers to a read error that cannot be corrected by recovery mechanisms of the storage controller, such as ECC, data redundancy, parity substitution, media tuning, and/or the like. In some embodiments, the storage controller manages EIO conditions by marking the storage division in which the EIO occurred as "failed," such that no further storage operations are performed on the storage division. The storage controller may be further configured to enter a failure mode, which may comprise stopping storage operations on other portions of the storage medium to prevent further data corruption. The failure mode may comprise issuing an interrupt to and/or through the interface of the storage module to inform clients that storage services are no longer available. Accordingly, other data stored on the storage division in which the EIO occurred may be rendered inaccessible.

In other embodiments, the storage controller maintains access to readable portions of the storage division in which an EIO has occurred. In response to an EIO pertaining to data associated with a particular identifier, the storage controller may be configured to: a) relocate data from the storage division in which the EIO occurred, and b) record that the particular identifier is "corrupted" and/or in a "corrupted state." As used herein, a corrupt identifier and/or an identifier in a "corrupted state" refers to an identifier associated with data that cannot be read from the storage medium due to, inter alia, uncorrectable errors, media failure, and/or the like, as disclosed above. As used herein, a "readable identifier" or identifier in a "readable state" refers to an identifier associated with readable data stored on the storage medium. The storage controller may be configured to return an error code and/or error interrupt in response to client requests to read corrupt identifiers. Recording that a particular identifier is corrupt may comprise storing a log entry on the storage medium indicating that the particular identifier is corrupt.

The storage controller may be further configured to notify a recovery engine of the EIO condition. In response, the recovery engine may attempt to access replacement data corresponding to the corrupt identifier from another source, such as redundant storage, a backing store, primary storage, and/or the like. The storage controller may write replacement data (if available) to another storage location on the storage medium.

The storage controller may transition an identifier from a corrupt state to a readable state in response to certain conditions. In some embodiments, the storage controller may transition an identifier from the corrupt data in response to one or more of: a message indicating that data associated with the identifier is erased (e.g., a TRIM message and/or request, a delete message and/or request, a deallocation message and/or request, an unmap message and/or request, and/or the like), writing replacement data to the storage medium, a request to overwrite the corrupt data, and/or the like. Transitioning the identifier from the corrupt state may comprise recording that the identifier is no longer corrupt by, inter alia, removing and/or invalidating persistent corruption metadata(s) pertaining to the identifier. Disclosed herein are embodiments of methods for managing a non-volatile storage medium and, in particular, to managing media reliability and/or error conditions. The methods, processes, and/or procedures disclosed herein may be embodied as executable instructions stored on a non-transitory machine-readable storage medium. The instructions may comprise computer program code that, when executed and/or interpreted by a computing device, cause the computing device to implement the processing steps and/or operations disclosed herein. Portions of the methods, processes, and/or procedures disclosed herein may be implemented and/or embodied as a driver, a library, an interface, an application programming interface (API), firmware, Field Programmable Gate Array (FPGA) configuration data, and/or the like. Accordingly, portions of the methods, processes, and/or procedures disclosed herein may be accessed by and/or included within particular modules, processes, and/or services (e.g., incorporated within a kernel layer of an operating system, within a storage stack, within a device driver, in user-space, in an application, in a library, and/or the like). In some embodiments, steps and/or operations of the methods, processes, and/or procedures disclosed herein may be embodied as machine components, which may include, but are not limited to: circuits, processing components, interface components, hardware controller(s), storage controller(s), programmable hardware, logic elements, FPGAs, Application Specific Integrated Circuits (ASICs), general-purpose processing components, and/or the like. Accordingly, certain steps and/or operations disclosed herein may be tied to particular machine components.

Disclosed herein are embodiments of a method for storage reliability management by use of, inter alia, adaptive data relocation, refresh, and/or GC operations. The disclosed method may comprise determining a reliability metric of a first storage unit within an erase division comprising a plurality of storage units, relocating data stored on the first storage unit from the erase division in response to the determined reliability metric, and/or deferring relocation of data stored on the erase division based on a remaining retention time of the erase division. The erase division may comprise one of an erase block, a group of erase blocks, and a logical erase block. The method may further include determining the reliability metric of the first storage unit in response to read operation on the first storage unit, and wherein relocating the data stored on the first storage unit comprises writing data of the read operation within a different erase division. In some embodiments, the disclosed method further comprises correcting read errors in the data stored on the first storage unit by use of an error-correcting code.

Embodiments of the method disclosed herein may include determining the remaining retention time of the erase division based on a reliability metric of a second storage unit within the erase division. The remaining retention time of the erase division may be based on reliability metrics of a set of one or more storage units within the erase division excluding the first storage unit. Alternatively, or in addition, determining the remaining retention time of the erase division may comprise determining a current error rate of the erase division based on error rates corresponding to read operations performed on the set of storage units within the erase division. In some embodiments, the disclosed method includes identifying a subset of the storage units within the erase division that are in use to store valid data, and/or determining the remaining retention time of the erase division based on read error metrics of storage units in the identified subset. Identifying the subset of storage units may comprise identifying storage units within the erase division that are associated with logical addresses in a forward map. Alternatively, or in addition, identifying the subset of storage units may comprise identifying storage units of the erase division that comprise invalid data.

In some embodiments, deferring relocation of data stored on the erase division comprises postponing a garbage collection operation on the erase division. A garbage collection operation may include, identifying valid data stored on the erase division, relocating the valid data stored on the erase division to another erase division of the storage medium, and/or initializing the erase division.

Disclosed herein are embodiments of an apparatus for adaptive storage reliability management. The apparatus disclosed herein may comprise a reliability monitor configured to identify a physical address within a storage division of a storage medium having an error rate that exceeds an error rate threshold, a reliability manager configured to determine a reliability metric of cells of the storage division, and/or a partial relocation module configured to write data stored at the identified physical address such that other data is retained on the storage division. In some embodiments, the partial relocation module is configured to postpone refresh of the storage division in response to the determined reliability metric exceeding a threshold. Embodiments of the apparatus may further include a translation layer configured to associate logical addresses of a logical address space with respective physical addresses. The partial relocation module may be configured to remap a logical identifier from the identified physical address to the different physical address by use of the translation layer, such that one or more other logical addresses remain associated with respective physical addresses within the storage division.

The partial relocation module may be further configured to postpone refresh of the storage division in response to the determined reliability metric exceeding a threshold. In some embodiments, the reliability manager determines the reliability metric based on one or more of an error rate of a different physical address within the storage division, a reliability projection for the storage division, a reliability model for the storage division, a partial reliability metric of the storage division, an error rate projection, and a data retention guarantee. The reliability metric may be based on test read operations performed on other portions of the storage division, excluding the identified physical address. The time delta may be based on the determined partial reliability metric. In some embodiments, the storage manager identifies the physical address having the error rate that exceeds the error rate threshold in response to one of servicing a request to read data from the identified portion and a reliability scan.

Disclosed herein are embodiments of a system for adaptive storage reliability management, comprising a flash storage medium comprising a plurality of erase blocks, each erase block comprising a plurality of pages, means for identifying a page of a particular one of the erase blocks having a bit error rate that exceeds a bit error rate threshold, means for determining a remaining data retention time for data stored on other portions of the particular erase block, and/or means for postponing recovery of the particular erase block in response to the determined remaining data retention time exceeding a duration threshold, wherein postponing recovery comprises writing data stored on the identified page to a page on a different erase block of the flash storage medium, and retaining data stored on other pages of the particular erase block. The determined remaining data retention time of the particular erase block may be based on one or more of: time elapsed since the particular erase block was programmed, bit error rates of other pages of the particular erase block, a bit error rate projection for the particular erase block, a bit error rate model for the particular erase block, a predetermined schedule for grooming operations on erase blocks of the flash storage medium, a data retention guarantee pertaining to data stored on the flash storage medium, and/or the like. In some embodiments, the system further includes means for assessing the reliability of the particular erase block.

Disclosed herein are embodiments of a method for managing storage error conditions, such as read failures. Embodiments of the disclosed method include, identifying a logical address that is associated with unreadable data on a storage unit within an erase division of a storage medium, writing persistent metadata to the storage medium to record that the identified logical address is associated with the unreadable data, and/or relocating readable data from storage units within the erase division in response to identifying the logical address associated with the unreadable data. Writing the persistent metadata may comprise appending a metadata entry to a storage log on the storage medium. The unreadable data may be detected in response to performing a test operation within the storage division.

In some embodiments, the method further includes transmitting a message that identifies the logical address by one or more of: issuing the message through a storage interface, broadcasting the message on a network, returning the message in response to a storage request, raising an exception comprising the message, and/or signaling an interrupt comprising the message. Embodiments of the disclosed method may further comprise notifying a storage service that the identified logical address is associated with unreadable data, and writing replacement data to the identified logical address in response to receiving the replacement data from the storage service. The method may further include flagging the identified logical address as unreadable, wherein flagging the identified logical address comprises writing the persistent metadata to the storage medium, and clearing the flag from the identified logical address before receiving a request to read the logical address. Clearing the flag from the identified logical address may comprise one or more of invalidating the persistent metadata written to the storage medium, and updating logical to physical translation metadata to clear a flag from the identified logical address. In some embodiments, the method includes recording that the identified logical address is not associated with unreadable data in response to one or more of a request to write data to the identified logical address, a request to unmap the identified logical address, a request to deallocate the identified logical address, a request to delete data of the identified logical address, a request to erase data of the identified logical address, a message indicating that the identified logical address is erased, a message indicating that the identified logical address is empty.

Disclosed herein are embodiments of an apparatus for managing storage error conditions, such as read failures. The disclosed apparatus may include a translation layer that maps logical addresses of a logical address space to storage addresses of a non-volatile storage medium, a reliability monitor that detects a read error pertaining to a storage address, wherein the storage address is mapped to a particular logical address by the translation layer, and/or a corruption manager configured to record persistent metadata to flag corrupt logical addresses, wherein the corruption manager determines whether to flag the particular logical address in response to detecting the read error. The corruption manager may determine whether to flag the particular logical address as corrupt based on one or more of metadata associated with the particular logical address, a storage service associated with the particular logical address, and status information pertaining to the particular logical address. The corruption manager may determine not to flag the particular logical address as corrupt in response to determining that the particular logical address corresponds to cache data. The corruption manager may be further configured to record that the particular logical address is empty in response to determining that the particular logical address corresponds to cache data. Alternatively, or in addition, the corruption manager may determine not to flag the particular logical address as corrupt in response to receiving replacement data for the particular logical address. In some embodiments, the apparatus includes a coordination module to notify a storage service of the read error pertaining to the particular logical identifier. The coordination module may be configured to request status information pertaining to the particular logical identifier.

Disclosed herein are embodiments of a system for managing storage error conditions, such as read failures. The system may include a storage medium comprising a plurality of storage divisions, a storage controller that detects a read failure pertaining to data stored at a storage address within a particular one of the storage divisions, and/or a corruption manager that appends an entry to a storage log on the storage medium that applies a corrupt data designation to the logical identifier, wherein the storage controller is configured to return an error in response to requests to read logical identifiers having a corrupt data designation. The corruption manager may be configured to clear the corrupt data designation from the logical identifier in response one or more of: a request to write data to the logical identifier, a request to unmap the logical identifier, a request to delete the logical identifier, a request to erase the logical identifier, a hint indicating that data corresponding to the logical identifier does not need to be retained, a message indicating that data corresponding to the logical identifier is no longer in use to reference data stored at the storage address. The corruption module may be configured to clear the corrupt data designation by one or more of appending an entry to the storage log that clears the corrupt data designation from the logical identifier, and updating a translation layer to remove an association between the logical identifier and a corrupt data flag. In some embodiments, the disclosed system includes a coordination module to notify a storage client of the read error pertaining to the logical identifier. The coordination module may be configured to request replacement data corresponding to the logical identifier in response to detection of the read error.

FIG. 1A is a block diagram of one embodiment 101 of a computing system 100 comprising a storage module 110. The computing system 100 may comprise one or more computing devices, including, but not limited to, a server, a desktop, a laptop, an embedded system, a mobile device, and/or the like. In some embodiments, the computing system 100 may include multiple computing devices, such as a cluster of server computing devices. The computing system 100 may comprise processing resources 102, volatile memory resources 103 (e.g., RAM), non-transitory storage resources 104, and a communication interface 105. The processing resources 102 may include, but are not limited to, general purpose central processing units (CPUs), ASICs, programmable logic elements, FPGAs, programmable logic arrays (PLGs), and/or the like. The communication interface 105 may be configured to communicatively couple the computing system 100 to a network 106. The network 106 may comprise any suitable communication network, including, but not limited to, a Transmission Control Protocol/Internet Protocol (TCP/IP) network, a Local Area Network (LAN), a Wide Area Network (WAN), a Virtual Private Network (VPN), a Storage Area Network (SAN), and/or the like.

The storage module 110 (and/or modules, components, and/or features thereof) may be implemented in software, hardware, and/or a combination of software and hardware elements. In some embodiments, portions of the storage module 110 are embodied as executable instructions stored on a non-transitory, machine-readable storage medium. The instructions may comprise computer program code that, when executed by a processor and/or computing device, cause the processing resources 102 of the computing system 100 to implement certain processing steps, procedures, and/or operations disclosed herein. The storage module 110, and/or portions thereof, may be implemented and/or embodied as a driver, a library, an interface, an API, FPGA configuration data, firmware (e.g., stored on an Electrically Erasable Programmable Read-Only Memory (EEPROM) and/or the like), and/or the like. Accordingly, portions of the storage module 110 may be accessed by and/or included within other modules, processes, and/or services (e.g., incorporated within a kernel layer of an operating system of the computing system 100). In some embodiments, portions of the storage module 110 are embodied as machine components, such as general and/or application-specific devices, including, but not limited to: circuits, integrated circuits, processing components, interface components, hardware controller(s), storage controller(s), programmable hardware, FPGAs, ASICs, and/or the like. The modules disclosed herein may be referred to as controllers, layers, services, engines, facilities, drivers, circuits, and/or the like. Therefore, in some embodiments, the storage module 110 may be referred to as a storage device, storage controller, storage manager, storage layer, storage engine, storage facility, storage driver, storage circuit, and/or the like.

As disclosed in further detail herein, the storage module 110 may comprise an interface 112 to provide access to storage services implemented by the storage module 110, a media controller 113 configured to implement storage operations on a storage medium 130, a translation module 120 to manage a logical address space associated with the storage services provided by the storage medium 110, and a reliability manager 140 to manage error conditions and/or reliability characteristics of the storage medium 130. In some embodiments, the storage module 110 further includes a log storage module 150 to implement storage operations within an ordered storage log on the storage medium 130.

The storage module 110 may be configured to provide I/O and/or storage services to clients 107, which may include, but are not limited to, operating systems, file systems, journaling systems, key-value storage systems, database systems, applications, users, remote storage clients, and/or the like. The clients 107 may further include, but are not limited to: components of a virtualized computing environment, such as hypervisors, virtualization kernels, guest operating systems, virtual machines, and/or the like. The storage module 110 may comprise an interface 112 through which the clients 107 access the storage services of the storage module 110. The interface 112 may include one or more block storage interfaces, object storage interfaces, file storage interfaces, key-value storage interfaces, storage namespaces, database storage interfaces, directory storage interfaces, virtualized storage interfaces, Virtual Storage Unit (VSU) interfaces, Logical Unit Number (LUN) interfaces, virtual LUN (vLUN) interfaces, logical address spaces, and/or the like.

The storage module 110 may implement storage operations on a storage medium 130. The storage medium 130 may comprise any suitable non-volatile and/or persistent storage medium including, but not limited to: flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), Resistive Random-Access Memory (RRAM), Programmable Metallization Cell (PMC), Conductive-Bridging RAM (CBRAM), Magneto-Resistive RAM (MRAM), Dynamic RAM (DRAM), Phase change RAM (PRAM), or the like. The storage medium 130 may comprise a plurality of storage units 132, which may be organized and/or partitioned into respective storage divisions 134.

In some embodiments, the storage medium 130 includes volatile memory, which may include, but is not limited to, RAM, dynamic RAM (DRAM), static RAM (SRAM), synchronous dynamic RAM (SDRAM), etc. The storage medium 130 may correspond to memory of the processing resources 102, such as a CPU cache (e.g., L1, L2, L3 cache, etc.), graphics memory, and/or the like.

As disclosed above, a "storage unit" or "physical storage unit" refers to a physical storage location capable of storing a quantum of data including, but not limited to: a page, a sector, a cell, a memory cell, a flash cell, a NAND cell, a block, a logical storage unit (e.g., a group of storage units), and/or the like. The storage divisions 134 may correspond to a particular portion or section of a storage medium 130, including, but not limited to: an erase block, an erase division, a logical erase block, and/or the like. The storage unit(s) 132 and/or storage division(s) 134 may be addressable within a storage namespace (e.g., storage address space 131) of the storage medium 130. The storage address space 131 may include, but is not limited to: storage addresses, storage identifiers, physical addresses, physical storage addresses, physical identifiers, physical storage identifiers, media addresses, media identifiers, back-end addresses, back-end identifiers, offsets, and/or the like. The storage address space 131 may correspond to any suitable storage addressing scheme, namespace, arrangement, and/or organization of storage resources.

The storage medium 130 may be communicatively coupled to an interconnect 108. The interconnect 108 may include, but is not limited to, a peripheral component interconnect (PCI), a PCI express (PCI-e) bus, a Serial AT Attachment (serial ATA or SATA) bus, a parallel ATA (PATA) bus, a Small Computer System Interface (SCSI) bus, an IEEE 1394 (FireWire) interface, a Fiber Channel interface, a Universal Serial Bus (USB) connection, and/or the like. In some embodiments, the storage medium 130 comprises a remote storage medium and/or device that are communicatively coupled to the storage module 110 through the network 106. The interconnect 108 may, therefore, comprise one or more of: a network connection and/or interface, a storage network interface, a Storage Area Network (SAN) interface, a Virtual Storage Area Network (VSAN) interface, a remote bus, a PCE-e bus, an Infiniband connection, a Fibre Channel Protocol (FCP) network connection, a HyperSCSI interface, and/or the like.

In some embodiments, the storage medium 130 is embodied on a storage device 109. The storage device 109 may comprise one or more of: an on-board storage device of the computing system 100 (e.g., a chip, components, and/or module of the computing system 100), an expansion card communicatively coupled to an I/O bus of the computing system 100 (e.g., a PCIe card), a storage resource communicatively coupled to a storage bus of the computing system 100 (e.g., a storage drive communicatively coupled to a SATA bus of the computing system 100), an external storage device communicatively coupled to an external bus of the computing system 100 (e.g., USB, Firewire, and/or the like), a storage appliance (e.g., an independent, stand-along computing device, storage server, etc.), and/or the like. Portions of one or more of the storage module 110, media controller 113, error management module 118, translation module 120 (translation layer), reliability module 140, log storage module 150, and/or other modules, components, and/or facilities disclosed herein (e.g., the storage manager 610, corruption manager 642, coordination module 646, disclosed in further detail herein), may be implemented on the storage device 109. Accordingly, in some embodiments, the modules, components, elements and/or facilities disclosed herein may be embodied as circuits, controllers, programmable logic hardware, configuration firmware, of the storage device 109 (and/or computing system 100).

The storage module 110 may comprise and/or be communicatively coupled to a media controller 113, which may be configured to implement storage operations on the storage medium 130, which may include, but are not limited to: writing data to storage unit(s) 132 of the storage medium 130 (by use of a write module 114), reading data from storage unit(s) 132 of the storage medium 130 (by use of a read module 116), refreshing data stored on the storage medium 130 (e.g., refreshing storage divisions 134), performing GC operations on portions of the storage medium 130 (e.g., storage divisions 134), detecting and/or correcting storage errors, and the like. The media controller 113 may comprise software and/or hardware components including, but not limited to, one or more drivers and/or other software modules operating on the computing system 100, such as firmware, storage drivers, I/O drivers, filter drivers, and/or the like; hardware components, such as hardware controllers, programmable controllers, circuits, communication interface(s), and/or the like; and so on. The storage medium 130 and/or media controller 113 may be embodied on a storage device 109, as disclosed above. Portions of the storage layer 130 (e.g., media controller 113) may be implemented as hardware and/or software components (e.g., firmware) of the storage device 109.

The media controller 113 may comprise circuitry, buffers, buses, bus interfaces, communication interfaces (e.g., direct memory access (DMA) controllers) to receive data for storage on the storage medium 130, program the received data to the storage medium 130, read data stored on the storage medium 130, and/or provide data read from the storage medium 130 to client(s) 107 (e.g., through the interconnect 108). The write module 114 may comprise circuitry, buffers, buses, and/or other hardware components to write data to storage units 132 of the storage medium 130. The read module 116 may comprise circuitry, buffers, buffers, and/or other hardware components to read data from storage units 132 of the storage medium. As disclosed herein, media tuning parameters may be modified in order to, inter alia, mitigate data read errors.

The storage layer 130 may provide for referencing storage resources through a front-end storage interface. As used herein, a "front-end storage interface" or "logical interface" refers to an interface and/or namespace through which the storage module 110 provides for referencing storage resources. In the FIG. 1A embodiment, the storage module 110 exposes storage resources through a logical address space 121 managed by translation module 120. The logical address space 121 may comprise a group, a set, a collection, a range, and/or an extent of LIDs. The logical capacity of the logical address space 121 may correspond to the number of LIDs in the logical address space 121 and/or the size and/or granularity represented by the LIDs. The logical address space 121 maintained by translation module 120 may be independent of the underlying storage medium 130, such that any LID can be mapped to any storage location(s) on the storage medium 130 (e.g., any particular storage unit 132, portion of a storage unit 132, and/or set of storage units 132). In some embodiments, the logical address space 121 may be "sparse," "thinly provisioned," and/or "over provisioned." As used herein, a thinly provisioned or "over provisioned" logical address space 121 refers to a logical address space 121 having a logical capacity that is independent of the physical storage capacity and/or granularity of the underlying storage resources (e.g., independent of the physical storage capacity and/or storage address space 131 of the storage medium 130). Accordingly, the logical address space 121 may be independent of the underlying storage resources, such that there are no set or predetermined mappings between the logical address space 121 and the storage address space 131. The logical address space 121 may be "sparse," such that physical storage resources corresponding to a particular LID of the logical address space 121 are not reserved and/or consumed, until data is written to the particular LIDs. In one embodiment, the logical address space 121 comprises 64-bit LIDs (e.g., $2^{26}$ unique LIDs). The storage module 110 may leverage the sparse, thinly provisioned logical address space 121 to efficiently allocate and/or reference contiguous ranges of LIDs and/or manage many-to-one mappings between LIDs and physical storage resources. The storage manager 130 may allocate logical capacity to clients 107 by, inter alia, allocating LIDs within the logical address space 121. Allocating a LID may comprise reserving a LID for use by a particular client 107. Reserving and/or allocating a LID may not result in use of physical storage resources on the storage medium 130. Storage resources may not be consumed by a particular LID until data is written to the particular LID, as disclosed in further detail herein.

The storage module 110 may be configured to maintain storage metadata 124 pertaining to storage operations. The storage metadata 124 may include, but is not limited to, a forward map comprising any-to-any mappings between LIDs of the logical address space 121 and the storage address space 131, a reverse map pertaining to the contents of particular storage units 132 and/or storage divisions 134, validity bitmaps, reliability testing and/or status metadata, status information (e.g., error rate, retirement status, and so on), cache metadata, and/or the like. Portions of the storage metadata 124 may be maintained within the volatile memory resources 103 of the computing system 100. Alternatively, or in addition, portions of the storage metadata 124 may be stored on non-volatile storage resources 104 and/or the storage medium 130.

Figure 1B:
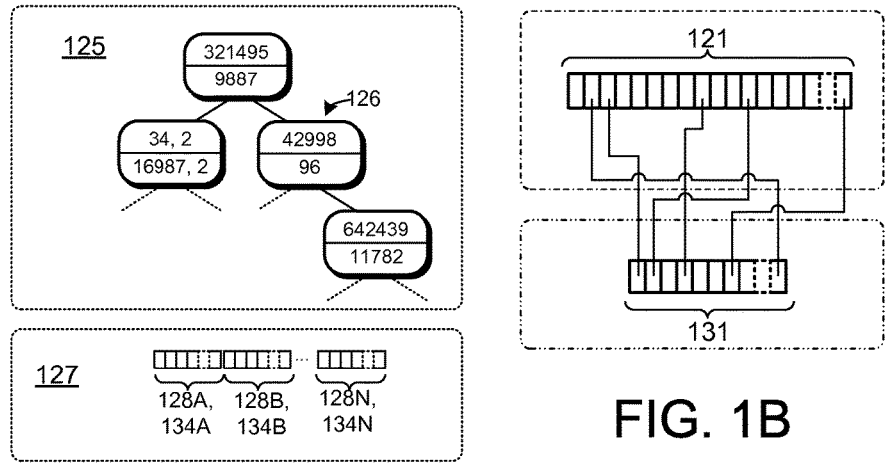
FIG. 1B depicts one embodiment of storage metadata.

The translation module 120 may be configured to associate, bind, map, tie, and/or assign LIDs of the logical address space 121 to data stored on the storage medium 130 (e.g., map LIDs to particular storage addresses). As illustrated in FIG. 1B, the translation module 120 may map LIDs of the logical address space 121 to storage addresses by use of a forward map 125. The forward map 125 may comprise any-to-any mappings between the logical address space 121 and particular storage addresses (storage units 132). Alternatively, the forward map 125 may comprise an intermediate mapping layer in which LIDs are mapped to intermediate addresses of an intermediate address space and/or virtual identifiers (VIDs) of a virtual address space.

In some embodiments, the storage metadata 124 may further comprise information to distinguish valid from invalid data stored on the storage medium. As used herein, "invalid" data refers to data that does not need to be retained on the storage medium 130. Invalid data may include, but is not limited to: data that was been overwritten out-of-place by other, more recent data (e.g., obsolete data); data that has been erased, deleted, deallocated, unmapped, or TRIMed; unused data; data evicted from a cache; and/or the like. In the FIG. 1A embodiment, the storage metadata 124 includes a validity map 127, which may identify invalid data stored on the storage medium 130. As disclosed in further detail herein, the validity map 127 may comprise a plurality of validity bitmaps comprising validity information pertaining to data programmed on the storage divisions 134A-N.

The translation module 120 may use the forward map 125 to associate any LID of the logical address space 121 with any location within the storage address space 131 (e.g., any storage unit 132). As illustrated, the logical address space 121 may be sized differently than the underlying storage address space 131. In the FIG. 1B embodiment, the logical address space 121 may be thinly provisioned, and, as such, may comprise a larger range of LIDs than the range of storage addresses within storage address space 131. The forward map 125 may comprise any suitable data structure, including, but not limited to, an index, a map, a hash map, a hash table, a tree, a range-encoded tree, a b-tree, and/or the like. The forward map 125 may comprise entries 126 corresponding to LIDs that are being used to reference data stored on the storage medium 130. The entries 126 of the forward map 125 may associate LIDs with respective storage addresses within the storage address space 131. The forward map 125 may be sparsely populated, and as such, may omit entries corresponding to LIDs that are not currently in use to reference stored data, regardless of whether the LIDs have been allocated and/or reserved by a client 107. In some embodiments, the forward map 125 comprises one or more range-encoded entries 126 that correspond to a plurality of LIDs (e.g., a range, extent, and/or set of LIDs). In the FIG. 1B embodiment, the forward map 125 includes an entry 126 that maps a range of LIDs (LIDs 34-35) to a corresponding range of storage addresses (16987-16988). In some embodiments, the entries 126 of the forward map 125 are indexed by LID (e.g., in a tree data structure). The disclosure is not limited in this regard, however, and could be adapted to use any suitable data structure and/or indexing mechanism. The storage metadata may further comprise a validity map 127, which may comprise and/or reference respective validity bitmaps 128A-N comprising validity information pertaining to respective storage divisions 134A-N. The validity bitmaps 128A-N may indicate whether data programmed to the storage locations 132 of the respective storage divisions 134A-N is valid.

Figure 1C:
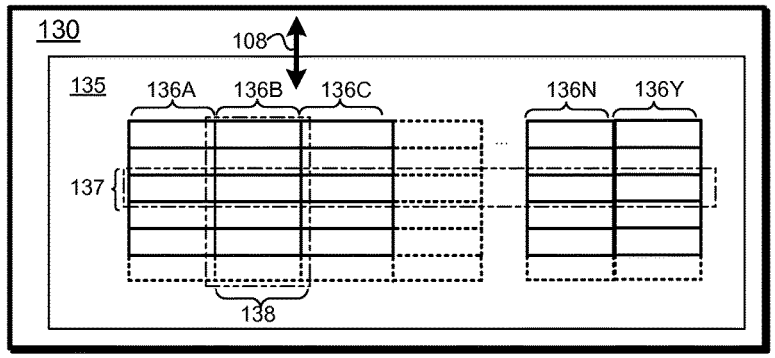
FIG. 1C is a schematic block diagram of one embodiment of a storage array.

Referring to FIG. 1C, in some embodiments, the storage medium 130 comprises a storage array 135 that includes a plurality of storage elements 136A-Y. As used herein, a storage element 136A-Y includes, but is not limited to, solid-state storage resources embodied as a package, chip, die, plane, printed circuit board, and/or the like. As used herein, a storage array 135 refers to a set of two or more independent columns 138, comprised of one or more storage elements 136A-Y. The rows 137 of the array 135 may comprise physical storage units of the respective columns 138 (e.g., solid-state storage elements 136A-Y). The storage elements 136A-Y comprising the array 135 may be capable of independent operation. Accordingly, a first one of the storage elements 136A may be capable of performing a first storage operation while a second storage element 136B performs a different storage operation. In one embodiment, the storage element 136A may be configured to read data at a first storage address, while another storage element 136B reads data at a different storage address.

A solid-state storage array 135 may also be referred to as a logical storage element (LSE). As disclosed in further detail herein, the solid-state storage array 135 may comprise logical storage units (rows 137). As used herein, a "logical storage unit" or row 137 refers to a combination of two or more physical storage units, each physical storage unit on a respective column 138 of the storage array 135. A logical storage division refers to a set of two or more physical erase blocks, a logical page refers to a set of two or more pages, and so on. In some embodiments, a logical erase block may comprise erase blocks within respective logical storage elements and/or banks. Alternatively, a logical erase block may comprise erase blocks within a plurality of different arrays 135 and/or may span multiple banks.

Referring back to FIG. 1A, the storage module 110 may further include an error management module 118 configured to, inter alia, manage data errors pertaining to storage operations on the storage medium 130. In some embodiments, the error management module 118 is configured to generate error recovery data, which may include, but is not limited to: ECC data, redundant data, parity data, and/or the like. In the FIG. 1A embodiment, the error management module 118 comprises an ECC write module 115 and an ECC read module 117. The ECC write module 115 may be configured to generate error detection and/or correction data corresponding to data segments written to the storage medium 130. The ECC write module 115 may comprise one or more circuits and/or buffers to generate ECC encoded data for storage according to a particular storage layout and/or arrangement on the storage medium 130. As used herein, a data segment refers to any quantum of data including, but not limited to: data pertaining to a storage request, data corresponding to one or more logical identifiers, one or more data blocks, unstructured data (e.g., data blobs), structured data, a data packet 155, a data container, a data set, a data range, a data extent, a data record, an object, a data object, and/or the like.

In some embodiments, the error management module 118 comprises a circuit, controller, and/or programmable logic to implement the error mitigation operations, as disclosed herein. The error management module 118 may comprise an ECC encode circuit (ECC write module 115 disclosed herein) configured to encode data for storage on the storage medium 130. The error management module 118 may further comprise an ECC decode circuit (ECC read module 117) configured to decode ECC encoded data read from the storage medium 130. The ECC decode circuit may be configured to detect and/or correct bit errors in data read from the storage medium 130 by use of the ECC encoding of the data. The error management module 118 may further include a media tuning circuit configured to adjust media tuning parameters used to read data from the storage medium 130 (e.g., modify bit detection thresholds and/or the like). The error management module 118 may further include a parity substitution circuit configured to correct data errors by use of parity substitution operations, as disclosed herein.

As disclosed above, the ECC write module 115 may generate ECC codewords for storage, which may include, but are not limited to: ECC chunks, ECC symbols, ECC syndromes, and/or the like. The ECC write module 115 may be configured to implement any suitable ECC algorithm including, but not limited to: block ECC encoding, convolutional ECC encoding, Low-Density Parity-Check (LDPC) encoding, Gallager encoding, Reed-Solomon encoding, Multidimensional parity encoding, Hamming codes, cyclic error-correcting codes, BCH codes, and/or the like. The ECC write module 115 may be configured to generate ECC codewords of a predetermined size. Accordingly, a single data segment and/or data packet may be encoded into a plurality of different ECC data structures and/or a single ECC data structure may comprise portions of two or more data segments. Alternatively, the ECC write module 115 may be configured to generate ECC codewords of varying sizes according to the reliability characteristics and/or configuration of the storage medium 130 (e.g., reliability and/or configuration of the storage units 132, storage divisions 134, and so on).

The error management module 118 may be configured to generate error detection and/or correction information having a particular "strength." As used herein, the ECC strength of an ECC codeword refers to the number of errors that can be detected and/or corrected by use of the ECC codeword (e.g., EC_MAX of the ECC algorithm implemented by the ECC write module 115 and/or ECC read module 117). In some embodiments, the strength of the ECC codewords generated by the error management module 118 are adaptive and/or configurable based on reliability characteristics of the storage medium 130. The strength of the ECC encoding may be selected according to the reliability and/or error rate of the storage medium 130 and/or different portions of the storage medium 130. The strength of the ECC encoding may be independent of the layout and/or partitioning of the solid-state storage medium 130, which may allow the storage module 130 to select a suitable ECC encoding strength based on the conditions of the solid-state storage medium 130 (e.g., reliability characteristics), user requirements, and/or the like, as opposed to static and/or predetermined ECC settings imposed by the manufacturer of the storage medium 130.

In some embodiments, the error management module 118 generates ECC codewords comprising a data segment of length N, and a syndrome of length S. The error management module 118 may be configured to encode data segments into 240 byte ECC codewords, each ECC codeword comprising a 224 byte data segment and a 16 byte ECC syndrome. In this embodiment, the ECC encoding may be capable of correcting more bit errors than the manufacturer of the solid-state storage medium 130 requires. In other embodiments, the error management module 118 may be configured to encode data by use of a symbolic ECC encoding, such that each data segment of length N produces a symbol of length X. Accordingly, writing a data segment to the storage medium 130 may comprise a) generating ECC data corresponding to the data segment (e.g., encoding the data segment as an ECC codeword or one or more ECC symbols) and b) writing the generated ECC data to the storage medium 130 by use of the write module 114.

The error management module 118 may further include an ECC read module 117 configured to decode ECC data stored on the storage medium 130 by use of the ECC write module 115. The ECC read module 117 may comprise one or more circuits and/or buffers configured to read ECC encoded data stored on the storage medium 130, and to decode the data by use of the ECC encoding. Accordingly, a read operation on the storage medium 130 may comprise a) reading ECC data from the storage medium 130 by use of the read module 116, b) decoding the ECC data by use of the ECC read module 117. Decoding ECC data may comprise a) detecting errors in the ECC data and/or b) correcting the detected errors (if possible). The error management module 118 may identify ECC codewords that cannot be corrected by use of ECC data, and may attempt to recover such data by use of media tuning, redundant data, such as a redundant copy of the ECC codeword stored on another location (e.g., another storage unit 132) and/or by use of parity data stored on the storage medium 130. Media tuning may comprise retrying storage operations on the storage medium 130 using different media parameters, settings, and/or thresholds (e.g., voltage thresholds, and/or the like). Errors that cannot be corrected by use of ECC, media tuning, data redundancy, and/or parity substitution may result in an EIO.

As disclosed above, the error management module 118 may be configured to store data redundantly and/or with parity data. Referring to the storage array 135 depicted in FIG. 1C, the error management module 118 may be configured to store data redundantly on two or more different storage elements 136A-Y (e.g., two or more different columns 138). Data that cannot be recovered from a first one of the storage elements 136A-Y may be read from a different one of the storage elements 136A-Y. Alternatively, or in addition, the error management module 118 may be configured to store parity data on the storage array 135. In one embodiment, the media controller 113 is configured to store data within respective rows 137 of the storage array 135 (e.g., store data to a plurality of different storage elements 136A-Y in parallel). The error management module 118 may use one of the storage elements (e.g., storage element 136Y) to store parity data corresponding to data stored in other storage elements 136A-N of the storage array 135. Accordingly, an operation to program data to particular row 137 may comprise a) calculating parity data corresponding to the data to be programmed to the storage elements 136A-N, and b) programming the data to storage elements 136A-N and programming the parity data to storage element 136Y. An error pertaining to data stored in one or more of the storage elements 136A-N that cannot be corrected by use of ECC information may be corrected by parity substitution, which may comprise a) decoding ECC data stored on other elements 136A-N and/or the parity storage element 136Y, and b) recovering the unreadable data by use of parity substitution (e.g., using the decoded ECC data and/or parity data).

As disclosed herein, the storage medium 130 may have asymmetric and/or write-once properties. As used herein, a "write once" storage medium refers to a storage medium that is initialized (e.g., erased) each time new data is written or programmed thereon. As used herein, an "asymmetric" storage medium refers to a storage medium that has different latencies for different types of storage operations. In some embodiments, read operations may be faster than write/program operations, and write/program operations may be much faster than erase operations (e.g., reading the media may be hundreds of times faster than erasing, and tens of times faster than programming the storage medium 130). The storage medium 130 may be partitioned into storage divisions 134 that can be erased as a group (e.g., erase blocks). As such, modifying data "in-place" may require erasing an entire erase block and rewriting the modified data to the erase block, along with other, unchanged data stored on the erase block. This may result in "write amplification" that can be inefficient and excessively wear the media. In some embodiments, therefore, the storage layer 130 may be configured to write data "out-of-place." As used herein, writing data "out-of-place" refers to updating and/or overwriting data at different storage location(s) rather than overwriting the data "in-place" (e.g., overwriting the original physical storage location of the data). Updating and/or overwriting data out-of-place may avoid write amplification, since existing, valid data on the erase block with the data to be modified need not be erased and recopied. Moreover, writing data out-of-place may remove erasure from the latency path of many storage operations, such that erasure latency is not part of the "critical path" of write operations.

Referring to FIG. 1A, the storage layer 110 may be configured to perform storage operations out-of-place in the storage medium 130 by use of, inter alia, a log storage module 150. The log storage module 150 may be configured to store data in within a "storage log," and/or in a "log structured format" or "log format." As used herein, a "storage log" and/or "log structured format" refers to an ordered arrangement of log entries stored within the storage address space 131. As disclosed above, data stored in a storage log may comprise and/or be associated with persistent, crash safe metadata that is configured to, inter alia, identify the data (e.g., indicate a context of the stored data). The persistent, crash safe metadata may include any suitable information pertaining to the stored data, including, but not limited to, translation metadata (e.g., logical-to-physical translation metadata), the logical interface of data in the storage log (e.g., LIDs associated with the data), modifications to logical-to-physical translations, information pertaining to the owner of the data, access controls, data type, relative position or offset of the data within another data structure (e.g., an object), information pertaining to storage operation(s) associated with the data (e.g., atomic storage operations, transactions, and/or the like), sequence information, data storage parameters (e.g., compression algorithm, encryption, etc.), and/or the like.

Figure 1D:
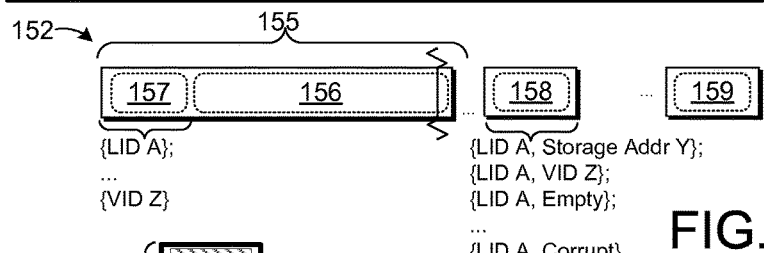
FIG. 1D depicts embodiments of log entries for a storage log.

FIG. 1D illustrates embodiments of storage log entries 152, including a data storage log entry (data packet 155), a metadata entry 158, and log sequence metadata (e.g., sequence information 159). The data packet 155 may comprise a data block 156 and persistent metadata 157. The data block 156 may be of any arbitrary length and/or size. The persistent metadata 157 may be embodied as one or more header fields of the data packet 155. The persistent metadata 157 of the data packet 155 may comprise a metadata entry pertaining to the data block 156. The persistent metadata 157 may comprise the logical interface of the data block 156, such as the LID(s) associated with the data block 156 (e.g., LID A, VID Z, and/or the like) and/or other identifiers associated with the data block 156 (e.g., intermediate and/or virtual identifier Y). Although FIG. 1D depicts a particular embodiment of a data packet 155, the disclosure is not limited in this regard and could associate data (e.g., data block 156) with persistent, crash safe metadata in other ways including, but not limited to, an index on the storage medium 130 (and/or other storage device), a storage division index, a separate metadata log, a metadata entry 158, and/or the like. Accordingly, in some embodiments, the data entries 155 may be associated with separate metadata entries 158 (described in further detail below) and, as such, may not include a persistent metadata header 157.

FIG. 1D further depicts embodiments of a metadata entry 158. As disclosed above, a metadata entry refers to an entry in the storage log comprising persistent, crash safe metadata pertaining to the storage log. A metadata entry 158 may include but is not limited to: translation metadata (e.g., logical-to-physical translation metadata), the logical interface of data in the storage log (e.g., LIDs associated with the data), modifications to logical-to-physical translations, information pertaining to the owner of the data, access controls, data type, relative position or offset of the data within another data structure (e.g., an object), information pertaining to storage operation(s) associated with the data (e.g., atomic storage operations, transactions, and/or the like), log sequence information, data storage parameters (e.g., compression algorithm, encryption, etc.), and/or the like. As illustrated in FIG. 1D, the metadata entry 158 may comprise: a) logical-to-physical mapping information that associates LID(s) with data stored in the log (and/or modifies existing logical-to-physical mappings (e.g., maps LID A to storage address Y, {LID A, Storage Addr Y}), may comprise logical-to-virtual mapping information that associates LIDs with particular intermediate and/or virtual identifiers (e.g., maps LID A to VID Z, {LID A, VID Z}), indicates that the LID A is empty, deleted, unmapped, TRIMed, {LID A, Empty}), indicates that LID A corresponds to data that is unreadable and/or corrupt {LID A, Corrupt}, and/or the like.

The log entries 152 disclosed herein may be associated with log sequence metadata that defines, inter alia, the relative order of the log entries 152 within the storage log (e.g., sequence information 159). The sequence information 159 of FIG. 1D may be used to determine the relative log order of storage divisions 134 comprising a storage log. In some embodiments, the log storage module 150 appends log entries 152 sequentially within storage divisions 134 of the storage medium 130. Each storage division 134 may be capable of storing a large number of data packets (e.g., may comprise a plurality of storage units 132). Storage divisions 134 may be assigned sequence information 159 at the time the storage divisions 134 are initialized for use (e.g., erased), programmed, closed, and/or the like. The sequence information 159 may determine the log order of the storage divisions 134 (e.g., order in which data was appended within the respective storage divisions 134). Accordingly, the log order of an entry 152 in the storage log may be determined by: a) the relative position of the entry 152 within a particular storage division 134, and b) the log order of the storage division 134 as determined by the corresponding sequence information 159.

Figure 1E:
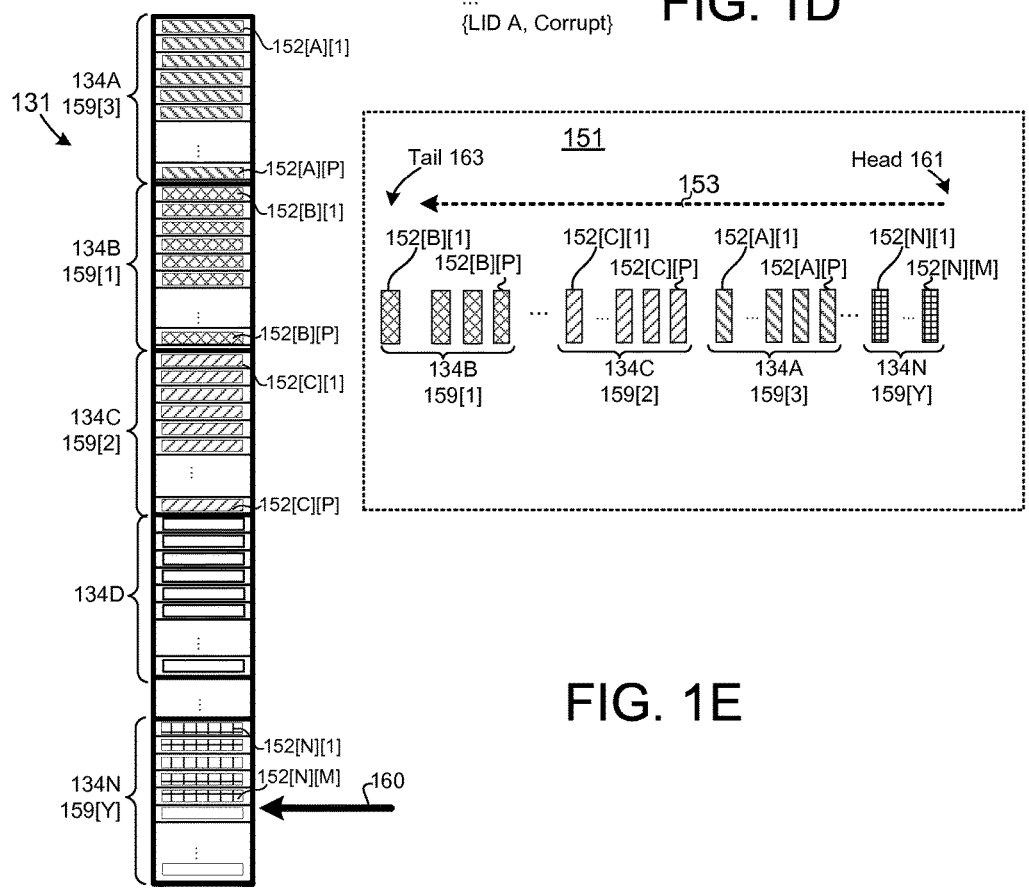
FIG. 1E depicts one embodiment of a storage log with a storage address space of a storage medium.
Figure 1F:
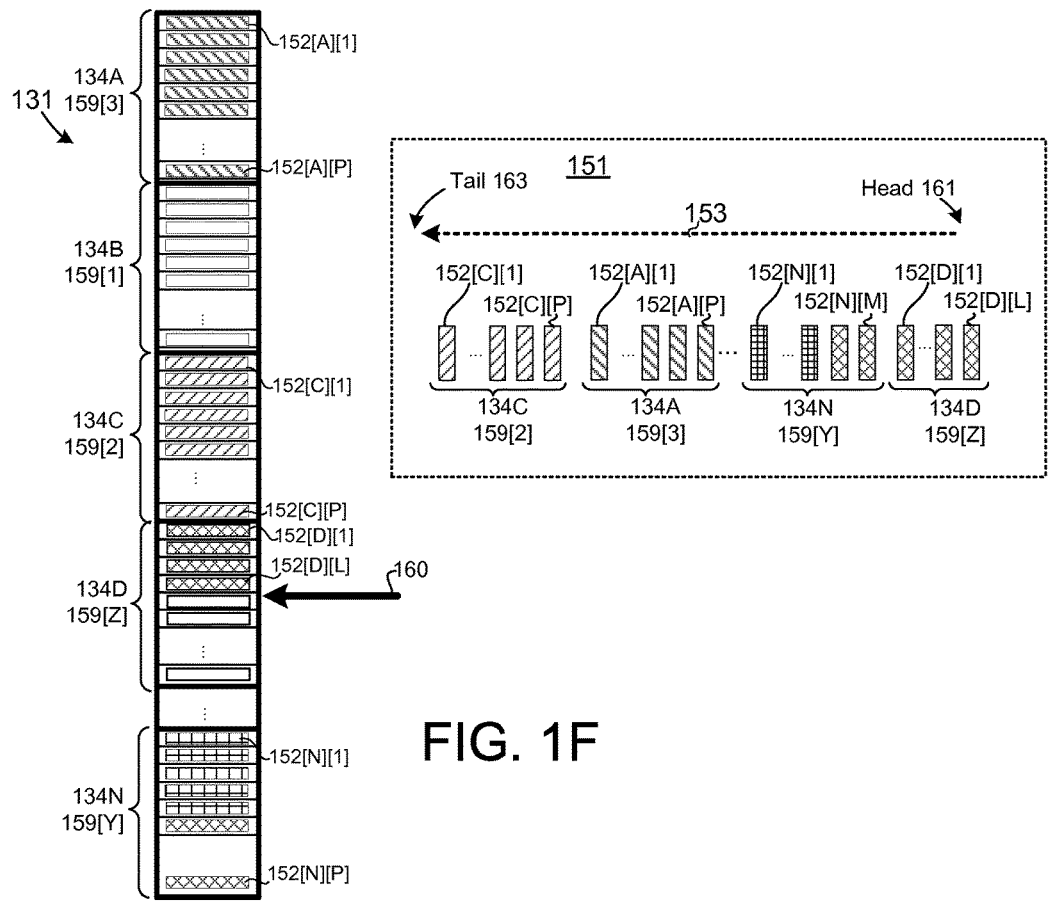
FIG. 1F depicts embodiments of a data refresh operation.

FIG. 1F depicts one embodiment of a storage log 151. The storage log 151 may comprise a plurality of log entries 152 stored sequentially within the storage address space 131 of the storage medium 130. As disclosed above, the log order 153 of the entries 152 may be determined based on a) the offset of the entries 152 within the respective storage divisions 134A-N and b) the sequence information 159 associated with the storage divisions 134A-N.

The log storage module 150 may be configured to append log entries 152 sequentially within the storage address space 131 (e.g., within storage divisions 134A-N), by use of, inter alia, the media controller 113. The log storage module 150 may be configured to fill respective storage divisions 134A-N before appending data to other storage divisions 134A-N. The order in which data is appended within the respective storage divisions 134A-N may be determined according to the availability of erased and/or initialized storage divisions 134A-N (e.g., a write queue 154 of the log storage module 150).

In the FIG. 1E embodiment, the log storage module 150 may have stored entries 152[A][1]-152[A][P] sequentially within storage division 134A, such that log entry 152[A][P] is ordered later in the storage log 151 (stored more recently) relative to data packet 152[A][1]. FIG. 1E further illustrates entries 152 stored sequentially within other storage divisions 134B-N: entries 152[B][1]-152[B][P] are stored sequentially within storage division 134B, data packets 152[C][1]-152[C][P] are stored sequentially within storage division 134C, data packets 152[N][1]-152[N][P] are stored sequentially within storage division 134N, and so on. The storage division 134D may be in a writeable state (initialized) and, as such, may not comprise any stored log entries 152 nor be assigned sequence information 159.

As disclosed above, the log storage module 150 may mark storage divisions 134A-N with respective sequence information 159[1]-159[Y] that defines the order in which data was programmed to the storage divisions 134A-N. Accordingly, the log order 153 of the entries 152[A][1]-152[N][M] may be defined by, inter alia, the sequence information 159[1]-159[Y] assigned to the respective storage divisions 134A-N. In some embodiments, sequence information 159 is stored at a predetermined location within the respective storage divisions 134A-N (e.g., in a header, at a predetermined offset, and/or the like). Alternatively, sequence information 159 pertaining to the storage divisions 134A-N may be stored at a designated storage address. The sequence information 159[1]-159[Y] may be stored on the storage divisions 134A-N during initialization, when selected for use by the log storage module 150, and/or placed in a write queue 154; when data is appended to the storage divisions 134A-N; when the storage divisions 134A-N are closed; and/or the like.

In the FIG. 1E embodiment, the sequence information 159[Y] may correspond to the most recent (youngest) storage division 134A-N within the storage log 151, and the sequence information 159[1] may correspond to the earliest (oldest) storage division 134A-N within the storage log 151. Therefore, and as illustrated in FIG. 1E, the log order 153 of the storage divisions 134A-N may be: 134N (most recent), 134A, 134C, and 134B (oldest). The order of the individual entries 152[A][1]-152[N][M] within the storage log 151 may be determined based on the sequence information 159 of the storage divisions 134A-N and the relative storage addresses of the entries 152[A][1]-152[N][M] within the respective storage divisions 134A-N. In the FIG. 1E embodiment, the log order 153 from most recent (head 161 of the storage log 151) to oldest (tail 163 of the storage log 151) is: 152[N][M]-152[N][1], 152[A][P]-152[A][A], 152[C][P]-152[C][1], and 152[B][P]-152[B][1].

The log storage module 150 may be configured to append entries 152 sequentially at an append point 160 within the storage log 151 (at the head 161 of the storage log 151). The log storage module 150 may advance the append point sequentially within the storage address space 131 of the respective storage divisions 134A-N (e.g., from storage address 0 to storage address N of the respective storage divisions 134A-N). The disclosure is not limited in this regard, however, and could be adapted to advance the append point according to any sequence and/or pattern (e.g., from storage address N to 0, according to a particular fill pattern, and/or the like). After filling (and/or substantially filling) the storage division 134N, the log storage module 150 may advance the append point 160 to a next available storage division 134A-N. As disclosed herein, an available storage division refers to a storage division that is in a writeable state (has been initialized), such as storage division 134C. As disclosed in further detail herein, the log storage module 150 may comprise a garbage collector 149 to perform garbage collection operations on the storage divisions 134A-N, which may comprise initializing storage divisions 134A-N and/or making the storage divisions 134A-N available to the log storage module 150 to store new log entries 152.

As disclosed above, the storage module 110 may comprise an error management module 118 configured to store data with error detection and/or correction information. Appending a log entry 152 to storage log 151 may, therefore, comprise: a) generating error detection and/or correction information pertaining to the log entry 152 (e.g., an ECC codeword, data redundancy, parity data, and/or the like), and b) writing the generated error detection and/or correction information to the storage medium 130. In order to avoid obscuring the details of the disclosed embodiments, FIG. 1E depicts log entries 152 stored within the storage address space 131. The disclosure is not limited in this regard; the log entries 152 disclosed herein may be encoded within ECC codewords, may be stored redundantly within two or more storage divisions 134A-N, may be stored with corresponding parity information, and/or the like.

Referring back to FIG. 1A, the storage module 110 comprises a reliability manager 140 configured to manage reliability characteristics of the storage medium 130. As disclosed herein, the reliability manager 140 and/or the components thereof (e.g., reliability monitor 142, relocation module 147, refresh module 148, and/or the like), may comprise a circuit, controller, and/or programmable logic elements on one or more of the computing system 100, storage device 109, and/or another separate computing device or system. The reliability manager 140 may include a reliability monitor 142 configured to gather information pertaining to reliability characteristics of the storage medium 130, which may comprise one or more of: a)

monitoring error rates of storage operations performed on the storage medium 130, b) performing test storage operations on portions of the storage medium 130, c) detecting error correction operations implemented by the media controller 113 and/or error management module 118 (e.g., ECC corrections, parity substitution, media tuning, and/or the like), d) identifying storage operation failures (e.g., uncorrectable errors, EIO, part failures, and/or the like), and so on. The reliability monitor 142 may be configured to perform reliability scans on the storage medium 130, which may comprise performing test read operations at particular storage addresses of the storage medium 130. The reliability scan implemented by the reliability monitor 142 may be configured to cover storage divisions 134 that are currently in use to store data as indicated by the storage metadata 124.

The reliability monitor 142 may be further configured to determine a program and/or initialization time of the storage divisions 134 which may be used to, inter alia, determine the elapsed data retention time of storage divisions 134 and/or determine remaining time-to-refresh ($\Delta T\_Remain$) of the storage divisions 134, as disclosed herein. In some embodiments, the reliability monitor 162 determines the error rate of a storage operation by use of the error management module 118. As disclosed above, the error management module 118 may be configured to detect and/or correct data errors by use ECC information (e.g., ECC codewords, symbols, syndromes, and/or the like), media tuning, parity substitution, data redundancy, and/or the like. The reliability monitor 142 may determine the error rate pertaining to particular storage operations based on error detection and/or correction operations performed by the error management module 118 (e.g., the number of errors detected and/or corrected by the ECC read module 117). In some embodiments, the media controller 113 is configured to report error conditions to the reliability monitor 142. Alternatively, or in addition, the reliability monitor 142 may query the media controller 113 and/or error management module 118 for error correction and/or detection information.

The reliability monitor 142 may capture error correction and/or detection information pertaining to storage operations performed in response to client requests (e.g., requests received from clients 107 through the interface 112). Alternatively, or in addition, the reliability monitor 142 may be configured to actively scan portions of the storage medium 130 (e.g., perform test operations on portions of the storage medium 130). A test operation may comprise reading data from particular storage units 132 and/or divisions 134. The test operations may further comprise determining an error rate of the operation(s) (e.g., errors detected and/or corrected by the error management module 118, as disclosed above). The reliability monitor 142 may implement test operations independently of other storage operations, and may be configured to avoid impacting other storage requests (e.g., may be performed as low-priority, autonomous background operations).

The reliability monitor 142 may be configured to perform test operations according to a test pattern and/or sequence within the storage address space 131. The test pattern and/or sequence may be adapted to ensure that the storage divisions 134 and/or storage units 132 are tested one (or more) times during a particular time interval. As disclosed above, the error rate of a storage division 134 and/or storage unit 132 may increase as a function of elapsed retention time (e.g., data stagnation time). The reliability monitor 142 may, therefore, test storage divisions 134 comprising aged data more frequently than storage divisions 134 comprising data that was programmed more recently. Referring to FIG. 1E, the reliability monitor 142 may be configured to perform test operations based on a log order 153 of storage divisions 134A-N; the reliability monitor 142 may test storage divisions 134A-N that are near the tail 163 of the storage log 151 (e.g., storage division 134B) more frequently than storage divisions 134A-N at the head 161 of the storage log 151 (e.g., storage division 134A).

In one embodiment, the reliability monitor 142 comprises a circuit and/or communication interface acquire reliability information pertaining to storage operations performed on the storage medium 130 by the media controller 113, such as the bit error rate, media tuning operations, parity substitution, and/or the like. The reliability monitor 142 may, therefore, comprise and/or be communicatively coupled to the error management module 118 (e.g., ECC decode circuit of the ECC read module 117) to identify errors detected and/or corrected by use of ECC data, detect media tuning operations (e.g., read retry operations), identify parity substitution operations, and/or the like. In some embodiments, the reliability monitor 142 comprises a processor and memory. The processor of the reliability monitor 142 may execute computer-readable instructions to perform reliability scans on the storage medium 130 according to a particular scan pattern and/or sequence, as disclosed herein. The reliability monitor 142 may record reliability metadata 144 pertaining to reliability scans (and/or error mitigation operations performed in response to storage requests) in the memory (e.g., reliability metadata 144), non-transitory storage resources 104 of the computing system 100, and/or the like.

Referring to FIG. 1A, the reliability manager 140 may be configured to determine a reliability metric corresponding to particular storage division(s) 134 and/or storage unit(s) 132 based on the information gathered by the reliability monitor 142. In some embodiments, the reliability manager 140 maintains reliability metadata 144 pertaining to reliability characteristics of the storage medium 130, which may include the media reliability characteristics gathered by the reliability monitor 142, as disclosed above. The reliability metadata 144 may be maintained with the storage metadata 124. In some embodiments, the reliability metadata 144 is stored in a persistent, non-transitory storage medium, such as the non-transitory storage resources 104 of the computing system 100 and/or the storage medium 130.

The reliability manager 140 may be configured to determine reliability metrics and/or reliability projections for portions of the storage medium 130. As disclosed above, a reliability metric quantifies the probability, likelihood, assurance, guarantee, and/or the like, that data stored on a particular storage unit 132 and/or storage division 134 can be successfully read therefrom. The reliability manager 140 may be configured to determine reliability characteristics of storage unit(s) 132 and/or storage division(s) 134 by use of the reliability monitor 142 and to calculate, model, estimate, and/or project the error rate and/or reliability of the storage unit(s) 132 and/or storage division(s) 134 by use of an error rate and/or reliability model (Mi). In some embodiments, the reliability manager 140 models changes in reliability by use of a linear decay function by, inter alia, scaling a current and/or observed reliability metric of the storage division 134 by a time-based scaling factor. Alternatively, or in addition, the reliability manager 140 may model reliability by use of an exponential decay function (Mi corresponds to an exponential decay function), such that $R\_PR(\Delta T) = R_0 \, e^{\lambda \Delta T}$, where R_PR is the projected reliability of a storage division 134 after elapsed data retention time $\Delta T$, $R_0$ is an initial reliability value of the storage division 134 (e.g., current and/or measured reliability of the storage division 134, manufacturer estimate, and/or the like), and λ is an reliability decay factor. In other embodiments, the error rate and/or reliability model (Mi) of a storage unit 132 and/or storage division 134 incorporates one or more of: operating conditions, operating temperature, wear level(s) (e.g., erase cycle count, program or write cycle count, read cycle count, and so on), manufacturer specifications, operating voltage, testing and experience, and so on. The reliability manager 140 may be configured to project reliability metrics of a storage unit 132 and/or storage division 134 using an error rate and/or reliability model (Mi) that includes, but is not limited to: operating temperature (Temp), erase cycle count (ErC), program cycle count (PrC), read count (RdC), manufacturer specifications (MS), testing and experience (TE), and so on, as a function of elapsed data retention time ΔT, such that the reliability the storage division 134 after data retention time ΔT is modeled as: R_PR(ΔT)=Mi(ΔT, Temp, ErC, PrC, RdC, MS, TE). The error rate and/or reliability model (Mi) may comprise any suitable modeling function, including, but not limited to: a linear model, an exponential model, a quadratic model, a spline model, a plurality of modeling functions (e.g., piecewise modeling), and/or the like. Although particular mechanisms for modeling storage reliability and/or error rate are described herein, the disclosure is not limited in this regard and could be adapted to model the reliability and/or error rate of storage units 132 and/or storage divisions 134 using any suitable modeling factors and/or modeling techniques.

The reliability manager 140 may be configured to adapt and/or modify the reliability and/or error rate models corresponding to particular portions of the storage medium 130 based on one or more of: observed reliability characteristics, wear levels, and so on. As disclosed above, the error rate and/or reliability model for a storage division 134 may be used to project, forecast, and/or estimate the error rate and/or reliability of a storage division 134 as a function of, inter alia, data retention time. The reliability manager 140 may be configured to revise the error rate and/or reliability model for a storage division 134 based on observed and/or measured reliability characteristics. In some embodiments, the reliability manager 140 is configured to calculate an updated and/or revised error rate and/or reliability model (Mi_curr) for a storage division 134 based on current and/or measured reliability characteristics.

In some embodiments, the error rates of storage divisions 134 decay more rapidly as a function of wear level (e.g., program erase count). The reliability manager 140 may be configured to track the wear level of storage divisions 134 (by use of the storage metadata 124), and to adjust the reliability and/or error rate model(s) of the storage divisions 134 accordingly. In some embodiments, adjusting the reliability and/or error rate model(s) of a storage division 134 comprises changing the model type (e.g., switching from a particular exponential decay function to a different exponential decay function and/or different model type, such as a quadratic or linear model).

The reliability manager 140 may be further configured to dynamically modify and/or adjust the reliability model of a storage division 134 in response to reliability characteristics of the storage division 134. The reliability and/or error rates of the storage divisions 134 may differ and/or may decay at different rates. The reliability manager 140 may, therefore, apply different reliability models and/or model parameters to different storage divisions 134 based, at least in part, on observed reliability characteristics pertaining to the storage divisions 134 (e.g., as gathered by the reliability monitor 142).

The reliability manager 140 may be further configured to identify storage units 132 and/or storage divisions 134 that should be retired and/or taken out of service. As disclosed above, retiring a portion of the storage medium 130 refers to removing the portion from use for storing data. The reliability manager 140 may retire portions of the storage medium 130 that are not sufficiently reliable (fail to satisfy an error rate and/or reliability threshold), have failed, have become inaccessible, and/or the like. Retiring a storage division 134 may comprise removing the storage division 134 from use (from a write queue of the log storage module 150), recording that the storage division 134 is out-of-service in the storage metadata 124 and/or reliability metadata 144, and/or the like. In some embodiments, the reliability manager 140 retires portions of storage divisions 134. Referring to FIG. 1C, the reliability module 140 may retire one or more erase blocks of a storage division 134 comprising a logical erase block (within a row 137). Retiring a portion of a storage division 134 may, therefore, comprise selectively retiring particular columns 138 and/or storage elements 136A-Y within the storage array 135.

Referring back to FIG. 1A, in some embodiments, the reliability manager 140 further includes a retention manager 146 configured to, inter alia, determine a time interval between refresh operations (ΔT_Ref). The retention manager 146 may adapt the rate of refresh operations (e.g., time interval between refresh operations, ΔT_Ref) based on reliability and/or error rate projections calculated by the reliability manager 140, as disclosed above. The retention manager 146 may determine the refresh period (ΔT_Ref) of the storage divisions 134 to ensure that data does not become unreadable due to, inter alia, data stagnation issues. The time between refresh operations (ΔT_Ref) of a storage division 134 may, therefore, be set to prevent the projected error rate (E_PR) of a storage division 134 from exceeding an error threshold (E_TH). The error threshold (E_TH) may be less than the error correction threshold of the storage module 110 and/or error management module 118 (e.g., less than EC_MAX). The maximum allowable time between refresh operations (ΔT_MAX) may be the elapsed time ΔT where the projected error rate reaches the error threshold (E_TH), such that E_TH=$M_i$(ΔT_MAX). The refresh rate and/or refresh time interval (ΔT_Ref) may be selected such that $M_i$(ΔT_Ref)≤E_TH. Therefore, the storage controller may set the time between refresh operations (ΔT_Ref) to be less than or equal to ΔT_MAX. Alternatively, or in addition, the retention manager 146 may configure the refresh period (ΔT_Ref) to prevent the projected reliability (R_PR) of storage divisions 134 from falling below a reliability threshold (R_TH).

The retention manager 146 may be further configured to calculate the remaining time-to-refresh (ΔT_Remain) of storage divisions 134. As used herein, the "remaining time to refresh" or "remaining retention time" refers to the time remaining until data stored on a particular storage division is to be refreshed in one or more of a data refresh and/or GC operation. The remaining time to refresh (ΔT_Remain) of a storage division 134 may be calculated as ΔT_Remain=ΔT_Ref−ΔT, where ΔT is the time elapsed since data was programmed onto the storage division 134 and ΔT_Ref is the time between refresh operations for the storage division 134. Alternatively, the remaining time to refresh (ΔT_Remain) of a storage division 134 may be calculated as ΔT_Remain=ΔT_MAX−ΔT where ΔT_MAX is the maximum data retention time for the storage division 134.

Alternatively, or in addition, the retention manager 146 may calculate the remaining time-to-refresh (ΔT_Remain) of a storage division 134 based on information acquired by the reliability monitor 142 (e.g., based on observed reliability characteristics of the storage division 134). The retention manager 146 may calculate the remaining time-to-refresh (ΔT_Remain) using an updated reliability and/or error rate model for a storage division 134, generated by the reliability manager 140. The retention manager 146 may determine the remaining time-to-refresh (ΔT_Remain) such that the projected error rate for the storage division 134 using an updated error rate model (Mi_curr) is less than or equal to the error threshold (E_TH), such that Mi_curr(ΔT_Remain) ≤E_TH.

In some embodiments, the reliability manager 140 is further configured to calculate error rate and/or reliability metrics corresponding to selected portions of a storage division 134 (partial or selective reliability metrics). As used herein, "partial reliability metrics" refer to reliability metrics pertaining portions, but not all, of a storage division 134. A partial reliability metric of a storage division 134 may, therefore, exclude reliability characteristics of at least a portion of the storage division 134. (e.g., exclude reliability characteristics of one or more storage units 132 within the storage division 134 and/or exclude reliability characteristics of one or more elements 136A-Y within the storage array 135 of FIG. 1C).

In some embodiments, the reliability manager 140 is configured to calculate a "selective reliability metric" for a storage division 134. As used herein, a "selective reliability metric" refers to a reliability metric corresponding to selected portions of a storage division 134. The portions of the storage division 134 from which the selective reliability metric is derived may be designated by use of a selection criterion (e.g., to exclude high error-rate storage unit(s) 132). The reliability manager 140 may be further configured to calculate, project, model, and/or estimate partial and/or selective reliability metrics, as disclosed above. As used herein, an error rate and/or reliability model based on partial or selective reliability metrics may be referred to as a selective model (Mi_select). A selective error rate and/or reliability model (Mi_select) may selectively incorporate the reliability and/or error rate characteristics disclosed herein and/or may be updated to include current and/or observed reliability characteristics, as disclosed above (e.g., in an updated, current error rate and/or reliability model Mi_select_curr).

In some embodiments, the retention manager 146 maintains a reliability queue 145 that, inter alia, comprises an ordered list of storage divisions 134 that are currently in use to store data on the storage medium 130. The storage divisions 134 may be ordered based on one or more of: elapsed data retention time, current and/or projected reliability metrics, remaining time to refresh (ΔT_Remain), and/or the like. As disclosed in further detail herein, the refresh manager 148 and/or garbage collector 149, may select storage divisions for refresh and/or GC operations from the reliability queue 145.

In some embodiments, the reliability manager 140 includes a refresh manager 148 configured to manage data refresh operations on the storage medium 130. As used herein, a data refresh operation refers to an operation to prevent stored data from becoming unreadable due to, inter alia, data stagnation conditions. A refresh operation may comprise relocating data stored on particular storage division 134 to one or more other storage divisions 134 (by use of a relocation module 147). Relocating data may comprise appending data to the head of the storage log 151, as disclosed herein.

The refresh manager 148 may be configured to refresh storage divisions 134 in accordance with a particular refresh frequency and/or refresh period (ΔT_Ref), such that data does not remain stagnant on storage divisions 134 for more than a threshold period of time (e.g., ΔT_MAX). As disclosed above, the refresh period of a storage division 134 may be based on reliability characteristics of the storage division 134, such as error rate, projected error rate, reliability modeling, error modeling, and/or the like. The refresh period ΔT_MAX may be adapted to ensure that the error rate and/or reliability of the storage division 134 do not fall below a threshold. The refresh manager 148 may configure the refresh rate of a particular storage division 134, such that $M_i(\Delta T) \leq E\_TH$, where ΔT is the time elapsed since data was programmed to the particular storage division 134 (e.g., time between refresh operations), having a reliability model $M_i$. The maximum allowable time between refresh operations (ΔT_MAX) may be the elapsed time ΔT where the projected error rate reaches the error threshold (E_TH), such that $E\_TH \geq M_i(\Delta T\_MAX)$. The error threshold ($E_{TH}$) may be less than an error correction threshold of the error management module 118 (e.g., less than EC_MAX). Alternatively, or in addition, the refresh period of a storage division 134 may correspond to a ΔT_Remain value calculated by the retention manager 146. In some embodiments, the refresh manager 148 selects storage divisions 134 for refresh from the reliability queue 145, such that storage divisions 134 exhibiting the highest error rates and/or lowest reliability are selected for refresh regardless of elapsed data retention time.

Referring to FIG. 1F, in some embodiments, the refresh manager 148 is configured to select storage divisions 134A-N for refresh based on a log order 153 of the storage divisions 134A-N. Storage division(s) 134A-N at the tail 163 of the storage log 151 may comprise data that was programmed before data was programmed on the storage division(s) 134A-N at the head 161 of the storage log 151. Accordingly, the elapsed data retention time (ΔT) of the storage divisions 134A-N may correspond to the log order 153 of the storage divisions 134A-N.

In the FIG. 1F embodiment, the refresh manager 148 may select storage division 134B for a refresh operation (based on the log order 153 of the storage division 134B). As illustrated in FIG. 1F, the refresh operation may comprise relocating data stored on the storage division 134B one or more other storage divisions 134, by use of the relocation module 147. The relocation module 147 may configure the log storage module 150 append the contents of the storage division 134B at the head 161 of the storage log 151 (e.g., at the current append point 160), which may comprise relocating a first portion of the data stored on the storage division 134B to storage division 134N as log entries 152[N][M+1]-152[N][P]), and relocating a second portion to a next available storage division (e.g., storage division 134D) as log entries 152[D][1]-152[D][L]. The refresh operation may further comprise initializing storage division 134B (e.g., erasing the storage division 134B and/or placing the storage division 134B in the write queue 154).

In some embodiments, the reliability manager 140 schedules refresh operations in response to identifying a storage unit 132 having an error rate that exceeds a high error-rate threshold (E_High). The storage unit 132 identified by the reliability monitor 142 in response to one or more of a storage request pertaining to the storage unit 132, a test operation performed on the storage unit 132, and/or the like. The refresh error threshold (E_High) may be less than EC_MAX. However, a storage unit 132 having an error rate that exceeds E_High become unreadable (and/or uncorrectable by use of ECC information stored on the storage medium 130) within a relatively short time period (e.g., within a time threshold (ΔT_High).

As disclosed above, refreshing a storage division 134 may comprise rewriting data stored on the storage division 134 to one or more other storage divisions 134 on the storage medium 130. A storage division 134 may comprise a large number of storage units 132, which may correspond to a single storage element, a plurality of different storage elements 136A-Y of a storage array 135 (as illustrated in FIG. 1C), and/or the like. Refreshing the storage division 134 may, therefore, comprise rewriting a significant amount of data, which can result in write amplification, increased media wear, decreased performance, and so on. Moreover, in some instances, error rate and/or reliability characteristics of a storage division 134 may vary within the storage division 134 itself (and/or vary between the different storage elements 136A-Y comprising the storage division 134). Certain storage units 132 within a storage division 134 may exhibit higher error rates and/or reliability characteristics than other storage units within the storage division due to, inter alia, properties of the storage media 130 (e.g., layout, manufacturing characteristics, defects, and/or the like), characteristics of storage operations performed on the storage division 134 (e.g., read and/or program operations performed on other storage unit(s) and/or division(s), resulting in read, program, and/or erase disturb), non-deterministic error conditions, interference, aberrations, randomness, and/or the like. Therefore, although a particular storage unit 132 may exhibit high error rates and/or poor reliability, other storage units 132 within the same storage division 134 may exhibit acceptable error and/or reliability characteristics. In such situations, it would be inefficient to perform a full relocation, refresh, and/or GC operation on the storage division 134, since doing so would result in unnecessary data relocation operation(s) (e.g., unnecessary relocation of data stored in storage units 132 having acceptable error and/or reliability characteristics).

In some embodiments, the storage module 110 is configured to implement partial relocation operations on storage divisions 134. As used herein, "partial" relocation, refresh and/or GC operation refers to an operation to relocate, refresh, and/or GC portions, but not all, of the data stored on a storage division 134. A partial relocation, refresh, and/or GC operation may, therefore, refer to an operation to relocate data from a portion of a storage division 134 (e.g., first subset of the storage units 132) while retaining data stored on other portions of the storage division 134 (e.g., in a second subset of storage units 132). Accordingly, a partial relocation operation refers to an operation in which some of the data is relocated from a storage division 134 and other data remains on the storage division 134. A partial relocation, refresh, and/or GC operation on a storage division 134 may, therefore, include deferring and/or postponing a full relocation, refresh, and/or GC operation on the storage division 134 until a later time (e.g., until ΔT_Remain has elapsed).

In other embodiments, the storage module 110 implements selective relocation, refresh, and/or GC operations on storage divisions 134. As used herein, a "selective" relocation, refresh, and/or GC operation on a storage division 134 refers to an operation to relocate data from a selected portion of the storage division 134, while maintaining data on another portion of the storage division 134. A selective relocation operation may, therefore, include selecting data to relocate from the storage division 134 and/or selecting data to remain on the storage division 134 by use of, inter alia, a selection criterion. Data may be selected for relocation based on reliability characteristics of the storage unit(s) 132, or portions of the storage unit(s) 132, in which the data is stored. In some embodiments, the selection criterion corresponds to reliability characteristics of the storage units 132 within the storage division 134. Data may be relocated from high error-rate storage unit(s) 132, and data stored on other storage unit(s) 132 may be retained within the storage division 134 (e.g., without performing a full relocation, refresh, and/or GC operation on the storage division 134). Accordingly, a selective relocation, refresh, and/or GC operation on a storage division 134 may comprise deferring and/or postponing a full relocation, refresh, and/or GC operation on the storage division 134 until a later time (e.g., until ΔT_Remain has elapsed). In some embodiments, storage units 132 are selected for relocation or retention based on observed and/or measured reliability characteristics of the storage unit(s) 132. Although embodiments for selective relocation, refresh and/or GC operations based on reliability and/or error rate are disclosed herein, the disclosure is not limited in this regard. The embodiments disclosed herein may be adapted to select storage units for relocation, refresh, and GC operations using any suitable criterion, including, but not limited to: error rate, error rate projection, reliability, reliability projection, status information pertaining to the data stored on the storage division 134 (e.g., whether the stored data comprises redundant cache data, as described in further detail herein, access metrics pertaining to the data, and/or the like), data validity information, and so on.

Referring to FIG. 1A, the relocation module 147 may be configured to implement partial relocation operations on storage divisions 134 by, inter alia, relocating data from a first section of a storage division 134 such that data remains on a second section of the storage division 134. Therefore, the relocation module 147 may be referred to as a partial relocation module and/or "partial relocation agent." Alternatively, or in addition, the relocation module 147 may be configured to implement selective relocation, refresh, and/or GC operations on storage units 134 by, inter alia, relocating data from selected storage units 132 within a storage division 134 such that data remains on other storage units 132 of the storage division 134. Therefore, the relocation module 147 may be referred to as a selective relocation module and/or selective relocation agent.

Figure 1G:
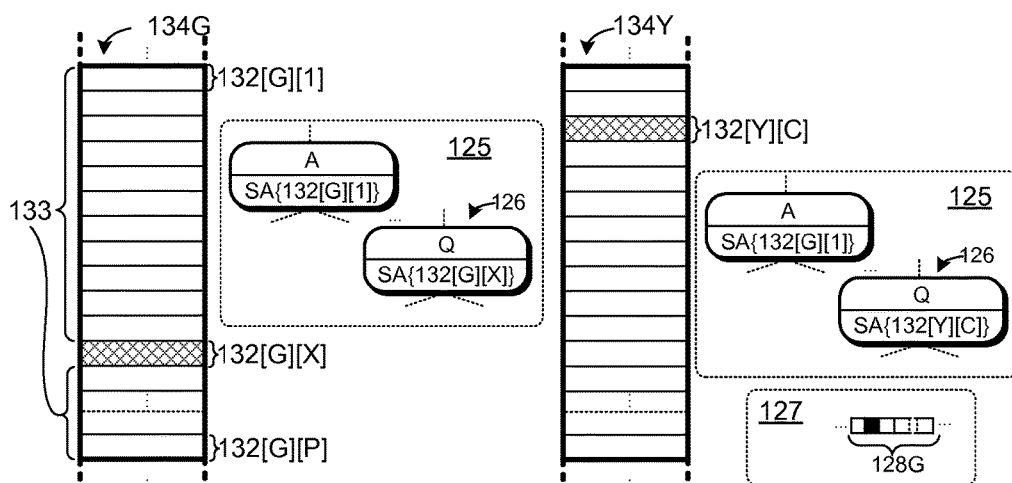
FIG. 1G depicts embodiments of selective refresh operations.

Referring to FIG. 1G, the reliability manager 140 may identify a storage unit 132[G][X] within a storage division 134G having an error rate that exceeds the E_High threshold and/or is projected to exceed E_High (or another error and/or reliability threshold) within the ΔT_High threshold. The reliability manager 140 may identify the high error-rate storage unit 132[G][X] by use of the reliability monitor 142, as disclosed above. The high error-rate storage unit 132[G][X] may be identified in response to servicing a storage request of a client 107 (e.g., a request to read data stored on storage unit 132[G][X]), a test operation performed by the reliability monitor 142, and/or the like. The reliability monitor 142 may identify the high error-rate storage unit 132[G][X] based on one or more of: a) errors corrected in data read from the storage unit 132[G][X] (by use of the error management module 118 and/or ECC read module 117), b) errors detected in data read from the storage unit 132[G][X], c) an ECC decode failure, d) parity reconstruction operation (s) performed to recover data stored in storage unit 132[G][X], and/or the like. Alternatively, or in addition, identifying the high error-rate storage unit 132[G][X] may comprise determining that the error rate of the storage unit 132[G][X] will exceed E_High (or another threshold) within the ΔT_High threshold. Accordingly, identifying the high error-rate storage unit 132[G][X] may comprise calculating an error rate and/or reliability projection for the storage unit 132[G][X] and/or storage division 134G, as disclosed herein (e.g., by use of a selective reliability model (Mi_select) corresponding to the storage unit 132).

In response to identifying the high error-rate storage unit 132[G][X], the reliability manager 140 may determine whether to implement an adaptive relocation operation on the storage division 134G, such as a selective relocation operation. As disclosed herein, a selective relocation, refresh, and/or GC operation refers to an operation to a) relocate data from a selected subset of the storage unit(s) 132 within the storage division 134G (by use of the data relocation module 147), and to b) defer and/or delay a full refresh and/or GC operation on the storage division 134G until a later time (e.g., until a scheduled refresh operation, until ΔT_Remain, and/or the like). Accordingly, a selective relocation operation may comprise a) relocating data from high error storage unit(s) 132 within the storage division 134G, and b) retaining data stored on other storage unit(s) 132 within the storage division 134G. In the FIG. 1G embodiment, a selective relocation operation may comprise: a) relocating data stored within storage location 132[G][X], and b) postponing full refresh of the storage division 134G by, inter alia, maintaining data stored in other storage units 133 on the storage division 134G. As used herein, "maintaining" and/or "retaining" data stored in a storage unit 132 refers to continued use of the storage unit 132 to store data pertaining to a particular LID of the logical address space 121, such that requests to read data of the particular LID are serviced by, inter alia, accessing data stored on the particular storage unit 132. As used herein, "refreshing data" refers to rewriting data stored within a particular storage unit 132, and "relocating data" refers to writing data stored on a particular storage unit 132 (e.g., storage unit 132[G][X]) to another storage unit 132. Data that is being relocated may be bound to one or more LIDs of the logical address space 121 (and/or one or more intermediate and/or virtual identifiers). Relocating data may, therefore, comprise updating logical-to-physical translation information corresponding to the relocated data by a) associating the LID(s) and/or intermediate identifiers with the relocated data (e.g., in the forward map 125) and/or b) invalidating the storage unit(s) 132 from which the data was relocated (e.g., the high-error storage unit 132[G][X]).

As disclosed above, the high-error storage unit 132[G][X] may be identified in response to a read operation on the storage unit 132[G][X]. The storage module 110 may be configured to cache the data read from the storage unit 132[G][X] in response to determining that the storage unit 132[G][X] is exhibiting high error rate(s) and/or reduced reliability. The storage module 110 may cache the data in volatile memory resources 102 of the computing system 100 and/or another storage location. Relocating the data stored in the storage unit 132[G][X] may comprise writing the cached data read from the storage unit 132[G][X] as opposed to re-reading the storage unit 132[G][X].

As illustrated in FIG. 1G, storage unit 132[G][1] may comprise data that is mapped to LID A in the forward map 125, and the data stored in storage unit 132[G][X] may be associated with LID Q. Selectively relocating data from the storage division 134G may comprise relocating the data stored in storage unit 132[G][X] to another storage division 134. The data may be relocated by use of the relocation module 147 by, inter alia, appending the data at a current append point 160. In the FIG. 1G embodiment, the data of storage unit 132[G][X] is relocated to storage unit 132[Y][C] within storage division 134Y. Relocating the data may further comprise updating storage metadata 124 by, inter alia, associating LID Q with the storage unit 132[Y][C] of the relocated data in the forward map 125 and/or recording that the storage unit 132[G][X] comprises invalid data in the validity map 127 (validity bitmap 128G). By contrast, a full refresh operation on the storage division 134G may comprise relocating a much larger amount the data stored in the high-error storage unit 132[G][X] and the data stored in the other storage units 132[G][1]-132[G][P].

As disclosed above, the log storage module 150 may be configured to store data segments within respective log entries 152. A log entry 152 may span two or more storage units 132. Similarly, an ECC codeword may span two or more storage units 132. Selectively refreshing the storage division 134G may comprise relocating data such that relationships between log entries 152 and/or ECC codewords are maintained. In an alternative embodiment, the LID Q may be associated with data stored in storage unit 132[G][X] and 132[G][X+1]. A selective refresh operation to relocate data stored in storage unit 132[G][X] may, therefore, comprise relocating data stored in both storage units 132[G][X] and 132[G][X+1].

In response to detecting the high-error storage unit 132X, the reliability manager 140 may determine whether to implement a selective refresh operation on the corresponding storage division 134G as opposed to a full refresh and/or GC operation. A selective refresh operation may involve reprogramming significantly less data to the storage medium 130 as compared to a full refresh and/or GC operation. The reliability manager 140 may determine whether to implement a selective refresh operation based on a refresh policy and/or selective refresh criterion based on, inter alia, reliability characteristics of the storage division 134G, such as the remaining time to refresh (ΔT_Remain) for the storage division 134G, error rate and/or reliability characteristics of the storage division 134G, selective error rate and/or reliability characteristics of the storage division 134G (e.g., error rate and/or reliability characteristics of storage units 133, excluding storage unit 132[G][X]), error rate and/or reliability projections for the storage division 134G, selective error rate and/or reliability projections, and/or the like.

In some embodiments, the reliability manager 140 implements a selective refresh operation on a storage division 134 based on a remaining time to refresh (ΔT_Remain) of the storage division. The reliability manager 140 may selectively refresh portions of a storage division 134 and/or postpone a full refresh and/or GC operation on the storage division 134 in response to determining that the remaining data retention time is greater than or equal to a selective refresh time threshold (ΔT_SelectTH), such that ΔT_Remain≥ΔT_SelectTH.

The reliability manager 140 may determine the remaining time to refresh (ΔT_Remain) of by storage division 134 by use of the retention manager 146. As disclosed above, the remaining time to refresh (ΔT_Remain) of a storage division 134, such as storage division 134G of FIG. 1G, may correspond to: the elapsed data retention time (ΔT) of the storage division 134G and the refresh period (ΔT_Ref) for the storage division 134G (e.g., ΔT_Remain=ΔT_Ref−ΔT), the elapsed data retention time (ΔT) of the storage division 134G and the maximum data retention time for the storage division 134G (e.g., ΔT_Remain=ΔT_MAX−ΔT), current and/or updated reliability characteristics of the storage division 134G, current and/or updated reliability model (Mi_curr) corresponding to the storage division 134G, such that Mi_curr(ΔT_Remain)≤E_TH, a current and/or updated selective reliability model (Mi_select_curr) corresponding to the storage division 134G, such that Mi_select_curr (ΔT_Remain)≤E_TH, and/or the like. Accordingly, in some embodiments, determining whether to implement a selective refresh operation on the storage division 134G may comprise accessing reliability metrics corresponding to the storage division 134G, which may include selective reliability metrics of storage units 132 within the storage division 134G, excluding the high-error storage unit(s) 132[G][X]. In the FIG. 1G embodiment, the reliability manager 140 may access current and/or updated reliability characteristics for storage units 133 by, inter alia, accessing reliability information pertaining to the storage units 133 in the reliability metadata 144 (e.g., corresponding to previously implemented storage request and/or test operations), performing test read operations on the storage units 133 by use of the reliability monitor 142, and/or the like. The reliability manager 140 may determine a selective reliability metric and/or model for the storage division 134G based on, inter alia, the error rate of test storage operations performed on the storage units 133. The reliability manager 140 may be further configured to determine a selective time to refresh (ΔT_Remain) for the storage division 134G based on the selective reliability metrics and/or model, as disclosed herein.

Figure 2A:
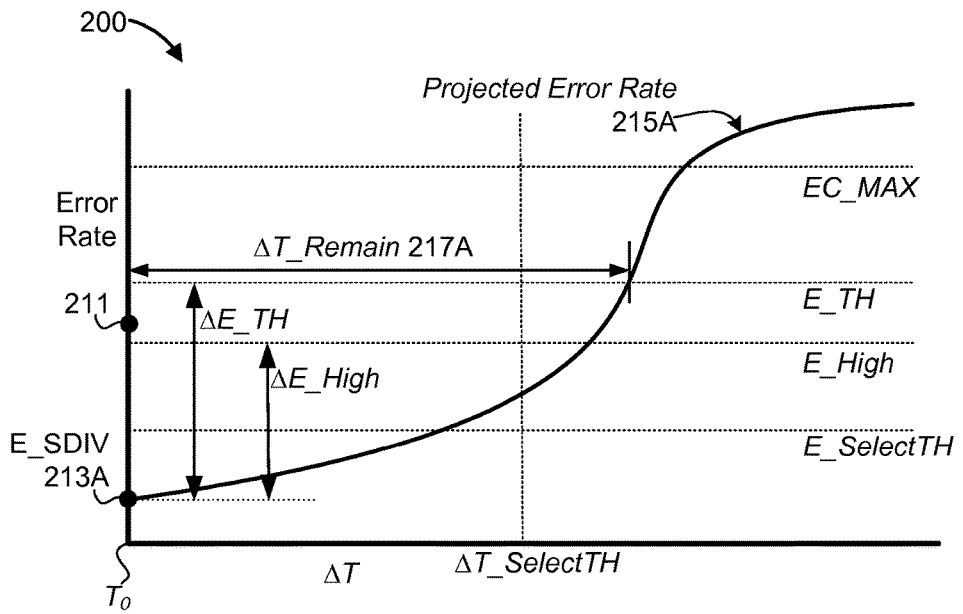
FIG. 2A depicts a plot comprising information that may be used to determine whether to implement a selective refresh operation on a storage division.

FIG. 2A is a plot diagram 200 that depicts information the reliability manager 140 may be configured to use to determine whether to selectively refresh a storage division 134, as disclosed herein. The plot 200 includes an error rate axis and a time axis. The plot 200 depicts the E_High, E_TH, and EC_MAX thresholds disclosed herein. As illustrated in FIG. 2A, the E_High threshold may be lower than the E_TH and ECC correction threshold EC_MAX.

The point 211 on the error rate axis corresponds to the error rate of a high error-rate storage unit 132. As disclosed herein, a high error-rate storage unit 132 refers to a storage unit having an error rate that exceeds an E_High threshold. FIG. 2A further depicts a storage division error rate (E_SDIV) 213A and error rate projection 215A. The storage division error rate (E_SDIV) 213A corresponds to an overall error rate for the storage division 134 comprising the high error-rate storage unit 132. In some embodiments, E_SDIV 213A may exclude the reliability metrics and/or error rate of the high error-rate storage unit 132. The error rate projection 215A illustrates the projected error rate of the storage division 134 as a function of data retention time (ΔT).

The storage division error rate (E_SDIV) 213A may be determined by use of reliability metadata 144 pertaining to the storage division 134, an error rate model and/or projection, test scan operations (e.g., a reliability scan of the storage division 134), and/or the like. Accordingly, determining E_SDIV 213A may comprise accessing reliability metadata 144 pertaining to the storage division 134 (e.g., error rates of other operations on the storage division 134), performing a reliability scan on portions of the storage division 134, calculating an error-rate projection the storage division 134, combining reliability and/or error-rate metrics of portions of the storage division 134, and/or the like.

In some embodiments, the reliability module 140 determines the storage division error rate (E_SDIV) 213A based on the error rates of read operations performed on the storage division 134 before detection of the high error-rate storage unit(s) 132 (e.g., operations performed before $T_0$). Such operations may include, but are not limited to: test read operations performed by the reliability monitor 142, read operations performed in response to read requests, read operations performed on other storage divisions 134, write operations performed within the storage division 134, and/or the like. Accordingly, determining E_SDIV 213A may include interpolating reliability and/or error metrics of storage operations performed before $T_0$ to the current time by use of, inter alia, a reliability and/or error rate model ($M_t$) for the storage division 134.

Alternatively, or in addition, the reliability monitor 140 may be configured to determine the E_SDIV 213A for the storage division 134, inter alia, performing a reliability scan on portions of the storage division 134. The reliability monitor 140 may be configured to perform a partial reliability scan on the storage medium 134. As used herein, a "partial reliability scan" refers to a reliability scan on some, but not all of the storage unit(s) 132 and/or physical addresses of the storage division 134. The error rate of the storage division 134 (E_SDIV) 213A may be based on reliability metrics and/or error rates observed in the partial reliability scan.

In some embodiments, the reliability module 140 is configured to determine the E_SDIV 213A for the storage division 134 by use of, inter alia, a selective reliability scan. As used herein, a "selective reliability scan" refers to a reliability scan on selected storage unit(s) 132 and/or physical addresses of a storage division 134. The storage unit(s) 132 may be selected based on a selection criteria. The storage unit(s) 132 may be selected to exclude high error-rate storage unit(s) 132 identified within the storage division 134. Alternatively, or in addition, the storage unit(s) 132 may be selected to ensure full coverage of the storage division 134 and/or test particular sections and/or regions of the storage division 134. A selective reliability scan on the storage division 134 may comprise: a) performing test read operations on selected storage unit(s) 132 within the storage division 134, b) determining reliability metric(s) and/or error rate(s) of the test read operations, and/or c) calculating a current storage division reliability metric 213A (E_DIV) based on the determined error rate(s).

As disclosed herein, a test read operation may comprise reading data from one or more storage unit(s) 132, and determining reliability characteristics of the read operation (e.g., by use of the reliability monitor 142). Determining the reliability characteristics of a read operation may comprise determining what, if any, error mitigation operations were used to read the data, including, but not limited to: errors detected and/or corrected by use of an ECC encoding of the data, errors detected and/or corrected by use of media tuning, errors detected and/or corrected by use of parity substitution, error detected and/or corrected by use of data redundancy, and/or the like.

The reliability manager 140 may be configured to calculate the E_SDIV 213A for the storage division 134 by, inter alia, combining and/or aggregating the reliability metric(s) and/or error rate(s) of the different storage unit(s) 132 and/or physical addresses of the storage division 134, which may include, but is not limited to: a) calculating an average reliability metric and/or error rate, b) calculating a mean reliability metric and/or error rate, c) statistical modeling (e.g., calculating a normal distribution of the reliability metrics and/or error rate(s), d) selecting a "worst" reliability metric and/or error rate within the storage division 134, and/or the like. The worst case reliability metric may correspond to the lowest reliability metric observed within the storage division 134 (excluding the high error-rate storage unit(s) 132), the worst case error rate may correspond to the highest error rate observed within the storage division 134 (excluding the high error-rate storage unit(s) 132).

The error rate projection 215A depicted in FIG. 2A illustrates an error rate projection for the storage division 134. As disclosed above, the error rate projection 215A may indicate the projected error rate of the storage unit(s) 132 within the storage division 134 as a function of data retention time (ΔT). The error rate projection 215A may exclude error metrics (and/or corresponding error rate projections) of the high-rate storage units 132 identified within the storage division 134. The error rate projection 215A may be based on error rate of the storage division 134 (e.g., E_SDIV 213A). As disclosed above, in some embodiments, E_SDIV 213A is based on current reliability characteristics of a selected set of storage unit(s) 132 within the storage division 134 (determined by a selective reliability scan of the storage division 134). Accordingly, in some embodiments, the error rate projection 215A corresponds to a selective, current error rate projection for the storage division 134 (e.g., Mi_select_curr). Alternatively, the error rate projection 215A may be based on reliability characteristics pertaining to the storage division maintained in the reliability metadata 144, as disclosed herein.

As disclosed above, the reliability manager 140 may determine whether to perform a selective refresh operation on the storage division 134 based on the remaining data retention time (ΔT_Remain) of the storage division 134. As illustrated in FIG. 2A, the remaining data retention time (ΔT_Remain) 217 may correspond to time duration (ΔT) at which the error rate projection for the storage division exceeds E_TH. The reliability manager 134 may determine to implement a selective refresh operation when the determined ΔT_Remain value 217 exceeds ΔT_SelectTH. In the FIG. 2A embodiment, ΔT_Remain 217 exceeds ΔT_SelectTH (e.g., the error rate projection for the storage division 134 does not exceed E_TH until after ΔT_SelectTH) and, as such, the reliability manager 140 may determine to perform a selective operation on the storage division 134 rather than a full data relocation, refresh, and/or GC operation.

In some embodiments, the reliability manager 140 may determine whether to perform a selective refresh operation on the storage division 134 based on the current reliability characteristics of the storage division 134 (e.g., without modeling and/or projecting the error rate of the storage division 134). Alternatively, or in addition, the reliability manager 140 may implement a selective refresh operation on the storage division 134 in response to determining that the error rate of the storage division E_SDIV 213A is less than, or equal to, a particular threshold (E_SelectTH). In the FIG. 2A embodiment, E_SDIV 213A is less than E_SelectTH and, as such, the reliability manager 140 may determine to implement a selective refresh operation on the storage division 134. Alternatively, or in addition, the reliability manager 140 may determine whether to implement a selective refresh operation on the storage division 134 based on a difference between the storage division error rate 213A (E_SDIV) and one or more other thresholds (e.g. E_High, E_TH, and/or the like). In the FIG. 2A embodiment ΔE_TH and ΔE_High quantify the difference between the current error rate of the storage division 134 and the E_TH and ΔE_High thresholds, respectively. The reliability manager 140 may implement a selective refresh on the storage division 134 in response to determining that ΔE_TH and/or ΔE_High exceed a threshold. In the FIG. 2A embodiment, the reliability manager 140 may be configured to implement a selective relocation operation in response to determining that ΔE_TH is greater than or equal to a threshold value (E_DIFF_TH), such that ΔE_TH≥E_DIFF_TH or (E_TH–E_SDIV)≥E_DIFF_TH.

As disclosed above, in some embodiments, the reliability manager 140 is configured to perform a reliability scan on the storage division 134 in response to detecting a high error-rate storage unit 132 therein (e.g., to calculate a storage division error rate E_SDIV for the storage division, such as E_SDIV 213A of FIG. 2A). The reliability scan may comprise performing test read operations on selected storage unit(s) 132 and/or physical addresses within the storage division 134, determining reliability characteristics and/or error rates of the test read operations, and using the reliability characteristics and/or error rates to determine the storage division error rate (E_SDIV). Performing the reliability scan may result in identifying additional high error-rate storage unit(s) 132 within the storage division 134 (e.g., identifying storage unit(s) 132 and/or physical addresses having an error rate that exceeds E_TH). The reliability manager 140 may include additional high error storage unit(s) 132 (if any) in the corresponding selective relocation operation. The reliability manager 140 may be further configured to determine whether to implement a selective relocation operation on the storage division 134 based on, inter alia, the number of high error-rate storage units 132 within the storage division 134. The reliability manager 140 may be configured to perform a selective data relocation operation if the number of high error-rate storage units 132 within the storage division 134 is less than a threshold.

Figure 2B:
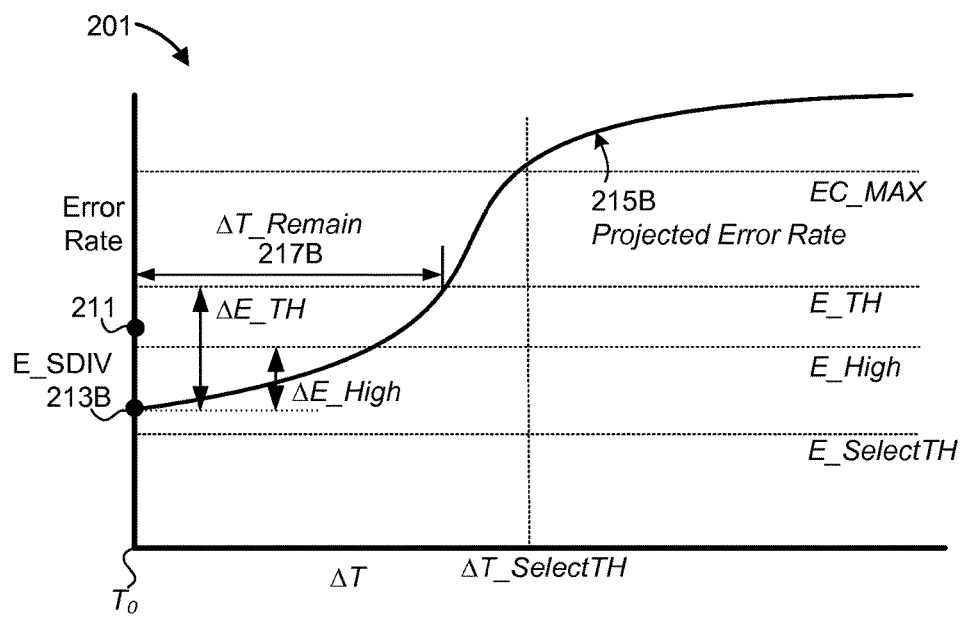
FIG. 2B depicts another plot comprising information that may be used to determine whether to implement a selective refresh operation on a storage division.

FIG. 2B is another embodiment of a plot diagram 201 comprising information the reliability manager 140 may be configured to use to determine whether to selectively refresh a storage division 134. In the FIG. 2B embodiment, the storage division 134 comprising the high error-rate storage unit 132 may have different reliability characteristics (e.g., a higher error rate) than the storage division 134 of FIG. 2A, which may be due to, inter alia, data stagnation issues, wear levels, media characteristics, and/or the like, as disclosed herein. Accordingly, the storage division error rate E_SDIV 213B of plot diagram 201 may be higher than the storage division error rate E_SDIV 213A of plot diagram 200. The storage division error rage E_SDIV 213B may be calculated by the reliability manager 140, as disclosed above. Moreover, the error rate of the storage division 134 may be projected to increase at a different rate than in FIG. 2A, based on different error rate modeling and/or projection characteristics of the storage division 134, as disclosed herein.

As illustrated in FIG. 2B, the error rate projection 215B for the storage division 134 may exceed E_TH before ΔT_SelectTH (e.g., ΔT_Remain is less than ΔT_SelectTH). Therefore, the remaining data retention time of the storage division 214 does not satisfy the ΔT_SelectTH and the reliability manager 140 may determine to not implement a selective relocation operation on the storage division 134. The reliability manager 140 may, therefore, be configured to implement a full relocation, refresh, and GC operation on the storage division 134, as disclosed herein. In another embodiment, the reliability manager 140 determines whether to implement a selective relocation operation on the storage division 134 based on the storage division error rate E_SDIV 213B (e.g., independent of error rate and/or reliability projections). As illustrated in FIG. 2B, the E_SDIV 213B value exceeds the E_SelectTH threshold and, as such, the storage division 134 may be disqualified from selective relocation. FIG. 2B also shows ΔE_TH and ΔE_High values corresponding to smaller differences between the current error rate of the storage division 134 and the E_TH and ΔE_High thresholds (e.g., do not satisfy the E_DIFF_TH threshold, disclosed above).

As disclosed above, the reliability manager 140 may be configured to determine a storage division error rate (E_SDIV) for a storage division 134 in response to detecting a high error-rate storage unit 132 therein. Determining the E_SDIV may comprise performing a reliability scan of the storage division 134 by use of, inter alia, the reliability monitor 142. The reliability scan may comprise a selective reliability scan of selected storage unit(s) 132 and/or physical addresses within the storage division 134. Storage unit(s) 132 may be selected for reliability scanning based on a particular selection criterion. As disclosed above, the selective reliability scan may be configured to exclude identified high error-rate storage unit(s) 132. The reliability scan may be configured to perform test read operations within particular sections and/or regions of the storage division 134.

Figure 2C:
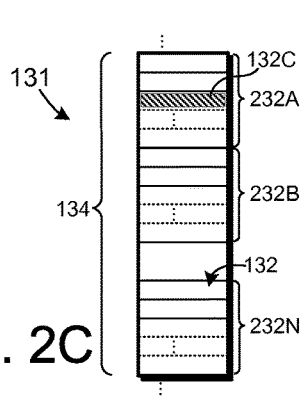
FIG. 2C depicts embodiments of reliability scan operations within a storage division.

FIG. 2C depicts embodiments of reliability scans within a storage division 134. In the FIG. 2C embodiment, the storage units 132 of the storage division 134 are grouped into respective regions 232A-N. In some embodiments, the regions 232A-N are defined arbitrarily within the storage address space 131 of the storage division 134. Alternatively, the regions 232A-N may be defined to group storage unit(s) 132 determined to have interrelated reliability characteristics, such that the reliability characteristics of a particular storage unit 132 within a particular region 232A-N is indicative of the reliability characteristics of other storage unit(s) 132 within the particular region 232A-N. The regions 232A-N may, for example, share characteristics pertaining to charge loss, charge gain, read disturb, write disturb, erase disturb, wear sensitivity, and/or the like. The regions 232A-N may be defined on the basis of information pertaining to the manufacturer and/or fabrication of the storage medium 130. Alternatively, or in addition, the regions 232A-N may be identified based on observed and/or measured reliability and/or error rate characteristics of storage units 132 within the storage division 134 (e.g., by testing and experience). Although the regions 232A-N are depicted as contiguous regions within the storage division 134, the disclosure is not limited in this regard, and could be adapted to designate regions 232A-N comprising any suitable collection, set, and/or group of one or more storage units 132. The regions 232A-N may vary in size (e.g., may comprise different numbers of storage units 132) and/or may be disjoint with respect to the storage address space 131.

The reliability manager 140 may adapt reliability management operations, such as selective relocation, in accordance with the regions 232A-N within the storage division 134. In the FIG. 2C embodiment, the reliability manager 140 may identify a high error-rate storage unit 132C within a particular region 232A. The high error-rate storage unit 132C may be identified in one or more of a reliability scan (e.g., test read operation), an operation to service a storage request, and/or the like. In response to detecting the high error-rate storage unit 132C, the reliability manager 140 may determine whether to perform a selective relocation operation on the storage division 134. The selective relocation operation may comprise relocating data from the high error-rate storage division 132C, while retaining data stored on other storage units 132 within the storage division 134.

As disclosed herein, the regions 232A-N within the storage division 134 may identify storage units 132 determined to have similar and/or related reliability characteristics. The reliability manager 140 may adapt the selective relocation operation based on the regions 232A-N. In some embodiments, the reliability manager 140 is configured to infer that other storage units 132 in the same region 232A as the high error-rate storage unit 132C are likely to also exhibit high error rates. Therefore, the selective relocation operation implemented by the reliability manager 140 may comprise relocating data from other storage units 132 within the region 232A comprising the high error-rate storage unit 132C. The other storage units 132 in the region 232A may be designated for relocation without performing test scan operation(s) within the region 232A and/or regardless of reliability characteristics pertaining to the other storage units 132 in the region 232A in the reliability metadata 144.

The reliability manager 140 may be further configured to determine the error rate of the storage division 134 based on, inter alia, the regions 232A-N within the storage division 134. As disclosed above, the reliability manager 140 may be configured to determine a storage division error rate (E_SDIV), and may use the E_SDIV to determine whether to implement a selective relocation operation on the storage division 134 (as opposed to a full relocation, refresh, and/or GC operation). Determining the E_SDIV of the storage division 134 may comprise performing a selective reliability scan of the storage division 134. In some embodiments, the selective reliability scan comprises scanning at least one storage unit 132 within each of the regions 232A-N within the storage division 134. Since storage units 132 within the respective regions 232A-N share common reliability and/or error rate characteristics, scanning selected storage unit(s) 132 within each region 232A-N may ensure that the resulting E_SDIV value accurately reflects the error rate of the storage division 134, without the need for scanning each and every storage unit 132 within the storage division 134. The selective reliability scan disclosed above may be further configured to exclude scan operations on storage unit(s) 132 region(s) 232A-N comprising high error-rate storage units 132 (e.g., may exclude test read operations within the region 232A comprising high error-rate storage unit 132C).

In some embodiments, the selective reliability scan is configured to normalize reliability metrics and/or error rate information within the respective regions 232A-N in order to, inter alia, prevent reliability metrics and/or error rate information from a particular region 232A-N from being more heavily weighted in the overall E_SDIV of the storage division 134. In one embodiment, the selective reliability scan performs N test read operations (and acquires corresponding reliability metrics and/or error rate(s)) within each tested region 232A-N. In another embodiment, the reliability scan distributes test read operations randomly (and/or pseudo randomly) within the storage address space 131 of the storage division 134. Calculating the storage division error rate E_SDIV may comprise normalizing the reliability metrics and/or error rates of the test read operations by region, such that the contribution of each test read operation to the E_SDIV value is weighted and/or normalized according to the number of test read operations performed within the respective regions 232A-N (e.g., the contribution of a particular test read operation to the E_SDIV value may be scaled by 1/M where M is the number of test read operations performed within the respective region 232A-N).

Although particular embodiments for adapting storage management operations in accordance with storage unit interdependencies are described herein (e.g., regions 232A-N), the disclosure is not limited in this regard, and could be adapted according to any suitable mechanism for designating and/or inferring relationships in the reliability characteristics of the storage unit(s) 132 within a particular storage division 134 (and/or between storage divisions 134).

Figure 2D:
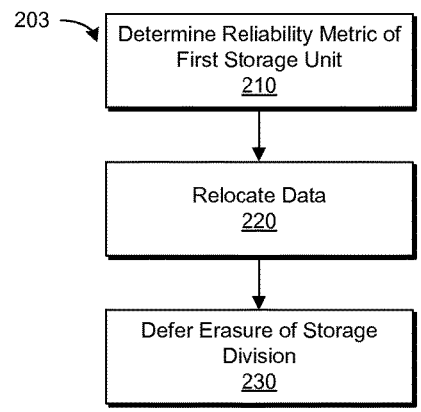
FIG. 2D is a flow diagram of one embodiment of a method for adaptive storage reliability management.

FIG. 2D is a flow diagram of one embodiment of a method 203 for adaptive storage reliability management. Step 210 may comprise determining a reliability metric pertaining to a first storage unit 132 within a particular storage division 134 that comprises a plurality of storage units 132 (e.g., erase division, erase block, logical erase block, and/or the like). Step 210 may, therefore, comprise determining the reliability metric associated with a particular storage address and/or offset within a particular storage division 134. Step 210 may comprise monitoring error rates of storage operations performed on the storage medium 130, b) performing test storage operations on portions of the storage medium 130 (e.g., a reliability scan), c) detecting error correction operations implemented by the media controller 113 and/or error management module 118 (e.g., ECC corrections, parity substitution, media tuning, and/or the like), d) identifying storage operation failures (e.g., uncorrectable errors, EIO, part failures, and/or the like), and so on, as disclosed herein. In some embodiments, step 210 comprises performing a reliability scan configured to test portions of the storage address space 131 of the storage medium 130. The reliability scan of step 210 may comprise performing test read operations to storage addresses within the storage address space 131. Step 210 may further comprise maintaining reliability metadata comprising reliability information pertaining to storage units 132 and/or storage divisions 134 of the storage medium 130.

Step 220 may comprise relocating data stored on the first storage unit 132. Step 220 may comprise writing the data stored on the first storage unit 132 to another storage division 134 of the storage medium 130 by, inter alia, appending the data at an append point 160 of a storage log 151. Relocating the data at step 220 may further comprise mapping a LID of a logical address space 121 to the relocated data and/or recording that data stored on the first storage unit 132 is invalid.

Step 220 may be performed in response to determining that an error rate of a storage operation performed on the first storage unit 132 exceeds an error threshold (E_High) and/or determining that the error rate of the first storage unit 132 will exceed the error threshold (E_High) within a particular time period (e.g., within $\Delta T\_High$). The error rate of the first storage unit 132 may correspond to a BER and/or RBER of a read operation on the storage first storage unit 132. The BER and/or RBER may correspond to the number of errors detected and/or corrected by use of ECC information stored on the first storage unit 132 (e.g., errors corrected by the error management module 118, as disclosed herein). Step 220 may, therefore, comprise accessing error detection and/or correction pertaining to the read operation and/or receiving a notification pertaining to the error rate for the first storage division 132 from the media controller 113.

Step 230 may comprise deferring erasure of the storage division comprising the first storage unit 132. Step 230 may, therefore, comprise relocating data from the first storage unit 132 without relocating data from other storage units 132 within the storage division 134 (e.g., deferring a full refresh and/or GC operation on the storage division 134). Step 230 may further comprise maintaining data stored on other storage units 132 within the storage division 134 by, inter alia, retaining mappings between LIDs of the logical address space 121 and the storage units 132 in the forward map 125. Accordingly, data stored in the other storage units 132 of the storage division 134 may continue being used to service read requests from storage clients 107.

Step 230 may further include determining to implement a selective refresh of the storage division 134 comprising the first storage unit 132 as opposed to a full refresh and/or GC operation. In some embodiments, determining to implement a selective refresh comprises determining that the remaining time to refresh and/or remaining retention time ($\Delta T\_Remain$) of the storage division 134 exceeds a selective refresh time threshold ($\Delta T\_SelectTH$). Step 230 may, therefore, comprise calculating the remaining retention time ($\Delta T\_Remain$) for the storage division 134. In some embodiments, step 230 includes determining the remaining time to refresh and/or data retention time ($\Delta T\_Remain$) of the storage division 134 by use of a reliability model comprising current and/or selective reliability characteristics (e.g., $Mi\_curr(\Delta T\_Remain) \leq E\_TH$ and/or $Mi\_select\_curr(\Delta T\_Remain) \leq E\_TH$).

Alternatively, or in addition, step 230 may comprise determining to implement a selective relocation operation based on the storage division error rate (E_SDIV) of the storage division 134. Accordingly, step 230 may include performing a reliability scan on the storage division 134, such as a selective reliability scan, as disclosed herein. Step 230 may further comprise determining an error rate projection for the storage division 134 based on the storage division error rate (E_SDIV) and/or an error rate model for the storage division 134 (e.g. Mi_select_curr). In some embodiments, the data relocated in the selective relocation operation and/or the storage unit(s) 132 selected for the test read operations of the selective reliability scan may be adapted according to one or more regions 232A-N of the storage division 134, as disclosed herein.

Step 230 may include placing the storage division 134 in a reliability queue 145 based on, inter alia, the updated and/or selective reliability metrics, the determined remaining retention time ($\Delta T\_Remain$) of the storage division 134, and/or the like.

In some embodiments, step 230 further comprises implementing a full refresh and/or GC operation on the storage division 134 on or before the determined remaining data retention time ($\Delta T\_Remain$). As disclosed herein, a full refresh operation may comprise a) relocating data stored on the storage division 134 (e.g., appending the data at the head 161 of the storage log 151), b) updating mappings between LIDs of the logical address space 121 and the relocated data, and/or c) initializing the storage division 134. The refresh operation may further comprise making the storage division 134 available to store data by, inter alia, placing the initialized storage division 134 into a write queue 154 of the log storage module 150. A GC operation may comprise a) identifying valid data stored on the storage division 134 (by use of the storage metadata 124), b) relocating the identified valid data, c) updating mappings between LIDs of the logical address space 121 and the relocated data, and/or d) initializing the storage division 134.

Figure 3:
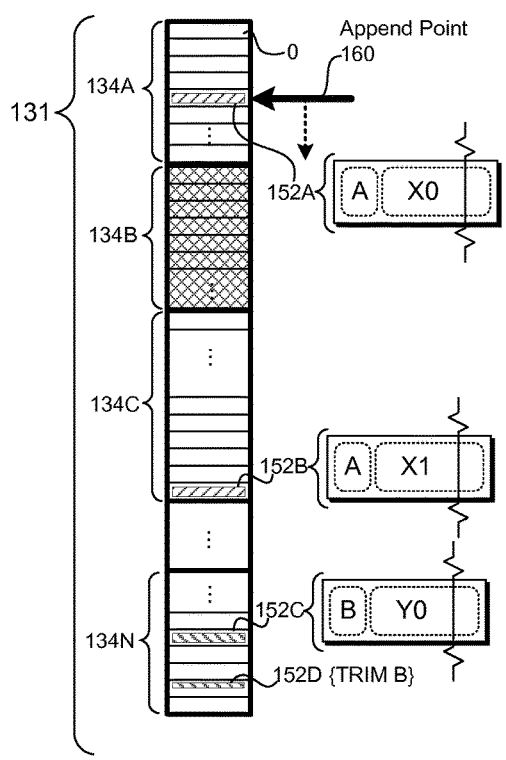
FIG. 3 depicts embodiments of log storage operations.
Figure 3:
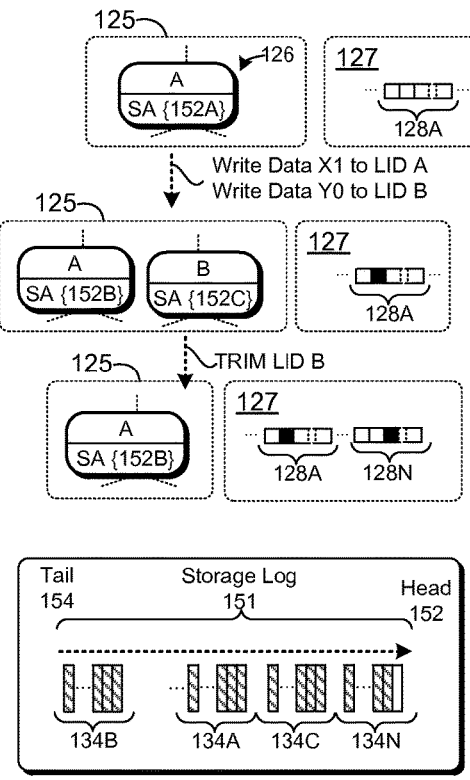

As disclosed herein, implementing log storage operations on the storage medium 130 may result in retaining invalid data on the storage medium 130. FIG. 3 depicts further embodiments of log storage operations implemented by the storage module 110. As disclosed above, the storage address space 131 comprises a plurality of storage divisions 134A-N (e.g., erase blocks, erase divisions, logical storage divisions, and/or the like), each of which can be initialized for use for storing data. The storage divisions 134A-N may comprise respective storage units 132, which may correspond to pages, logical pages, and/or the like. The storage units 132 may be assigned respective storage addresses within a storage address space 131 of the storage medium 130 (e.g., storage address 0 to storage address N).

The log storage module 150 may be configured to store data sequentially at an append point 160 within the storage address space 131. In the FIG. 3 embodiment, data (log entries 152) may be appended sequentially at append point 160 within the storage division 134A and, when the storage units 132 therein are filled, the log storage module 150 advances the append point 160 to a next available storage division 134. As used herein, an "available" storage division 134 refers to a storage division that has been initialized and has not yet been programmed (e.g., has been erased). Accordingly, an available storage division 134 may refer to a storage division 134 that is in an initialized (or erased) state. The log storage module 150 may select the next available storage division 134 from a write queue 154, as disclosed above.

In the FIG. 3 embodiment, the storage division 134B may be unavailable for storage due to, inter alia, not being in an writeable state (e.g., may comprise valid data), being out-of-service due to high error rates, and/or the like. Therefore, after writing data to the storage unit 134A, the log storage module 150 may advance the append point 160 to storage division 134C. The log storage module 150 may sequentially append data (log entries 152) the storage units 132 of storage division 134C, at which point the append point 160 is advanced to next available storage division 134, as disclosed herein. After filling storage division 134N, the log storage module 150 may advance the append point 160 by wrapping back to the first storage division 134A (or the next available storage division 134, if storage division 134A is unavailable). Accordingly, the log storage module 150 may treat the storage address space 131 as a loop or cycle.

As illustrated in FIG. 3, the storage log 151 may comprise a log entry 152A (data packet 155) comprising a data segment X0 that is mapped to LID A (by use of persistent metadata 157 and/or the forward map 125). The forward map 125 may comprise an entry 126 that associates LID A with the storage address comprising the data segment X0. Similarly, the validity bitmap 128A corresponding to the storage division 134A may indicate that the log entry 152A (data packet 155) comprising data X0 is valid.

As illustrated in FIG. 3, the storage module 110 may receive a request to write data X1 to LID A. In response, the log storage module 150 may modify and/or overwrite LID A with data X1. The log storage module 150 may perform the write operation out-of-place by appending a new log entry 152B comprising the data segment X1 to the storage log 151. The log storage operation may further comprise updating the storage metadata 124 to associate LID A with the storage address of the new log entry 152B and/or to invalidate the log entry 152A stored within storage division 134A. The validity index 127 may be updated to indicate that the log entry 152A is invalid (e.g., by updating validity bitmap 128A corresponding to the storage division 134A).

The storage module 110 may receive a request to write data Y0 to LID B. The log storage module 150 may service the request by appending a log entry 152C within storage division 134N comprising the data segment Y0 and/or persistent metadata 157 to associate data Y0 with LID B. The log storage module 150 may be further configured to update the forward map 125 to associate LID B with the storage address of the log entry 152C, as disclosed herein.

After writing data Y0 to LID B, the storage module 110 may receive a message that LID B is no longer in use (e.g., has been erased). The message may comprise a TRIM message, a TRIM request, a deallocation request, an unmap request, and/or the like. In response, the log storage module 150 may append a log entry 152D (a metadata entry 158) to record that LID B is no longer in use (and/or that invalidates the log entry 152C). Implementing the request may further comprise removing association(s) between LID B and the log entry 152C in the forward map 125 and/or updating the validity index 127 pertaining to storage division 134N (validity bitmap 128N) to indicate that the log entry 152C is invalid.

As disclosed above, the storage operations implemented by the log storage module 150 may form a storage log 151 on the storage medium 130. As illustrated in FIG. 3, the storage log 151 may comprise the ordered sequence of storage operations recorded by sequentially appending log entries 152 within the storage address space 131. Data most recently appended to the storage log 151 may correspond to the head 161 of the storage log 151 and older data may correspond to the tail 163 of the storage log 151. As disclosed herein, the order of the storage log 150 may be based on the order in which data was appended to the respective storage divisions 134A-N (e.g., as indicated by sequence information 159 of the respective storage divisions 134) and/or the relative order of data within the respective storage divisions 134. In the FIG. 3 embodiment, the log order 153 of the storage divisions 134A-N is 134N (head 161), 134C, 134A, through 134B (tail 163).

Portions of the storage metadata 124 may be maintained in volatile memory resources 102 of the computing system 100 and, as such, may be subject to loss and/or corruption. As disclosed above, the log storage module 150 may store data by use of log entries 152 that comprise persistent, crash-safe metadata pertaining to the storage log 151. The storage module 110 may be configured to reconstruct the storage metadata 124, including the forward map 125 and/or validity map 127, by use of the storage log 151 written to the storage medium 130 by the log storage module 150. In the FIG. 3 embodiment, the current version of the data associated with LID A may be determined based on the relative log order of log entries 152B and 152A. Since the log entry 152B comprising data segment X1 is closer to the head 161 of the storage log 151 than log entry 152A, the storage module 110 may determine that log entry 152B comprises the most recent, up-to-date version of the data corresponding to LID A. The storage layer 110 may reconstruct the forward map 125 to associate the LID A with log entry 152B, and to invalidate the log entry 152A. Similarly, the storage layer 110 may access log entry 152D to determine that LID B is unmapped and, in response, may ignore log entry 152C (e.g., omit LID B from the forward map 125 and/or record that the log entry 152C is invalid).

Performing storage operations out-of-place (e.g., appending data to a storage log 151) as disclosed herein may result in invalid data remaining on the storage medium 130. As illustrated in FIG. 3, modifying the data of LID A by appending the log entry 152B within storage division 134C as opposed to overwriting and/or modifying the log entry 152A in place results in retaining the obsolete log entry 152A (and data segment X0) on storage division 134A. The invalid data may not be immediately removed from the storage medium 130 since, as disclosed above, erasing the data segment X0 may involve erasing the entire storage division 134A and/or rewriting other data on the storage division 134A. Similarly, data that is no longer is use, such as the data of LID B, may not be immediately removed. As such, over time, the storage medium 130 may accumulate a significant amount of invalid data. Moreover, the log storage module 150 may require initialized storage divisions 134 to service requests to write data to the storage medium 130, preform data refresh operations, and/or GC operations, as disclosed herein.

Referring to FIG. 1A, as disclosed above, the storage module 110 may comprise a garbage collector 149 configured to recover storage resources on the storage medium 130 by, inter alia, a) selecting a storage division 134 for recovery, b) distinguishing invalid data from valid data stored on the selected storage division 134, c) relocating the valid data (if any), and d) initializing the storage division 134.

The garbage collector 149 may select the storage division 134 for recovery by use of a selection criterion and/or garbage collection policy, which may be based on one or more of: the remaining retention time ($\Delta T\_Remain$) of the storage divisions 134, the log order 153 of the storage divisions 134, the amount of invalid data stored on the storage divisions 134, reliability characteristics of the storage divisions 134, wear level(s) of the storage divisions 134, program/erase counts of the storage divisions 134, and/or the like. The retention time $\Delta T\_Remain$ of a storage division 134 may be determined by use of the retention manager 146, as disclosed herein. The log order 153 of a storage division 134 may be determined by reference to sequence information 159 associated with the storage division 134. In some embodiments, the garbage collector 149 is configured to select storage divisions 134 for recovery from the tail 163 of the storage log 151. Alternatively, or in addition, the garbage collector 149 may select storage divisions 134 for recovery based on an amount of invalid data stored on the storage divisions 134, and may prioritize recovery of storage divisions 134 that comprise a relatively large proportion of invalid data. Alternatively, or in addition, the garbage collector 149 may select storage divisions 134 for recovery based on reliability characteristics, such that storage divisions 134 exhibiting higher error rates and/or low remaining retention time ($\Delta T\_Remain$) are prioritized for GC operations. In some embodiments, the garbage collector 149 selects storage divisions 134 for recovery a reliability queue 145 maintained by the reliability manager 140, as disclosed herein.

The garbage collector 149 may identify valid data on the selected storage division 134 by use of the storage metadata 124 (e.g., forward map 125 and/or validity map 127). The garbage collector 149 may determine that storage units 132 that are referenced in the forward map 125 (e.g., are associated with LIDs of the logical address space 121) comprise valid data and that storage units 132 that do not exist in the forward map 125 comprise invalid data that does not need to be retained. Alternatively, or in addition, the garbage collector 149 may identify invalid data by use of a validity map 127 that identifies invalid data within the selected storage division 134. Relocating valid data may comprise a) reading log entries 152 from the storage division 134 and b) appending the log entries 152 at the data to the head 161 of the storage log 151 (e.g., appending the valid data at the append point 160 by use of the log storage module 150). Initializing the selected storage division 134 may comprise erasing the storage division 134, formatting the storage division 134, resetting the storage division 134, clearing the storage division 134, and/or the like. Initializing a storage division 134 may further comprise making the storage division 134 available for data storage, which may include, but is not limited to: recording that the storage division 134 has been initialized (in the storage metadata 124), placing the storage division 134 in a write queue 154 of the log storage module 150, and/or the like.

Referring to FIG. 3, a GC operation on storage division 134A may comprise a) distinguishing valid data stored on the storage division 134A (if any) from invalid data on the storage division 134A, such as log entry 152A (e.g., identified as invalid by use of the forward map 125 and/or validity bitmap 128A), b) relocating valid data stored on the storage division 134A (if any), and c) initializing the storage division 134A, as disclosed above. A GC operation on storage division 134C may comprise a) determining that log entry 152B is valid (by use of the forward map 125 and/or validity map 127C), b) relocating valid data stored on the storage division 134C (including log entry 152B), and/or c) initializing the storage division 134C, as disclosed herein.

As disclosed above, data stored on the storage divisions 134 may be subject to data stagnation errors, which may increase as a function of data retention time. The storage module 110 may comprise a refresh module 148 to implement data refresh operations on storage divisions 134 according to a particular refresh period and/or interval (e.g., $\Delta T\_Ref$). Alternatively, or in addition, data may be refreshed by the garbage collector 149. In some embodiments, the garbage collector 149 is configured to perform GC operations on storage divisions 134 according to the refresh period and/or interval (e.g., $\Delta T\_Ref$), disclosed herein, which may ensure, inter alia, that data does not become unreadable due to data stagnation, while providing write capacity for the log storage module 150.

Figure 4:
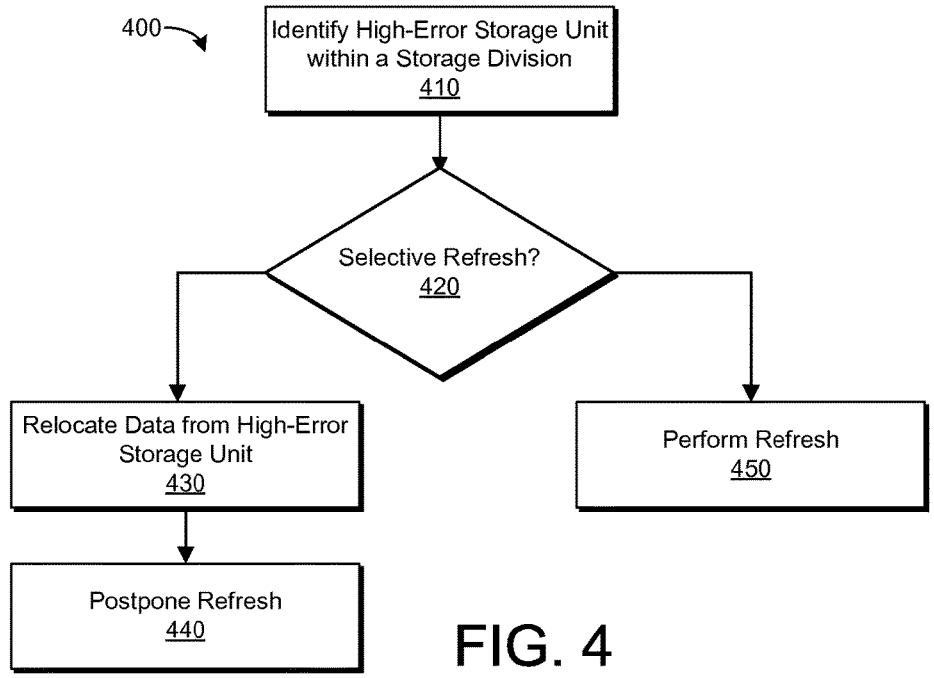
FIG. 4 is a flow diagram of another embodiment of a method for adaptive storage reliability management.

FIG. 4 is a flow diagram of another embodiment of a method 400 for adaptive storage reliability management. Step 410 may comprise identifying a high-error storage unit 132 within a storage division 134 (e.g., identifying storage unit 132[G][X] within storage division 134G), as disclosed herein.

Step 420 may comprise determining whether to implement a selective refresh operation on the storage division 134. As disclosed above, the determination of step 420 may comprise determining a remaining data retention time ($\Delta T\_Remain$) of the storage division 134, determining current and/or updated reliability metrics pertaining to the storage division 134, determining selective reliability metrics pertaining to the storage division 134, projecting the reliability and/or error rate of the storage division 134, and/or the like. In some embodiments, step 420 comprises determining to perform a selective refresh operation on the storage division 134 in response to one or more of: a remaining time to refresh and/or remaining data retention time ($\Delta T\_Remain$) satisfying a time threshold ($\Delta T\_SelectTH$), a reliability metric of the storage division 134 satisfying a threshold, an error rate of the storage division 134 satisfying a threshold, a current and/or updated reliability metric of other storage units 132 of the storage division satisfying a threshold, a reliability and/or error rate projection satisfying a threshold, and/or the like. The error rates and/or reliability metrics of step 420 may comprise selective error rates and/or reliability metrics, which, as disclosed above, may exclude error rate and/or reliability characteristics of the high-error rate storage unit(s) 132 identified in step 410.

Steps 430 and 440 may comprise implementing a selective refresh operation on the storage division 134 by relocating data from the high-error storage unit at step 430 and postponing a full refresh and/or GC operation on the storage division 134 at step 440. Step 440 may comprise retaining data stored on other storage units 132 of the storage division 134 by, inter alia, retaining mappings between the storage units 132 and the logical address space 121. Postponing the refresh and/or GC operation may comprise scheduling a full refresh and/or GC operation for the storage division 134, placing the storage division 134 into a reliability queue 145 based on the determined remaining data retention time (ΔT_Remain) and/or reliability characteristics, and/or the like.

Step 450 may comprise performing a full refresh of the storage division 134, which may include relocating data stored within the storage units 132 of the storage division 134, and initializing the storage division 134. The full refresh operation of step 450 may comprise a GC operation and may include identifying valid data stored on the storage division 134 (by use of the storage metadata 124), relocating the identified valid data, and allowing invalid data to be erased.

Figure 5:
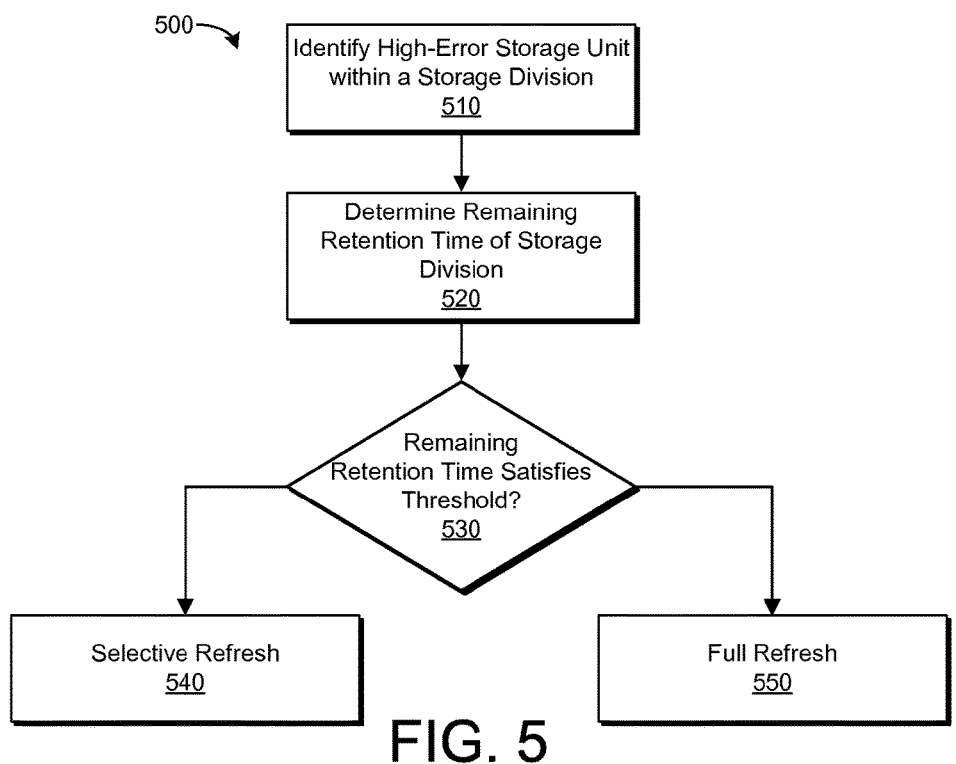
FIG. 5 is a flow diagram of another embodiment of a method for adaptive storage reliability management.

FIG. 5 is a flow diagram of another embodiment of a method 500 for adaptive storage reliability management. Step 510 may comprise identifying a high-error storage unit 132 within a storage division 134 by use of the reliability monitor 142, as disclosed herein. Step 520 may comprise calculating a remaining data retention time and/or time to refresh (ΔT_Remain) for the storage division 134 by use of the retention manager 146, as disclosed herein. Step 530 may comprise determining whether ΔT_Remain satisfies a time threshold (e.g., if ΔT_Remain≥ΔT_SelectTH).

Step 540 may comprise implementing a selective refresh operation on the storage division 134 in response to determining that ΔT_Remain≥ΔT_SelectTH. The selective refresh operation of step 540 may comprise relocating data stored on the identified high-error storage unit 132 to another storage division 134 (e.g., appending the data to the head 161 of the storage log 151). The selective refresh operation of step 540 may further comprise delaying a full refresh and/or GC operation on the storage division 134 by, inter alia, retaining data stored on other storage units 132 of the storage division 134, scheduling the storage division 134 for a full refresh and/or GC operation (e.g., placing the storage division 134 into a reliability queue 145), and/or the like. Step 550 may comprise performing a full refresh operation on the storage division 134, as disclosed herein.

Figure 6A:
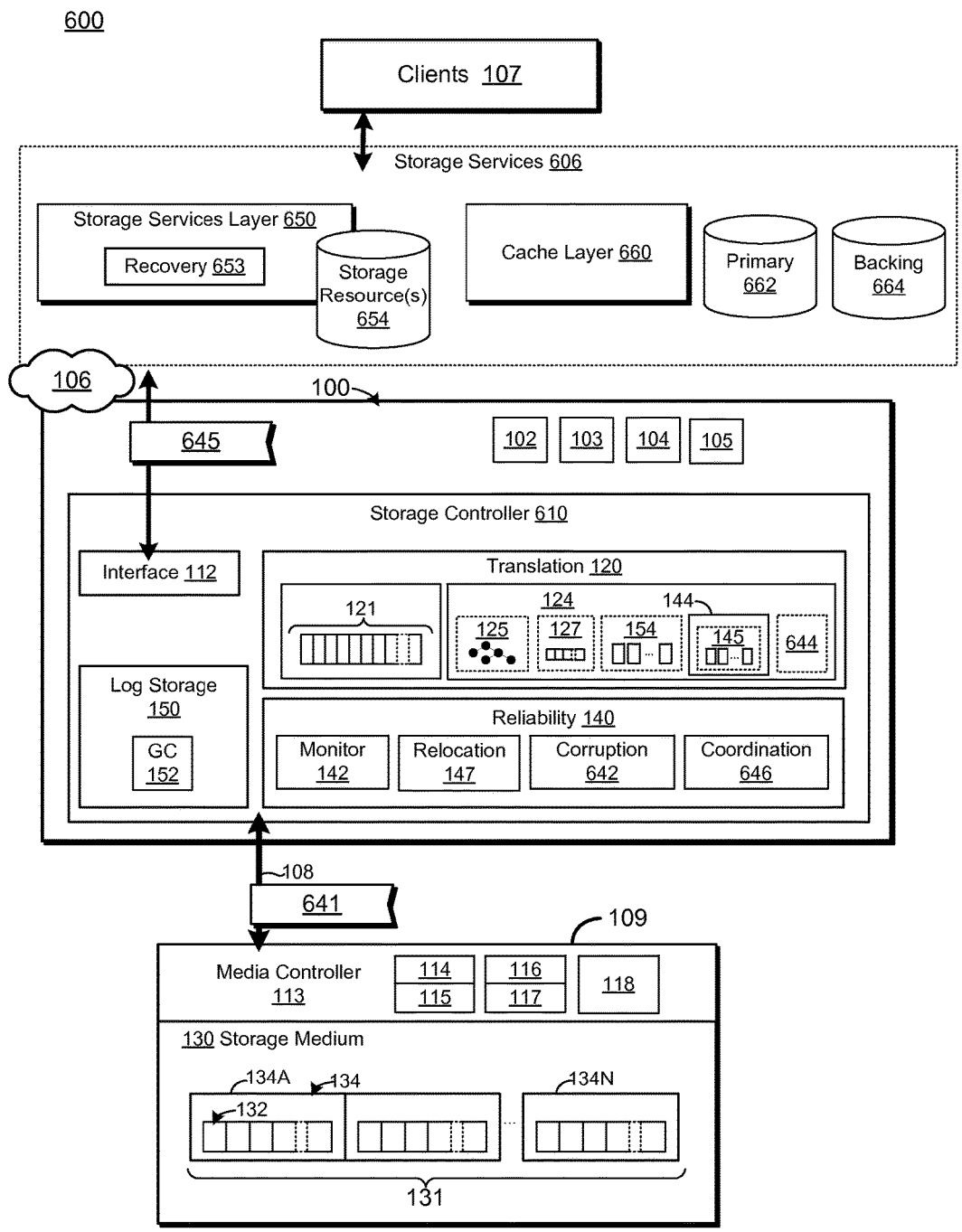
FIG. 6A is a schematic block diagram of one embodiment of a storage system configured to manage storage failure conditions.

FIG. 6A is a schematic block diagram of another embodiment of a system 600 for adaptive storage reliability management. The system 600 may comprise a storage controller 610 configured to operate on a computing system 100 comprising processing resources 102, volatile memory resources 103, non-transitory storage resources 104, a communication interface 105 (to communicatively couple the computing system 100 to a network 106), and/or the like, as disclosed herein. The storage controller 610 may comprise an interface 112, media controller 113, translation module 120, reliability manager 140 and log storage module 150, as disclosed herein. The storage medium 130 may comprise a non-volatile storage medium of a storage device 109. The storage controller 610 may provide storage services to clients 107 and/or storage services 606 through an interface 112, as disclosed above. The storage services 606 may leverage the storage functionality of the storage controller 610 to provide upper-level storage services to clients 107. The storage services 606 may include, but are not limited to: distributed storage systems, network storage systems, redundant storage systems (RAID storage controller(s)), a file system, a network file system, a file server, a cache layer, and/or the like.

The storage manager 610 (and/or modules, components, and/or features thereof) may be implemented in software, hardware, and/or a combination of software and hardware elements. In some embodiments, portions of the storage manager 610 are embodied as executable instructions stored on a non-transitory, machine-readable storage medium. The instructions may comprise computer program code that, when executed by a processor and/or computing device, cause the processing resources 102 of the computing system 100 to implement certain processing steps, procedures, and/or operations disclosed herein. The storage manager 610, and/or portions thereof, may be implemented and/or embodied as a driver, a library, an interface, an API, FPGA configuration data, firmware (e.g., stored on an EEPROM), and/or the like. Accordingly, portions of the storage manager 610 may be accessed by and/or included within other modules, processes, and/or services (e.g., incorporated within a kernel layer of an operating system of the computing system 100). In some embodiments, portions of the storage manager 610 are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like. In some embodiments, the storage manager 610 may be referred to as a storage device, storage controller, storage manager, storage layer, storage engine, storage facility, storage driver, storage circuit, and/or the like.

In the FIG. 6A embodiment, the storage controller 610 is configured to service storage requests by appending data (log entries 152) to a storage log 151 within a storage address space 131 of the storage medium 130. The translation module 120 may maintain logical-to-physical translation metadata to associate LIDs of the logical address space 121 with data stored on the storage medium 130. Accordingly, the translation module 120 may be referred to as a "translation layer." The translation module 120 may comprise a forward map 125 comprising entries 126 that associate LIDs of the logical address space 121 with respective storage addresses and/or storage units 132 on the storage medium 130. The log storage module 150 may be configured to store data with persistent, crash safe metadata, such as a persistent metadata 157 (within a data packet 155 log entry 152) and/or metadata entries 158 that, inter alia, comprise logical-to-physical translation metadata pertaining to the storage log 151.

The storage controller 610 may further comprise a media controller 113 to implement storage operations on the storage medium 130 by use of a write module 114 and/or read module 116. The media controller 113 may further comprise an error management module 118 to manage error conditions on the storage medium 130, as disclosed herein. The error management module 118 may be configured to detect and/or correct storage errors by use of one or more "local error mitigation mechanisms." As used herein, "local error mitigation mechanisms" refers to mechanisms for recovering from error conditions on the storage medium 130 by use of data that is managed by and/or available to the storage controller 610, which may include data stored on the storage medium 130, data maintained in volatile memory resources 103 of the computing system 100, data stored in the non-transitory storage resources 104 of the computing system 100, and/or the like. The local error mitigation implemented by the error management module 118 may include, but is not limited to: a) an ECC data encoding, b) media tuning, c) parity data, d) data redundancy (e.g., storing data redundantly and/or in a RAID configuration on the storage medium 130), and/or the like, as disclosed herein. In response to detecting an error condition, the error management module 118 may attempt to correct the error by use of local error mitigation. Data errors that cannot be corrected by use of the ECC encoding of the data (e.g., ECC decode failures) may be corrected by use of parity data (e.g., parity reconstruction), accessing redundant data, and/or the like. Errors that cannot be corrected by local error mitigation may result in a read failure or fatal read error (e.g., EIO).

The media controller 113 may be configured to inform the storage controller 610 of error conditions pertaining to the storage controller 610 by use of, inter alia, media reporting (MR) messages 641. The MR messages 641 may include information pertaining to local error mitigation operations implemented by the media controller 113 (e.g., error rate, media tuning, parity substitution, and/or the like). Alternatively, or in addition, the media controller 113 and/or error management module 118 may report error information by use of error codes, return values, and/or the like, which may be communicated through the interconnect 108. The reliability manager 140 may use error reporting information to a) monitor reliability conditions on the storage medium 130 (e.g., implement test storage operations), b) determine reliability metrics pertaining to the storage medium 130, c) project error rate and/or reliability of the storage medium 130, d) identify high-error rate storage units 132, e) identify portions of the storage medium 130 that should be refreshed, f) retire portions of the storage medium 130, and/or the like, as disclosed herein. The media controller 113 may be further configured to inform the storage controller 610 of EIO conditions through the interconnect 108 by, inter alia, issuing an MR message 641, returning error code(s), raising and/or throwing an exception, signaling an error interrupt, and/or the like.

The storage controller 610 may be configured to manage EIO conditions on the storage medium 130. As disclosed herein, an EIO condition refers to a read failure and/or other error condition that cannot be corrected by the use of local error mitigation. In response to identifying an EIO pertaining to a read operation on a particular storage unit 132 within a storage division 134, the reliability manager 140 may place the storage division 134 in a "corrupt" or "failed" state, which may comprise isolating the storage division 134. As used herein, isolating a storage division 134 refers to removing the storage division 134 from service and/or blocking read access to the storage division 134. Read access to the storage division 134 may be blocked in order to, inter alia, prevent further EIO conditions. The storage controller 610 may be further configured to notify client(s) 107 that an EIO has occurred (e.g., issue an error, I/O interrupt, and/or the like).

Isolating the storage division 134 from service may result in significant data loss and/or corruption to the storage metadata 124. As disclosed herein, storage divisions 134 may comprise a large number of storage units 132, which may be distributed across multiple, independent storage elements 136A-Y (as illustrated in FIG. 1C). The storage division 134 in which an EIO condition has occurred may comprise readable storage units 132, despite the EIO condition that occurred on the particular storage unit 132. Moreover, corruption to the storage metadata 126 may occur due to the loss of log entries 152 within the failed storage division 134, including data packets 155, metadata entries 158, and/or the like. The reliability manager 140 may, therefore, prevent the storage division 134 from being refreshed and/or initialized since doing so would result loss of the logical-to-physical translation metadata pertaining to the particular storage unit 132, including the LID(s) associated with the unreadable data storage within the particular storage unit 132. Therefore, refreshing and/or performing a GC operation on the storage division 134 would result in a) another EIO failure attempting to relocate data stored in the particular storage unit 132, and b) loss of the logical-to-physical translation metadata pertaining to the unreadable data within the particular storage unit 132 (e.g., the translation module 120 would no longer be able to determine which LID(s) are associated with the unreadable, corrupt data). The reliability manager 140 may keep the storage division 134 in the "failed" state until the storage medium 130 is replaced and/or data is recovered from the storage division 134 (and/or other storage divisions 134 of the storage medium 130) in an offline recovery operation. However, as disclosed above, the reliability and/or error rate of the data on the storage division 134 may degrade as a function of data retention time and, as such, any time delay from the time the EIO condition is identified and an offline recovery operation is performed may result in further data loss.

In some embodiments, the storage controller 610 comprises a corruption manager 642 configured to handle EIO conditions on the storage medium 130. The corruption manager 642 may be configured to mitigate an EIO condition in a storage division 134 by a) recording logical-to-physical translation metadata pertaining to the EIO condition and/or b) refreshing the storage division 134. The logical-to-physical translation metadata pertaining to the EIO condition may be stored within the storage log 151 (e.g., within a corruption note log entry 152). As used herein, a corruption note refers to a persistent, crash safe metadata that identifies the LID associated with an EIO (e.g., unreadable and/or corrupt data). A corruption note may be embodied as a metadata entry 158 appended to a storage log 151, as disclosed above in conjunction with FIG. 1D. The corruption manager 642 may be further configured to record that the LID is corrupt in the storage metadata 124 by, inter alia, flagging the LID as corrupt in the forward index. The storage controller 610 may return a predetermined error code and/or signal an error interrupt in response to requests to read data of a LID that is marked as corrupt and/or unreadable. In one embodiment, the corruption manager 642 comprises circuit to detect EIO conditions on the storage medium 130. The circuit may be configured to communicatively couple the corruption manager 642 to the media controller 113 and/or interconnect 108 (to receive MR messages 641, as disclosed herein). In one embodiment, the corruption manager 642 comprises a circuit on the storage device 109 (e.g., a component and/or module of the media controller 113). In an alternative embodiment, the corruption manager 642 comprises a programmable log component. In another embodiment, the corruption manager 642 comprises a processor, memory, and non-transitory storage (e.g., processing resources 102, memory resources 103, and/or non-transitory storage 104 of the computing system 100). The corruption manager 642 may be embodied, in part, machine readable code executable by the processor.

The storage controller 610 may be configured to identify and mitigate EIO conditions before the EIO conditions affect clients 107. As disclosed above, the storage controller 610 may comprise a reliability monitor 142 configured to assess the reliability of the storage medium 130 by scanning portions of the storage medium 130 (e.g., performing test read operations on storage divisions 134). The storage controller 610 may detect an EIO condition in response to a test read operation as opposed to a request from a client 107. As disclosed in further detail therein, the storage controller 610 may resolve the EIO condition (e.g., clear the EIO condition) before a client 107 attempts to access the unreadable data. Therefore, in some embodiments, the storage controller 610 may mitigate EIO errors transparently relative to the clients 107 and/or without interrupting the storage services provided by storage services 606. Alternatively, or in addition, the storage controller 610 may indicate that a LID is currently unreadable, but may become readable at a later time (if and/or when replacement data is available).

The log storage module 150 may be configured to retain corruption notes in the storage log 151 until the EIO condition is resolved and/or the EIO condition is cleared. The storage controller 610 may clear a corruption condition and/or EIO flag associated with a LID in response to one or more of: determining that the corrupt data is invalid, determining that the corrupt data is erased (e.g., is deleted, unmapped, deallocated, TRIMed, and/or the like), overwriting the corrupt data, modifying the corrupt data out-of-place, rewriting the corrupt data (e.g., writing replacement data to the storage medium 130), and/or the like. Clearing a corruption note may comprise writing one or more log entries 152 to the storage log 150, recording that the log entry 152 corresponding to the corruption note is invalid, and/or the like.

The corruption manager 642 may be further configured to relocate data from a storage division 134 in response to detecting an EIO pertaining to a storage unit 132 therein. Data may be relocated from the storage division 134 immediately in response to identifying the EIO condition and/or writing the corruption note to the storage log 151. The relocation operation may comprise relocating data stored on other storage units 132 within the storage division 134 and/or updating the logical-to-physical translation layer pertaining to the relocated data, as disclosed herein. The relocation operation may comprise a GC operation and, as such, may further include distinguishing valid data from invalid data within the storage division 134 (by use of the storage metadata 124), and relocating the identified valid data, while allowing the invalid data to be erased (and/or remain on the retired storage division 134 without being relocated). The relocation operation may further comprise initializing the storage division 134, retiring the storage division 134, retiring portion(s) of the storage division 134 (e.g., retiring portions of particular storage elements 136A-Y within the storage array 135 of FIG. 1C), and/or the like.

Relocating data from the storage division 134 in response to detecting an EIO condition, rather than isolating the storage division 134 and/or waiting for offline recovery, may reduce the likelihood of further data loss. As disclosed above, the error rate and/or reliability of the storage division 134 may increase as a function of data retention time. Immediately relocating data from the storage division 134 minimizes data retention time and, as such, may prevent further data loss due to data stagnation error.

Writing the corruption note to the storage log 151 may further comprise updating the storage metadata 124 to identify the LID(s) associated with the corrupt data. Updating the storage metadata 124 may comprise updating one or more entries 126 of the forward map 125 to associate the LID(s) with a corrupt data indicator (e.g., corruption flag) as opposed to a storage address and/or intermediate identifier (VID), as disclosed herein. In response to a request to read the LID(s), the translation module 120 may access the corresponding entries in the forward map 125 and determine that the LID(s) are unreadable (corrupt) based on the corrupt data indicator. Servicing a request to read the LID(s) may comprise returning an error and/or issuing an interrupt without accessing the unreadable storage unit(s) 132. Alternatively, or in addition, the storage controller 610 may report the EIO condition to the client 107 and indicate that the LID(s) may be readable at a later time (e.g., if replacement data is identified and written to the storage medium 130, as disclosed in further detail below).

Figure 6B:
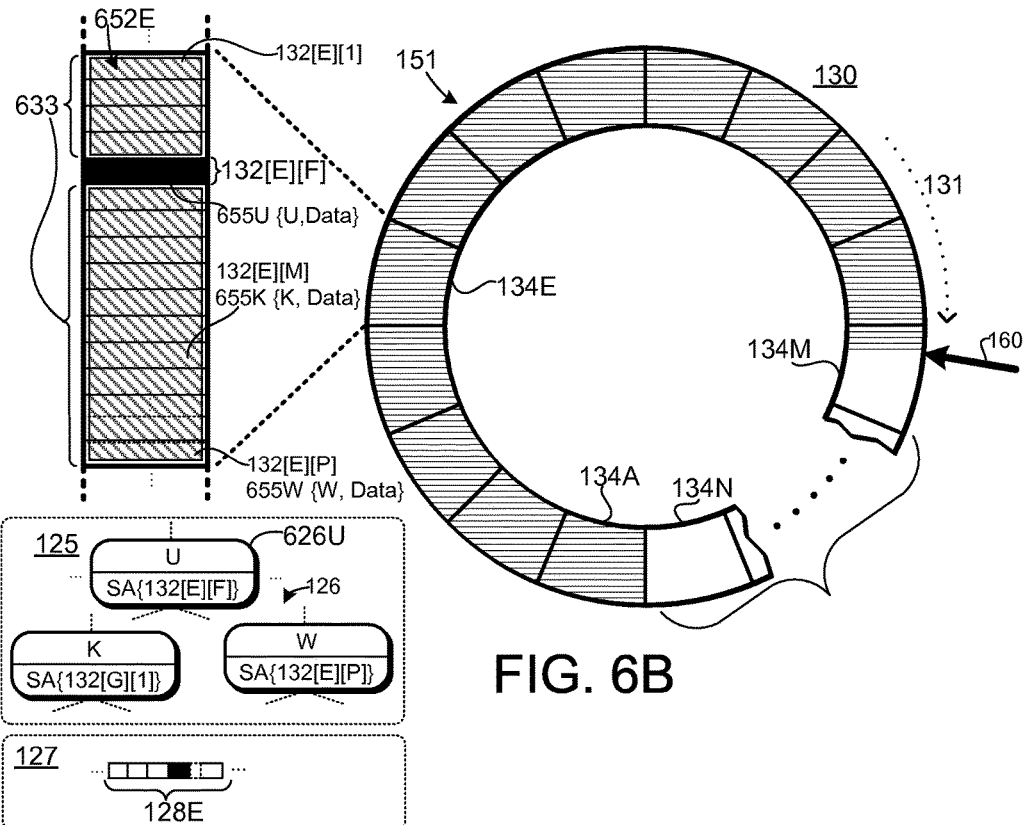
FIG. 6B depicts embodiments of log storage operations to manage storage failure conditions.

FIG. 6B depicts embodiments of log storage operations to manage EIO conditions. In the FIG. 6B embodiment, the storage address space 131 of the storage medium 130 is depicted as a cycle comprising storage divisions 134A-N. The storage divisions 134A-N may each comprise a plurality of storage units 132. As disclosed above in conjunction with FIG. 1C, the storage medium 130 may comprise a storage array 135 and, as such, the storage divisions 134A-N may correspond to a plurality of erase blocks and/or divisions of respective, independent storage elements 136A-Y, and the storage units 132 may comprise logical storage units comprising pages on the respective, independent storage elements 136A-Y.

The storage division 134E comprises a plurality of storage units 132[E][1]-132[E][P] comprising data of the storage log 151. The data stored in the storage units 132[E][1]-132[E][P] may be embodied as respective log entries 652E (e.g., data packets 155, metadata entries 158, and/or the like). The log entries 652E may be encoded as ECC codewords and/or stored with parity reconstruction data, as disclosed herein. As illustrated in FIG. 6B, the log entries 652E on storage division 134E include a data packet 655U stored within storage unit 132[E][F] that is associated with LID U, and a data packet 655W stored within 132[E][P] that is associated with LID W. LID U and LID W may be mapped to the respective data packets 655U and 655W within storage units 132[E][F] and 132[E][P] by use of the forward map 125. Logical-to-physical associations corresponding to other log entries 652E stored within the storage division 134E are omitted from FIG. 6B to avoid obscuring the details of the disclosed embodiments.

The storage unit 132[E][F] may be unreadable. The unreadable storage unit 132[E][F] may be identified in response to a test read operation (e.g., performed on the storage division 134E by the reliability monitor 142). As disclosed herein, determining that the storage unit 132[E][F] is unreadable may comprise exhausting the local error mitigation mechanisms available to the storage controller 610 (e.g., exhausting ECC error correction, media tuning, parity substitution, redundant storage, and/or the like). The storage controller 610 may identify the unreadable storage unit 132[E][F] in response to an MR message 641 received through the interconnect 108. As disclosed above, the MR message 641 may be issued by the media controller 113 and/or error management module 118 in response to determining that the data stored on the storage unit 132[E][F] cannot be read and/or recovered by use of local error mitigation. The MR message 641 may indicate that an EIO condition has occurred, may identify the unreadable storage unit 132[E][F], may identify the unreadable storage address (es), may identify the LID(s) associated with the storage unit 132[E][F], and/or the like. In some embodiments, issuing the MR message 641 comprises returning an error code and/or signaling an interrupt through the interconnect 108.

In response to identifying the unreadable storage unit 132[E][F], the storage controller 610 may take steps to mitigate the EIO condition by use of the corruption manager 642. As disclosed above, the corruption manager 642 may be configured to a) write a corruption note to the storage medium 130 and/or b) relocate data from the storage division 134E corresponding to the EIO condition.

Figure 6C:
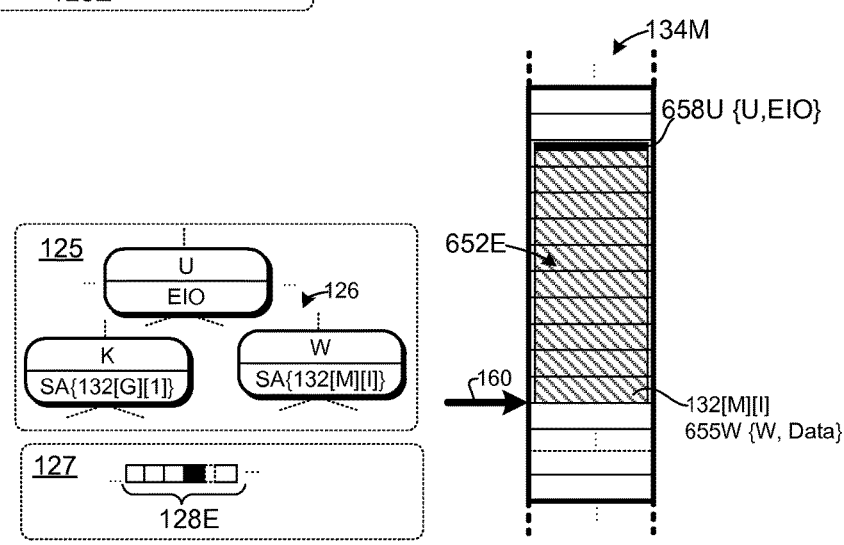
FIG. 6C depicts further embodiments of log storage operations to manage storage failure conditions.

As illustrated in FIG. 6C, writing the corruption note may comprise appending a metadata entry 658U to the storage log 151 (at the current append point 160 within storage division 134M). The metadata entry 658U may comprise a corruption datum (metadata) to indicate that LID U is unreadable (e.g., is associated with corrupt data). The corruption manager 642 may be further configured to update the logical-to-physical translation layer (e.g., forward map 125) to indicate that LID U is unreadable. As illustrated in FIG. 6C, LID U is mapped to an "EIO" flag in the forward map 125.

The corruption manager 642 may be further configured to relocate data stored within the storage division 134E (by use of the relocation module 147 and/or log storage module 150). The data may be relocated immediately in response to detecting the EIO condition in order to, inter alia, reduce the likelihood of further errors due to data stagnation on the storage division 134E. Relocating data from storage division 652E may comprise a) reading the log entries 652E from the storage division 134E (within other storage units 633 of the storage division 134E), and b) appending the log entries 652E at the append point 160. In the FIG. 6C embodiment, the log entries 652E within storage division 134E are appended within storage division 134M (at append point 160). Relocating the log entries 652E may further comprise updating logical-to-physical translation metadata to associate LIDs corresponding to the log entries 652E with the new storage location(s) of the log entries 652E. As illustrated in FIG. 6C, LID W may be associated with the storage address of relocated data packet 655W on storage unit 132[M][I].

In some embodiments, relocating data from a storage division 134 corresponding to an EIO condition (e.g., storage division 134E) comprises a GC operation. As disclosed above, a GC operation may include distinguishing valid data from invalid data stored on the storage division 134E, relocating the valid data, and excluding the invalid data from relocation (e.g., allowing the invalid data to be erased and/or remain on the storage division 134E without being rewritten on the storage medium 130). In the FIG. 6B embodiment, the log entries 652E may comprise a data packet 655K associated with LID K. The data packet 655K may have been rendered invalid by a subsequent storage operation to overwrite and/or modify LID K. Overwriting and/or modifying LID K out-of-place may comprise appending another data packet to the storage log 151 within storage unit 132[G][1] (as indicated by the forward map 125) and/or recording that the data packet 655K within storage unit 132[E][M] is invalid (in the validity bitmap 128E). The data packet 655W may be identified as valid based on the association between LID W and storage unit 132[E][P] in the forward map 125 and/or the validity bitmap 128E. Relocating the log entries 652E from storage division 134E may comprise a) determining that the data packet 655K stored within storage unit 132[E][M] is invalid and/or b) determining that the data packet 655W stored within storage unit 132[E][P] is valid by use of the forward map 125 and/or validity map 127, c) appending valid data to the storage division 134M, including data packet 655W, and d) omitting invalid data, including data packet 655K.

As disclosed herein, LID(s) associated with EIO conditions may be marked as "corrupt" by use of an EIO flag and/or other indicator. The EIO flag may be maintained in the forward map 125 and/or in a persistent, crash safe metadata entry 158 within the storage log 151 on the storage medium 130 (e.g., metadata entry 658U). In response to a request to read LID U, the storage controller 610 may determine that LID U is unreadable based on the EIO flag mapped to LID U in the forward map 125. The storage controller 610 may return a read error and/or signal an error interrupt in response to requests to read LID U and/or other unreadable data.

The storage controller 610 may be further configured to clear EIO conditions in response to determining the corrupt data that the corrupt data is invalid, which may include, but are not limited to: determining that the corrupt data is erased (e.g., is deleted, unmapped, deallocated, TRIMed, and/or the like), overwriting the corrupt data, modifying the corrupt data out-of-place, rewriting the corrupt data (e.g., writing replacement data to the storage medium 130), and/or the like. In response to determining that the corrupt data associated with a LID is invalid, the corruption manager 642 may clear the corruption condition on the LID. Clearing the corruption condition may comprise recording that the LID is not corrupt (e.g., removing the LID from the forward map 125 and/or associating the LID with valid data), removing and/or invalidating the corruption metadata entry 158 associated with the LID, and/or the like.

Figure 6D:
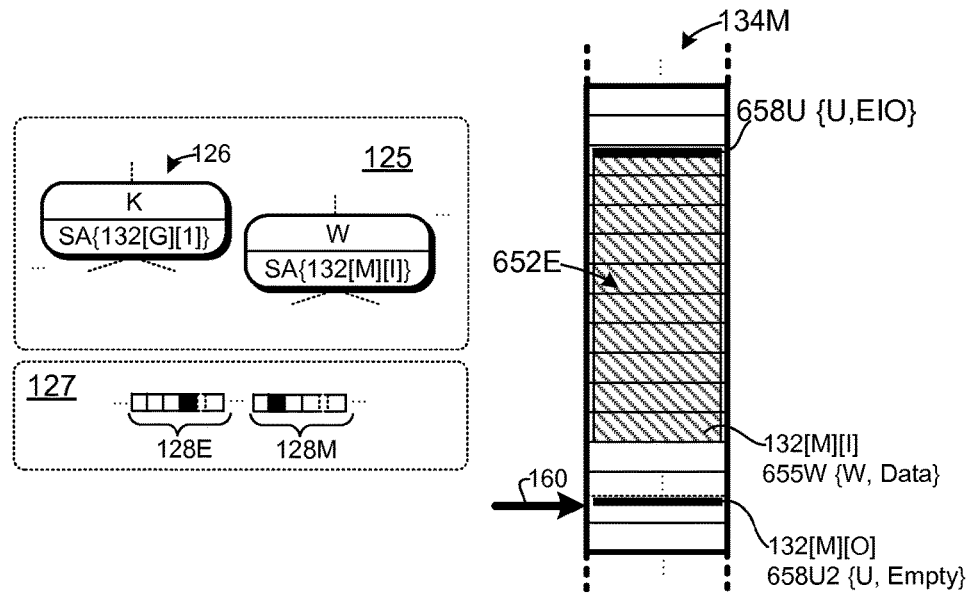
FIG. 6D depicts further embodiments of log storage operations to manage storage failure conditions.

Referring to FIG. 6D, the corruption manager 642 may clear the corruption and/or EIO status of LID U in response to determining that the unreadable data associated with LID U is no longer valid (e.g., is empty, deleted, unmapped, deallocated, and/or the like). In the FIG. 6D embodiment, the storage controller 610 may receive a message indicating that LID U is empty. The message and/or request may include, but is not limited to: a TRIM message, a TRIM request, a deallocation message, a deallocation request, an unmap message, an unmap request, an empty message, an empty request, a delete message, a delete request, and/or the like. In response, translation module 120 may remove LID U from the forward map 125 by, inter alia, removing entries 126 that associate LID U with the EIO flag. The corruption manager 642 may be configured to invalidate the corruption note 658U associated with LID U by use of the validity bitmap 128M, as disclosed above. The corruption note 658U may, therefore, be identified and erased in a GC operation on the storage division 134M. In some embodiments, servicing the message and/or request further includes appending a metadata entry 658U2 to the storage log 151 comprising metadata that indicates that LID U is empty (e.g., a persistent TRIM note). In the FIG. 6D embodiment, a metadata entry 658U2 configured to indicate that LID U is empty is appended within storage unit 132[M][O].

Figure 6E:
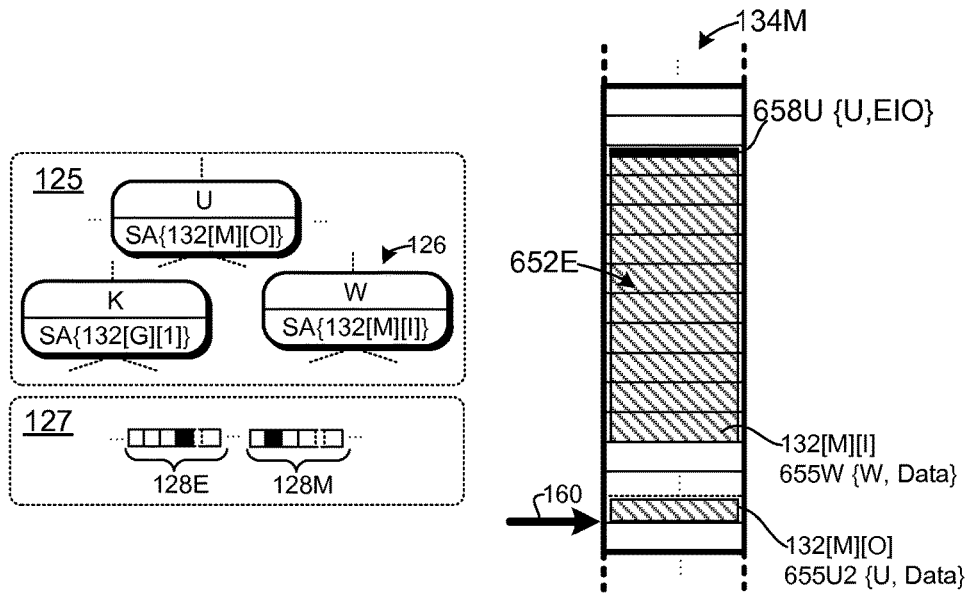
FIG. 6E depicts further embodiments of log storage operations to manage storage failure conditions.

The corruption manager 642 may be further configured to clear the corruption status and/or EIO flag of a LID in response to overwriting and/or modifying data corresponding to the LID. Referring to FIG. 6E, the storage controller 610 may receive a request to write data to LID U. Servicing the request may comprise a) appending a data packet 655U2 to the storage log 151 (at storage unit 132[M][O] within storage division 134M), and b) updating the logical-to-physical translation layer to associate LID U with the storage address of the data packet 655U2 (storage address of storage unit 132[M][O]). Servicing the storage request may further comprise clearing the EIO and/or corruption status of LID U, such that LID U is no longer considered to be unreadable. As illustrated in FIG. 6E, clearing the EIO flag on LID U may comprise a) associating LID U with a storage address rather than an EIO flag in the forward map 125 and/or b) invaliding the corruption note 658E in the validity bitmap 128M.

The corruption manager 642 may be further configured to mitigate EIO conditions by, inter alia, requesting replacement data corresponding to unreadable LIDs and/or writing the replacement data to the storage medium 130 to clear the corresponding EIO conditions, as disclosed above in conjunction with FIG. 6E. As disclosed above, the EIO condition may be detected in response to a test operation, and the EIO condition may be cleared before a client 107 requests data of the LID. Therefore, the storage controller 610 may be capable of detecting and mitigating EIO conditions on the storage medium 130 without interrupting the storage services provided to the clients 107.

In some embodiments, the storage module 610 includes a coordination module 646 configured to, inter alia, report detected EIO conditions. As used herein, reporting an EIO condition refers to one or more of: recording that an EIO condition has occurred (e.g., writing a corruption note, updating corruption metadata 644, and/or the like), informing client(s) 107 of the EIO condition, signaling client(s) 107 of the EIO condition, interrupting client(s) 107, and/or the like. Accordingly, the coordination module 646 may be configured to report an EIO condition by use of one or more of: a metadata entry 158 in the storage log 151; an update to the corruption metadata 644; a signal issued through the interface 112, network 106, and/or the like, an interrupt issued through the interface 112, network 106, and/or the like; a return code (e.g., a return code to a storage request); a return status; a status code (e.g., a status register pertaining to the storage controller 610); and/or the like. Reporting an EIO condition may further comprise requesting replacement data from one or more client(s) 107 and/or storage services 606 (e.g., the storage services layer 650, cache layer 660, and/or the like). In some embodiments, the storage controller 610 reports the EIO condition in response to a request to read a corrupt LID. Reporting the EIO condition may comprise returning an error in response to the request, providing information regarding the EIO condition in response to the request, and/or the like. In some embodiments, the error reported by the storage controller 610 indicates that the LID may be readable at a later time (e.g., when replacement data is written to the storage medium 130, as disclosed herein).

In some embodiments, the coordination module 646 is configured to provide information pertaining to EIO conditions by use of EIO messages 645. As used herein, an EIO message 645 refers to a message that comprises data pertaining to an EIO condition detected by the storage controller 610. An EIO message 645 may include, but is not limited to: identifiers associated with the EIO condition, metadata pertaining to the EIO condition (e.g., client metadata associated with the LIDs of the EIO condition), a request for replacement data pertaining to the EIO condition, a query regarding the EIO condition (e.g., a query to determine if the EIO condition pertains to redundant cache data), and/or the like. The coordination module 646 may be configured to issue EIO messages 645 through the interface 112, network 106, and/or the like. Alternatively, or in addition, the coordination module 646 may communicate an EIO message 645 as a return code, a status code, a return status, a signal, an interrupt, an exception, and/or the like. In some embodiments, the coordination module 646 is configured to provide EIO messages 645 to all clients 107 communicatively coupled to the storage controller 610 (e.g., broadcast EIO messages 645 through the interface 112, network 106, and/or the like). Alternatively, the coordination module 646 may selectively provide EIO messages 645 to certain clients 107 and/or services. In some embodiments, the coordination module 646 identifies the client(s) 107 associated with the LID of an EIO condition, and provides EIO message(s) pertaining to the LID to the identified client(s) 107. In another embodiment, the coordination module 646 sends EIO messages 645 to entities that have requested and/or are authorized to receive information pertaining to the logical address space 121 and/or particular regions therein. Such entities may include, but are not limited to: clients 107, storage services 606 (e.g., upper-level storage service providers, such as the storage services layer 650, cache layer 660, and/or the like), operating systems, file systems data security systems, data redundancy systems, and/or the like. The coordination module 646 may record the entities that are to receive EIO information pertaining to particular LIDs and/or LID ranges in the corruption metadata 644 (and/or other storage metadata 124 disclosed herein). Alternatively, or in addition, EIO reporting information may be specified by use of client metadata associated with particular LID(s) and/or LID ranges, as disclosed herein.

As disclosed above, an EIO message 645 may include a request for replacement data corresponding to an EIO condition. The request of the EIO message 645 may identify the replacement data by use of one or more of: a LID, a primary storage identifier, a backing store identifier, a RAID identifier (e.g., RAID stripe, type, etc.), client metadata, and/or the like. The coordination module 646 may be further configured to receive replacement data in response to the EIO message 645 and, in response, the corruption manager 642 may write the replacement data to the storage medium 130 (by use of the log storage module 150) and clear the corruption note corresponding to the EIO condition, as disclosed above. In the FIG. 6E embodiment, the storage request to write data to LID U may be issued in response to receiving replacement data in response to, inter alia, an EIO message 645 corresponding to the EIO pertaining to LID U. Alternatively, or in addition, the EIO message 645 may comprise a query to determine the status of the data pertaining to the EIO condition. As disclosed in further detail herein, the EIO condition may correspond to data cached on the storage medium 130 by a client 107 (e.g., a cache layer 660). The EIO message 645 may include a query to determine whether the data of the EIO condition comprises redundant cache data available on a primary storage system 662 backing store 664, and/or the like.

The corruption manager 642 may be further configured to maintain corruption metadata 644 pertaining to EIO conditions. The corruption metadata 644 may comprise information pertaining to EIO conditions detected on the storage medium 130, and may include, but is not limited to: the LID(s) and/or other identifiers associated with detected EIO conditions, timestamps and/or other sequence information pertaining to the time and/or order in which the EIO conditions were detected, information regarding the availability of replacement data, and/or the like.

Referring to FIG. 6A, the storage controller 610 may provide storage services to storage services 606, including a storage services layer 650. The storage services layer 650 may comprise one or more of a network storage service, a storage server, a storage controller, a storage layer, and/or the like. The storage services layer 650 may be configured to provide storage services to clients 107 by use of the storage controller 610 and/or one or more other storage resources 654. The storage services layer 650 may be configured to store data redundantly, such that data written to the storage medium 130 (by use of the storage controller 610) is also written to one or more other storage resources 654. Alternatively, or in addition, the storage services layer 650 may implement a RAID configuration in which the storage controller 610 and/or other storage resources 654 implement portions of a RAID storage configuration. In some embodiments, the storage services layer 650 comprises a recovery engine 653 to mitigate error conditions pertaining to storage operations implemented by use of the storage controller 610 and/or storage services 654. The recovery engine 653 may be configured to mitigate data loss condition by, inter alia, accessing and/or replacement data on the storage device 109 and/or other storage resources 654.

The coordination module 646 of the storage controller 610 may be configured to notify the storage services layer 650 (and/or other clients 107) of EIO conditions by use of the EIO message(s) 645, disclosed herein. The coordination module 646 may issue an EIO message 645 to the storage services layer 650 and/or recovery engine 653, which may access replacement data stored on one or more of the storage resources 654. Accessing the replacement data may comprise reconstructing the replacement data by use of RAID and/or parity information stored on the storage medium 130 and/or storage resources 654. The recovery engine 653 may be configured to provide replacement data to the storage controller 610 in response to the EIO message 645, and the corruption manager 642 may clear the corresponding EIO condition(s) as disclosed herein.

In some embodiments, the EIO message 645 issued by the coordination module 646 to the storage services layer 650 (and/or other client(s) 107) may comprise additional metadata pertaining to the unreadable LID(s) (e.g., client metadata). As disclosed above, the storage log 151 may comprise log entries 152 that associate stored data with persistent, crash safe metadata by use of, inter alia, persistent metadata 157 within data packets 155 and/or metadata entries 158. The metadata associated with stored data may include the LID(s) and/or other identifiers assigned to the data. The persistent, crash safe metadata may include additional, client-specific metadata specified by a particular client 107, storage service 606 (e.g., storage services layer 650, cache layer 660, and/or the like). Client metadata may be communicated to the storage controller 610 using any suitable mechanism, including, but not limited to: including the client metadata storage requests issued through the interface 112 of the storage controller 610, including client metadata in separate request(s), providing the client metadata through extension to the interface 112 (e.g., IOCTL, fadvise, and/or the like), providing client metadata through a special-purpose interface of the storage controller 610, and/or the like. The storage controller 610 may be configured to include client metadata in the persistent metadata 157 and/or metadata entries 158 associated with the data in the storage log 151, as disclosed herein. Alternatively, or in addition, client metadata may be maintained in and/or linked to the LID(s) by use of storage metadata 124 (e.g., forward map 125).

Referring to FIG. 6B, in one embodiment, the entry 626U associated with LID U may include client metadata pertaining to LID U. The client metadata may include recovery metadata pertaining to LID U, such as an alternative identifier associated with LID U, an identifier and/or address corresponding to LID U on redundant storage (storage resource 654), RAID reconstruction information (e.g., identifiers and/or addresses of RAID stripes corresponding to the data), and/or the like. In response to identifying an EIO condition, the corruption manager 642 may be configured to access client metadata associated with the LID corresponding to the EIO condition (if available), and the coordination module 646 may include the client metadata in EIO message (s) 645. The recovery engine 653 of the storage services layer 650 may use client metadata included in the EIO message(s) 645 to access replacement data, which may be rewritten on the storage medium 130, as disclosed herein.

The corruption manager 642 may configure corruption mitigation operations based on characteristics of the corrupted data, the client(s) 107 and associated with the corrupted data, and/or storage service(s) 606 associated with the data. In some embodiments, such characteristics may be specified by use of client metadata, as disclosed above. In the FIG. 6A embodiment, the storage controller 610 provides storage services to storage services 606, including a cache layer 660. The cache layer 660 may be configured to implement data caching services for one or more primary storage systems 662, backing store 664, and/or the like, by use of the storage controller 610. As illustrated in FIG. 6A, the cache layer 660 may comprise storage service 606 that leverages the storage services provided by the storage controller 610 through, inter alia, the interface 112. In other embodiments, the cache layer 660 may be implemented as a component and/or element of the storage controller 610 (e.g., a module and/or service implemented by the storage controller 610).

The corruption manager 642 may be configured to manage certain EIO conditions pertaining to data of the cache layer 660 differently than EIO conditions pertaining to other types of data and/or data of other clients 107. The storage controller 610 may determine that data written to the storage medium 130 by the cache layer 660 comprises "redundant cache data." As used herein, "redundant cache data" refers to data that is available in the primary storage system 662 and/or backing store 664 associated with the cache layer 660. Redundant cache data may include, but is not limited to: data written to the storage medium 130 in response to a cache read miss, data written to the storage medium 130 in a write-through cache mode, data that has been written back to the primary storage system 662 and/or backing store 664 (e.g., data that is no longer dirty), and/or the like.

The storage controller 610 may determine that data corresponding to an EIO condition corresponds to redundant cache data and may adapt corruption management operations accordingly. In response to determining that an EIO condition pertains to redundant cache data, the corruption manager 642 may: a) invalidate the LID(s) (and/or other front-end identifiers) associated with the EIO condition, b) relocate data from the corresponding storage division 134, and/or c) retire the storage division 134 (and/or portions thereof) without writing a corruption note to the storage log 151. Invalidating the LID(s) associated with the EIO condition may comprise removing entries pertaining to the LID(s) from the forward map 125 and/or writing a TRIM note to the storage log 151 to indicate that the LID(s) are empty (as disclosed above in conjunction with FIG. 3). Subsequent requests pertaining to the LID(s) associated with the redundant cache data, therefore, will result in a cache miss, which may be handled by rewriting the cache data to the storage medium 130.

Referring to FIG. 6B, the storage controller 610 may identify an EIO condition pertaining to LID U in response to a read operation on storage unit 132[E][F], as disclosed above. In response to identifying the EIO condition, the corruption manager 642 may determine that LID U comprises redundant cache data. The corruption manager 642 may determine that LID U comprises redundant cache data by a) accessing client metadata associated with LID U; b) determining that LID U is allocated to the cache layer 660 (by use of the storage metadata 124), c) determining that LID U was written in response to a read miss, d) determining that LID U was written in a write-through cache mode, e) determining that LID U has been written back to the primary storage system 662 and/or backing store 664, and/or the like.

Figure 6F:
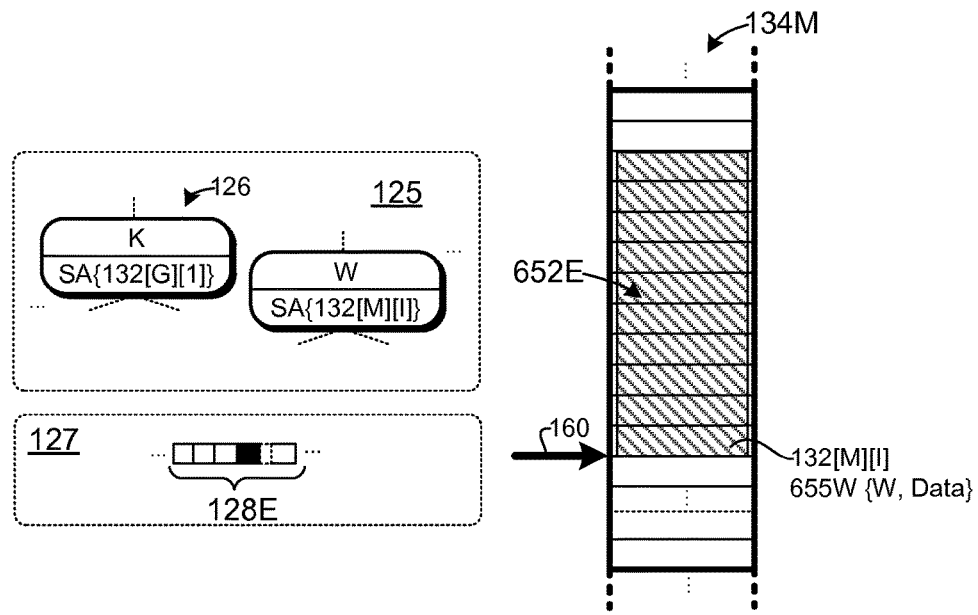
FIG. 6F depicts further embodiments of log storage operations to manage storage failure conditions.

Referring to FIG. 6F, in response to determining that LID U corresponds to redundant cache data, the corruption manager 642 may invalidate LID U (remove entries corresponding to LID U from the forward map 125) and relocate data from storage division 134E to 134M, as disclosed above. LID U may not be flagged as corrupt, and no corruption note may be written to the storage log 151. In some embodiments, the corruption manager 642 is further configured to deallocate the LID corresponding to the EIO (LID U) by appending a metadata entry 158 to the storage log 151, such as metadata entry 658U2 of FIG. 6D. Subsequent requests pertaining to LID U may, therefore, result in a cache miss (data does not exist) rather than an error condition.

In some embodiments, the corruption manager 642 identifies redundant cache data (and/or other data types) by use of client metadata. As disclosed above, the storage controller 660 may be configured to maintain client metadata pertaining to data stored on the storage medium by use of, inter alia, persistent, crash safe metadata 157 and/or metadata entries 158 within the storage log 151 and/or storage metadata 124 maintained in volatile memory resources 103 of the computing system 100. The cache layer 660 may provide client metadata that identifies LIDs comprising redundant cache data (e.g., LIDs written in response to read misses, LIDs comprising data that has been written through and/or written back to the primary storage system 662 and/or backing store 664, and/or the like). In the FIG. 6B embodiment, the entry 626U associated with LID U may include and/or reference client metadata, as disclosed above. In response to the EIO condition pertaining to LID U, the corruption manager 642 may access entry 626U to determine whether LID U comprises redundant cache data and, if so, may manage the EIO condition as disclosed above in conjunction with FIG. 6F (e.g., by relocating data from storage division 134E and unmapping LID U, without writing a corruption note metadata entry 658U to the storage log 151 and/or flagging LID U as corrupt). If the corruption manager 642 determines that LID U does not correspond to redundant cache data, the corruption manager 642 may manage the EIO condition as disclosed in conjunction with FIG. 6D (e.g., by writing a corruption note metadata entry 658U to the storage log 151, relocating the data from storage division 134E, and flagging LID U as corrupt).

In some embodiments, the corruption manager 642 is configured to determine whether LID(s) associated with an EIO condition correspond to redundant cache data by, inter alia, issuing a query to a client 107 associated with the LID(s) by use of an EIO message 645. Referring to FIG. 6B, the coordination module 646 may issue an EIO message 645 to the cache layer 660 in response to identifying the EIO on LID U. The EIO message 645 may include a query regarding the status of LID U (e.g., determine whether LID U corresponds to redundant cache data). The cache layer 660 may return a response indicating whether the data of LID U is available on the primary storage system 662 and/or backing store 664 and, if so, the corruption manager 642 may manage the EIO condition as described in conjunction with FIG. 6F. If the cache layer 660 indicates that LID U does not correspond to redundant cache data, the corruption management manager 642 may manage the EIO condition as described in conjunction with FIG. 6C (e.g., by appending a corruption note metadata entry 658E to the storage log 151 and/or and flagging LID U as corrupt in the forward map 125).

The coordination module 646 may be further configured to provide information regarding EIO conditions by use of the corruption metadata 644 disclosed above. The coordination module 646 may provide information pertaining to the EIO conditions in response to queries and/or requests received through, inter alia, the interface 112. The coordination module 646 may identify unreadable LIDs (if any) within the logical address space 121, provide additional client metadata pertaining to unreadable LID(s), indicate the time and/or order in which the corresponding EIO conditions were detected (e.g., identify the last detected EIO condition), and/or the like. The coordination module 646 may further provide status information regarding particular LIDs of the logical address space 121, such as whether a particular LID is readable (e.g., corresponds to data stored on the storage medium 130) and/or whether the particular LID corresponds to corrupt and/or unreadable data, as disclosed herein. In some embodiments, the storage services layer 650 and/or other client 107 may determine the status of particular LIDs and/or LID ranges before data of the particular LIDs is required by one or more other client(s) 107. In response to determining that one or more of the LIDs are unreadable, the storage services layer 650 may attempt to access replacement data (by use of the recovery engine 653), as disclosed herein.

Figure 7:
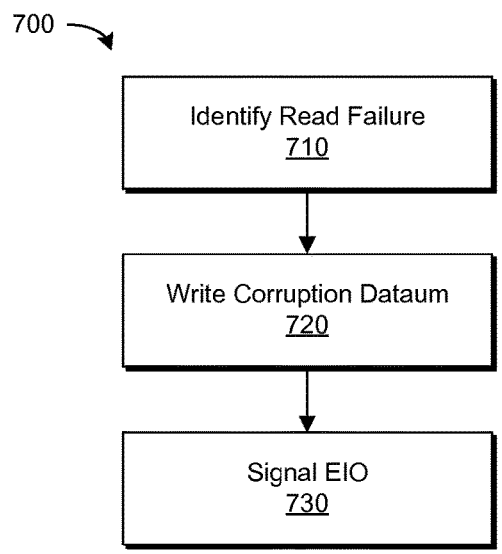
FIG. 7 is a flow diagram of one embodiment of a method for managing storage failure conditions.

FIG. 7 is a flow diagram of one embodiment of a method for managing EIO conditions on a storage medium 130. Step 710 may comprise identifying an unreadable storage unit 132. Step 710 may comprise identifying a read failure (EIO) and/or exhausting local error mitigation mechanisms available to the storage controller 610, such as ECC correction, media tuning, parity substitution, data redundancy, and/or the like. Step 710 may further comprise notifying the storage controller of the EIO condition by, inter alia, issuing an MR message 641 and/or interrupt on the interconnect 108. Step 710 may further comprise determining a LID associated with the EIO condition by use of, inter alia, storage metadata 124, such as the forward map 125 and/or the like.

Step 720 may comprise writing a persistent, crash safe corruption datum to the storage medium that identifies the unreadable data. Step 720 may comprise appending a metadata entry 158 to the storage log 151. The metadata entry 158 may identify the LID(s) associated with the EIO.

Step 730 may comprise signaling the EIO condition. Step 730 may comprise issuing an EIO message 645 to a client 107, storage services layer 650, cache layer 660, and/or the like. The EIO message 645 may identify the LID(s) that are unreadable and/or may comprise a request for replacement data associated with the identified LID(s). In some embodiments, the EIO message 645 includes client metadata to facilitate data recovery, which may include, but is not limited to: alternative identifier(s), storage address(es), reconstruction metadata, and/or the like. In some embodiments, step 730 comprises determining whether the EIO pertains to redundant cache data. Step 730 may, therefore, further comprise issuing a query to a cache layer 660 (and/or other client 107) to determine whether the LID(s) associated with the EIO condition pertain to redundant cache data available in a primary storage system 662, backing store 664, and/or the like, as disclosed herein.

Figure 8:
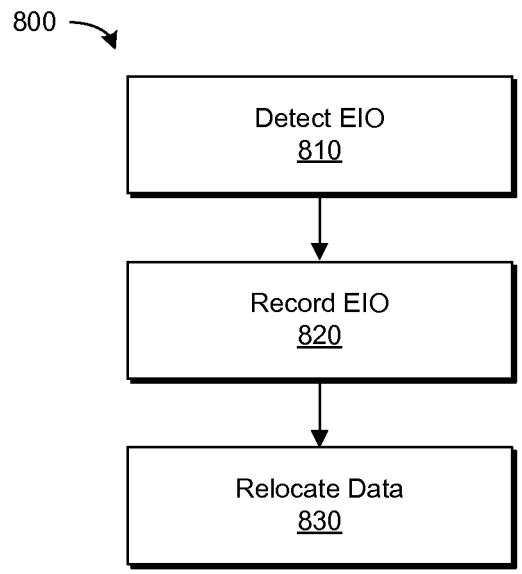
FIG. 8 is a flow diagram of another embodiment of a method for managing storage failure conditions.

FIG. 8 is a flow diagram of another embodiment of a method 800 for managing EIO conditions on a storage medium 130. Step 810 may comprise detecting an EIO condition, as disclosed herein. Step 810 may further include identifying a LID associated with the EIO condition by use of the storage metadata 124, as disclosed herein.

Step 820 may comprise recording that the LID associated with the EIO is corrupt. Step 820 may comprise writing a persistent, crash safe metadata entry 158 to a storage log 151 that identifies the LID associated with the EIO (e.g., metadata entry 658U, disclosed above). Step 820 may further comprise recording that the LID is corrupt in the storage metadata 124 by, inter alia, associating the LID with an EIO flag in the forward map 125 and/or the like.

Step 830 may comprise relocating data from a storage division 134 associated with the EIO. As disclosed above, step 830 may comprise writing data stored within the storage division 134 (that is readable) to other storage locations on the storage medium 130. Step 830 may, therefore, comprise reading and/or decoding log entries 152 stored on readable storage units 132 within the storage division 134 and rewriting the log entries 152 on the storage medium 130. Step 830 may further include distinguishing valid data from invalid data, relocating valid data stored on the storage division 134, and ignoring and/or omitting invalid data stored on the storage division 134.

In some embodiments, step 830 comprises relocating the data from the storage division 134 before and/or concurrently with the operations of step 820. In some embodiments, the data relocation operations of step 830 are implemented immediately in response to identifying the EIO at step 810 (or substantially immediately). Step 830 may comprise prioritizing relocation operations by queuing and/or stalling other storage requests and/or operations while data is relocated from the storage division 134. As disclosed above, step 830 may comprise prioritizing relocation of the data on the storage division 134 in order to, inter alia, reduce data stagnation errors (e.g., minimize the data retention time of the storage division 134).

Figure 9:
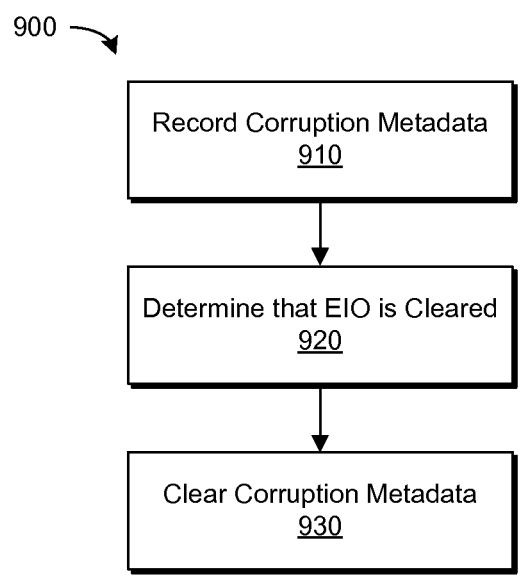
FIG. 9 is a flow diagram of another embodiment of a method for managing storage failure conditions.

FIG. 9 is a flow diagram of another embodiment of a method 900 for managing EIO conditions on a storage medium 130. Step 910 may comprise recording that a LID is associated with unreadable and/or corrupt data. Step 910 may comprise writing persistent, crash safe metadata to the storage medium 130 (in a metadata entry 158) that identifies the unreadable LID. Step 910 may further comprise mapping the LID to an EIO flag and/or corrupt data indicator in storage metadata 124, such as the forward map 125. Step 910 may be implemented in response to detecting an EIO pertaining to the LID. Step 910 may further include relocating data from a storage division 134 comprising the source of the EIO. The EIO may be detected in response to a test read operation performed on the storage division 134 by the reliability monitor 142.

Step 920 may comprise determining that the EIO condition on the LID is cleared (e.g., the LID is no longer associated with corrupt data). Step 920 may comprise one or more of: determining that the corrupt data associated with the LID is invalid, determining that the corrupt data associated with the LID is erased (e.g., is deleted, unmapped, deallocated, TRIMed, and/or the like), overwriting and/or modifying data of the LID, rewriting data to the LID (e.g., writing replacement data corresponding to the LID on the storage medium 130), and/or the like.

Step 930 comprises clearing the EIO condition from the LID. Step 930 may comprise removing the corruption indicator (e.g., EIO flag) from the forward map 125 by one or more of: removing an entry associated with the LID from the forward map 125 and/or mapping the LID to data stored on the storage medium 130. Step 930 may further comprise invalidating the corruption metadata (metadata entry 158) within the storage log 151 (in the validity map 127). Step 930 may comprise appending a data packet 155 comprising data of the LID to the storage log 151, appending a TRIM metadata entry 158 to the storage log 151, and/or the like.

Step 930 may clear the EIO condition from the LID before receiving a client request to access the LID in the corrupted state. Accordingly, step 930 may comprise mitigating the EIO condition transparently to the client(s) 107 and/or without interruption to storage services provided to the client(s) 107.

Figure 10:
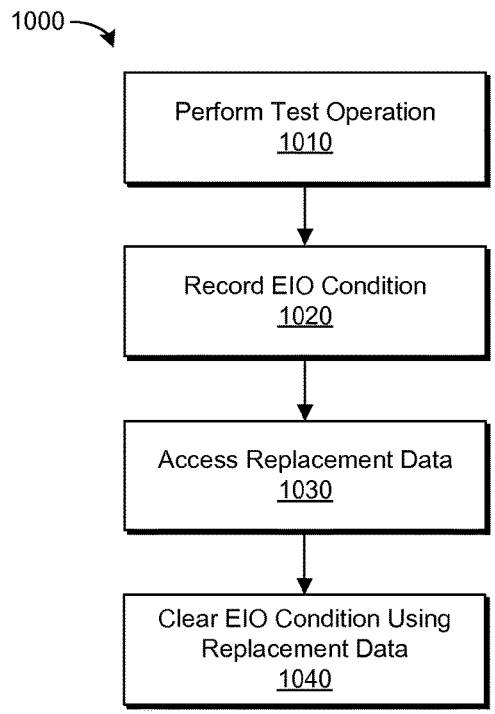
FIG. 10 is a flow diagram of another embodiment of a method for managing storage failure conditions.

FIG. 10 is a flow diagram of another embodiment of a method 1000 for managing EIO conditions on a storage medium 130. Step 1010 may comprise performing test operations on the storage medium 130 by use of the reliability monitor 142, as disclosed herein. Step 1010 may comprise reading data within storage units 132 of storage divisions 134 according to a particular test frequency, test period, test pattern, and/or the like. Step 1010 may further comprise identifying an EIO condition pertaining to a particular LID in response to one or more of the test read operations.

Step 1020 may comprise recording the EIO condition by marking the LID as corrupt by, inter alia, writing persistent, crash safe metadata to the storage medium identifying the corrupt LID and/or updating a forward map 125 to associate the LID with an EIO flag.

Step 1030 may comprise accessing replacement data for the LID. Step 1030 may include requesting replacement data by, inter alia, issuing an EIO message 645 to a storage client 107, storage services layer 650, cache layer 660, and/or the like. The EIO message 645 may identify the unreadable LID and/or may include client metadata pertaining to the LID, as disclosed herein.

Step 1040 may comprise clearing the EIO condition by use of the replacement data. Step 1040 may include writing the replacement data to the storage medium 130 (e.g., appending a data packet 155 to the storage log 151). Step 1040 may further comprise clearing the EIO flag from the LID, which may include a) invalidating the persistent metadata indicating that the LID is corrupt and/or updating the forward map 125 to associate the LID with the replacement data as opposed to the EIO flag. Step 1040 may further comprise returning the replacement data to a client 107 in response to a request to read the LID. Step 1040 may be implemented before the client 107 requests the unreadable data and/or before storage services are interrupted due to the EIO condition.

Figure 11:
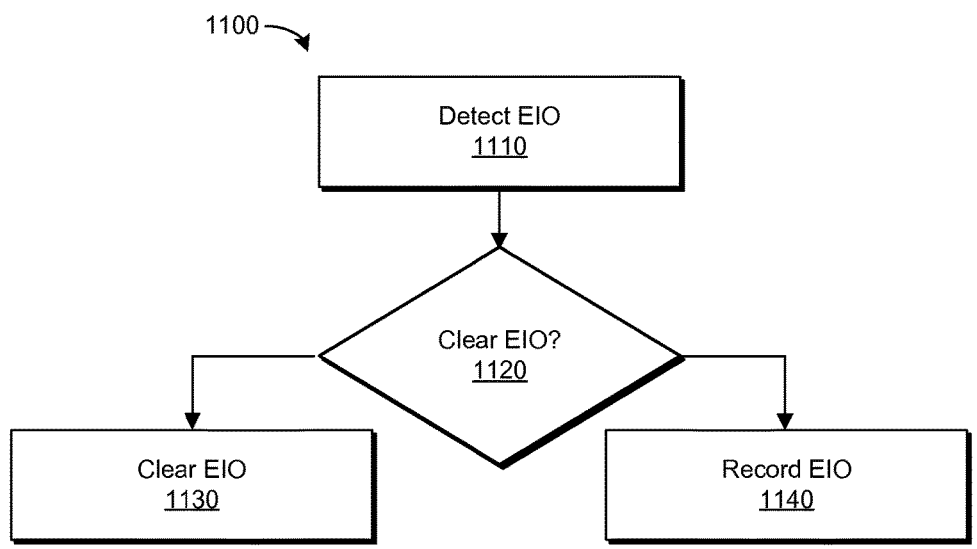
FIG. 11 is a flow diagram of another embodiment of a method for managing storage failure conditions.

FIG. 11 is a flow diagram of another embodiment of a method 1100 for managing EIO conditions on a storage medium 130. Step 1110 may comprise detecting an EIO condition pertaining to a particular LID. The EIO condition may be detected in response to a test read operation, as disclosed herein. Step 1110 may comprise determining that errors in data read from a particular storage unit 132 cannot be corrected by local error mitigation mechanisms, such as an ECC data encoding, media tuning, redundant storage, parity substitution, and/or the like. Alternatively, step 1110 may comprise detecting a media failure, such as loss of connectivity to a particular storage unit 132 and/or storage division 134, and/or the like. In some embodiments, step 1110 comprises receiving an MR message 641 through the interconnect 108.

Step 1120 may comprise determining whether the EIO condition can be cleared. As disclosed herein, clearing an EIO condition may include, but is not limited to: determining that replacement data corresponding to the EIO condition is available from another source (e.g., determining that the LID corresponds to redundant cache data, has been stored redundantly, and/or the like), determining that data corresponding to the LID can be reconstructed, determining that the LID associated with the EIO condition corresponds to invalid data, and/or the like.

In some embodiments, step 1120 comprises determining if data associated with the LID comprises redundant cache data. As disclosed above, redundant cache data refers to data cached on the storage medium 130, and that is available on primary and/or backing storage (e.g., the primary storage system 662, backing store 664, and/or the like). Accordingly, redundant cache data refers to data that cached on the storage medium 130 in response to a read miss, and/or data that has been written through and/or written back to primary and/or backing storage. Step 1120 may, therefore, comprise determining that the LID of step 1110 corresponds to cache data and/or determining that the data of the LID is available on primary and/or backing storage. Step 1120 may comprise determining that the LID is associated with the cache layer 660 (and/or other cache service) based on metadata pertaining to the LID, client metadata associated with the LID, a query (e.g., EIO message 645), and/or the like. Step 1120 may, therefore, comprise determining that the LID comprises redundant cache data in response to determining that the LID was written to the storage medium 130 in response to a cache read miss, determining that the cache layer 660 is operating in a write-through cache mode, determining that the data has been written back to the primary storage system 662 and/or backing store 664, and/or the like.

Alternatively, or in addition, step 1120 may comprise determining that the data of the LID is available from another source and/or can be reconstructed (e.g., reconstructed by use of an upper-level redundancy mechanism, such as a RAID, distributed RAID, and/or the like). Step 1120 may comprise issuing a query (in an EIO message 645) to determine the availability of replacement data, request the replacement data, determine whether the data can be reconstructed, and/or the like. The EIO message 645 comprising the query may be issued to a storage service 606, such as the storage services layer 650, recovery engine 653, and/or other client 107, as disclosed above. The EIO message 645 may identify the LID associated with the EIO condition, may include client metadata associated with the LID, and/or the like. Step 1120 may further include receiving a response to the query that indicates whether replacement data is available (e.g., is stored redundantly and/or can be reconstructed).

Alternatively, or in addition, step 1120 may comprise determining that data of the LID is invalid (e.g., is no longer needed by a client 107 and/or storage service 606). Step 1120 may comprise one or more of: determining that the LID has been deleted, erased, deallocated, unmapped, TRIMed, and/or the like, determining that the LID has been overwritten, determining that the LID has been modified out-of-place, and/or the like. Step 1120 may comprise issuing a query (EIO message 645) to a storage service 606, storage services layer 650, recovery engine 653, cache layer 660, and/or other client 107, as disclosed above. The query may identify LID associated with the EIO condition, may include client metadata associated with the LID, and/or the like. Step 1120 may further include receiving a response to the query that indicates the status of the LID (e.g., whether the LID corresponds to valid data).

If the determination of step 1120 is that the EIO condition can be cleared, the flow continues to step 1130; otherwise, the flow continues to step 1140. Step 1120 may further include relocating readable data from the storage division 134 in which the EIO was detected (if any), retiring the storage division 134, and so on, as disclosed herein.

Step 1130 comprises clearing the EIO condition detected at step 1110. Step 1130 may comprise invalidating the LID in the storage metadata 124 by, inter alia, removing the LID from the forward map 125, marking the storage unit(s) 132 associated with the LID as invalid in the reverse map 127, and/or the like. Step 1130 may further comprise appending a deallocation metadata entry 158 (e.g., TRIM note) to the storage log 151 indicting that the LID is empty. Subsequent requests to read data of the LID may, therefore, result in returning an indication that the LID is empty (e.g., does not exist and/or is deleted). A request to access the LID from the cache layer 660 may, therefore, result in a cache miss, as disclosed herein.

Step 1140 comprises recording the EIO condition detected at step 1110, as disclosed herein, which may include: a) writing a corruption metadata entry 158 to the storage log 151 indicating that the LID corresponds to unreadable data and/or b) updating the forward map 125 to flag the LID as corrupt. Step 1140 may further include relocating data from the storage division 134 in which the EIO occurred, as disclosed herein. In some embodiments, step 1140 further includes issuing an EIO message 645 to client(s) 107 and/or the cache layer 660, requesting replacement data corresponding to the LID, and/or the like, as disclosed above. Step 1140 may further comprise returning an error code, signaling an interrupt, throwing an exception, and/or the like in response to requests to read data of the LID.

Figure 12:
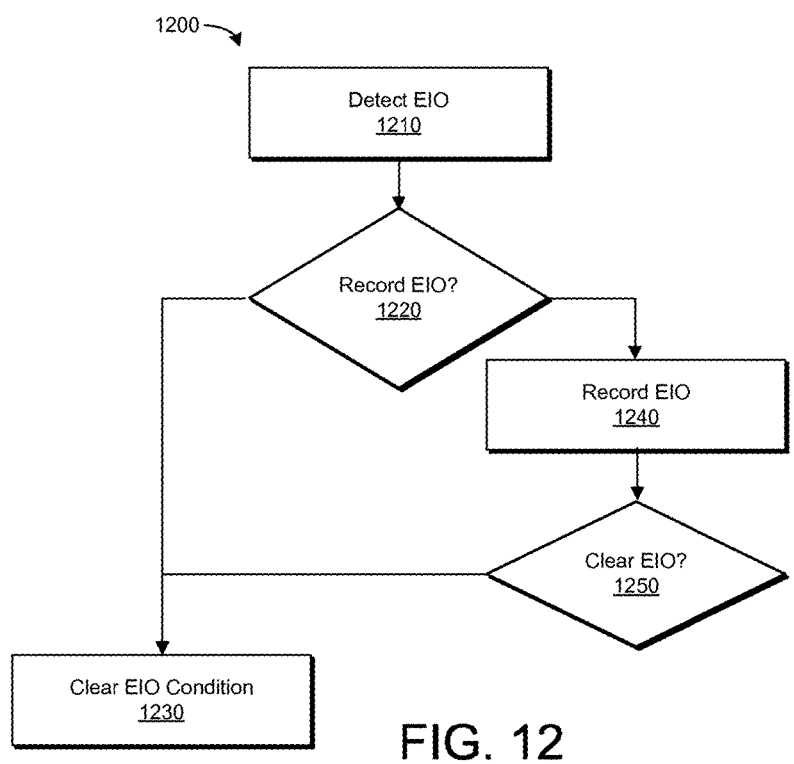
FIG. 12 is a flow diagram of another embodiment of a method for managing storage failure conditions.

FIG. 12 is a flow diagram of another embodiment of a method 1200 for managing EIO conditions on a storage medium 130. Step 1210 may comprise detecting an EIO condition pertaining to a particular LID, as disclosed herein. Step 1210 may comprise performing a test read operation performed within a particular storage division 134 (e.g., by the reliability monitor 142). The EIO condition of step 1210 may, therefore, be detected independent of a request to read and/or access data of the LID.

Step 1220 may comprise determining whether to record the EIO condition. The determination of step 1220 may be based on whether the EIO condition can be cleared, as disclosed above. Step 1220 may, therefore, comprise determining whether replacement data for the LID is available and/or can be reconstructed, whether the LID corresponds to redundant cache data, whether the LID comprises invalid data, and/or the like. Step 1220 may further include relocating data from the particular storage division 134, as disclosed herein. If the determination of step 1220 is to record the EIO condition, the flow continues to step 1240; otherwise, the flow continues to step 1230.

Step 1230 comprises clearing the EIO condition detected at step 1210. Step 1230 may include recording that the LID is empty and/or deallocated and/or appending a deallocation metadata entry 158 to the storage log 151, as disclosed herein. Requests to read data of the LID may result in returning an indication that the LID is empty (e.g., a zero, null value, return code, and/or the like).

Step 1240 comprises recording the EIO condition 1240, as disclosed above. Step 1240 may include appending a metadata entry 158 to the storage log 151 that flags the LID as corrupt and/or mapping the LID to a corrupt data flag (EIO flag) in the forward map 125. Requests to read data of the LID may result in an error condition, as disclosed herein.

Step 1250 comprises determining that the EIO condition recorded in step 1240 is cleared. Step 1250 may comprise one or more of: determining that the data associated with the LID is invalid, determining that the data associated with the LID is erased (e.g., is deleted, unmapped, deallocated, TRIMed, and/or the like), detecting a request to overwrite and/or modify data of the LID, rewriting data to the LID (e.g., writing replacement data corresponding to the LID on the storage medium 130), and/or the like. In response to determining that the EIO condition is cleared, the flow continues to step 1230, where the EIO condition is cleared, as disclosed herein.

The modules, components, layers, and/or facilities disclosed herein, including, but not limited to: the storage controller 110, media controller 113, translation module 120 (translation layer), reliability manager 140, reliability monitor 142, relocation module 147, refresh module 148, log storage module 150, garbage collector 152, storage manager 610, corruption manager 642, and/or coordination module, may be implemented in software, hardware, and/or a combination of software and hardware elements. In some embodiments, portions of the disclosed modules, components, and/or facilities are embodied as executable instructions stored on a non-transitory, machine-readable storage medium. The instructions may comprise computer program code that, when executed by a processor and/or computing device, a computing system to implement certain processing steps, procedures, and/or operations, as disclosed herein. The modules, components, and/or facilities disclosed herein, may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

This disclosure has been made with reference to various exemplary embodiments. However, those skilled in the art will recognize that changes and modifications may be made to the exemplary embodiments without departing from the scope of the present disclosure. For example, various operational steps, as well as components for carrying out operational steps, may be implemented in alternative ways depending upon the particular application or in consideration of any number of cost functions associated with the operation of the system (e.g., one or more of the steps may be deleted, modified, or combined with other steps). Therefore, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. As used herein, the terms "comprises," "comprising," and any other variation thereof are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Additionally, as will be appreciated by one of ordinary skill in the art, principles of the present disclosure may be reflected in a computer program product on a machine-readable storage medium having machine-readable program code means embodied in the storage medium. Any tangible, non-transitory machine-readable storage medium may be utilized, including magnetic storage devices (hard disks, floppy disks, and the like), optical storage devices (CD-ROMs, DVDs, Blu-ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a machine-readable memory that can direct a computer or other programmable data processing apparatus to function in a particular manner, such that the instructions stored in the machine-readable memory produce an article of manufacture, including implementing means that implement the function specified. The computer program instructions may also be loaded onto a computer or other programmable data processing apparatus to cause a series of operational steps to be performed on the computer or other programmable apparatus to produce a computer-implemented process, such that the instructions that execute on the computer or other programmable apparatus provide steps for implementing the functions specified.

While the principles of this disclosure have been shown in various embodiments, many modifications of structure, arrangements, proportions, elements, materials, and components that are particularly adapted for a specific environment and operating requirements may be used without departing from the principles and scope of this disclosure. These and other changes or modifications are intended to be included within the scope of the disclosure.

We claim:

1. A method, comprising:
    determining a reliability metric of a first storage unit within a first erase division of a non-volatile memory comprising a plurality of erase divisions, each erase division having a plurality of storage units;
    determining a remaining retention time for the first erase division based on one or more reliability metrics of one or more storage units of the first erase division, the one or more storage units of the first erase division excluding the first storage unit; and
    performing a partial refresh operation of the first erase division in response to the determined reliability metric of the first storage unit and the remaining retention time of the first erase division, the partial refresh operation comprising:
        relocating data stored on the first storage unit from the first erase division to another one of the erase divisions, and
        deferring relocation of data stored on the one or more storage units from the first erase division based on the determined remaining retention time.

2. The method of claim 1, further comprising correcting read errors in the data stored on the first storage unit by use of an error-correcting code.

3. The method of claim 1, wherein relocating the data stored on the first storage unit comprises:
    identifying data for relocation from the first erase division based on reliability metrics of the respective storage units of the first erase division; and selectively relocating the identified data to one or more other erase divisions.

4. The method of claim 1, wherein determining the remaining retention time for the erase division comprises determining a reliability metric for a second storage unit of the first erase division.

5. The method of claim 1, wherein the one or more storage units include storage units of the first erase division determined to comprise valid data and exclude storage units of the first erase division determined to comprise invalid data.

6. The method of claim 1, wherein determining the remaining retention time of the first erase division comprises determining a current error rate of the first erase division based on error rates corresponding to read operations performed on the one or more storage units.

7. The method of claim 1, further comprising:
identifying storage units within the first erase division that are in use to store valid data, wherein the one or more storage units comprise the identified storage units.

8. The method of claim 1, wherein the one or more storage units are identified in response to determining that the one or more storage units are associated with logical addresses in a forward map.

9. The method of claim 8, wherein the one or more storage units exclude storage units of the first erase division that are not associated with logical addresses in the forward map.

10. The method of claim 1, wherein the first erase division comprises one of an erase block, a group of erase blocks, and a logical erase block.

11. The method of claim 1, wherein deferring relocation of data stored on the one or more storage units from the first erase division comprises postponing a garbage collection operation on the first erase division, the garbage collection operation comprising:
identifying valid data stored on the first erase division;
relocating the valid data stored on the first erase division to another erase division; and
initializing the first erase division.

12. An apparatus, comprising:
a reliability monitor configured to identify a first physical address within a first storage division of a storage medium having a plurality of storage divisions each comprising a plurality of physical addresses, the identified first physical address corresponding to an error rate that exceeds an error rate threshold; and
a reliability manager, wherein in response to identifying the first physical address, the reliability manager is configured to:
determine a reliability metric corresponding to one or more physical addresses of the first storage division other than the identified first physical address,
write data stored at the identified first physical address from the first storage division to a different physical address of another one of the storage divisions of the storage medium, and
retain data stored at the one or more physical addresses of the first storage division based on the determined reliability metric.

13. The apparatus of claim 12, further comprising:
a translation layer configured to associate logical identifiers of a logical address space with respective physical addresses of the storage medium,
wherein the reliability manager is configured to remap a logical identifier from the identified first physical address to the different physical address by use of the translation layer, and
wherein the one or more physical addresses comprise physical addresses of the first storage division that are associated with logical identifiers of the logical address space by the translation layer.

14. The apparatus of claim 12, wherein the reliability manager is configured to:
determine a remaining retention time for the first storage division based on the reliability metric; and
relocate data from the first storage division after the determined retention time.

15. The apparatus of claim 12, wherein the reliability manager determines the reliability metric based on one or more of an error rate of the one or more physical addresses, a reliability projection for the first storage division, a reliability model for the first storage division, a partial reliability metric of the first storage division, an error rate projection, and a data retention guarantee.

16. The apparatus of claim 12, wherein the reliability metric is based on test read operations performed on the one or more physical addresses of the first storage division.

17. The apparatus of claim 12, wherein the reliability manager identifies the first physical address corresponding to the error rate that exceeds the error rate threshold in response to one or more of servicing a request to read data from the first physical address, and a reliability scan.

18. A system, comprising:
a flash storage medium comprising a plurality of erase blocks, each erase block comprising a plurality of pages;
means for identifying a page of a particular erase block having a bit error rate that exceeds a threshold;
means for determining a remaining data retention time for data stored on one or more pages of the particular erase block other than the identified page; and
means for selectively refreshing the particular erase block in response to the identified page having a bit error rate that exceeds the threshold and the determined remaining data retention time not exceeding a duration threshold, by:
writing data stored on the identified page to a page on a different erase block of the flash storage medium, and
retaining data stored on the one or more pages on the particular erase block for the determined remaining data retention time.

19. The system of claim 18, wherein the determined remaining data retention time of the particular erase block is based on one or more of:
time elapsed since the particular erase block was programmed,
bit error rates of the one or more pages of the particular erase block,
a bit error rate projection for the one or more pages of the particular erase block,
a bit error rate model for the one or more pages of the particular erase block, and
a data retention guarantee pertaining to data stored on the flash storage medium.

* * * * *